United States Patent
Wright et al.

(10) Patent No.: US 7,177,603 B1
(45) Date of Patent: Feb. 13, 2007

(54) CONSTANT GAIN DIGITAL PREDISTORTION CONTROLLER FOR LINEARIZATION OF NON-LINEAR AMPLIFIERS

(75) Inventors: Andrew S. Wright, Vancouver (CA); Derek J. W. Ho, Vancouver (CA); Bartholomeus T. W. Klijsen, Surrey (CA)

(73) Assignee: PMC-Sierra, Inc., Santa Clara, CA (US)

( * ) Notice: Subject to any disclaimer, the term of this patent is extended or adjusted under 35 U.S.C. 154(b) by 0 days.

(21) Appl. No.: 11/392,439

(22) Filed: Mar. 29, 2006

Related U.S. Application Data

(62) Division of application No. 10/302,782, filed on Nov. 21, 2002, now Pat. No. 7,058,369.

(60) Provisional application No. 60/332,151, filed on Nov. 21, 2001.

(51) Int. Cl.
*H04B 1/04* (2006.01)

(52) U.S. Cl. .................. 455/90; 455/114.3; 375/297

(58) Field of Classification Search ............ 455/114.2, 455/114.3, 126, 127.1, 127.2; 375/296–297
See application file for complete search history.

(56) References Cited

U.S. PATENT DOCUMENTS

| | | | |
|---|---|---|---|
| 4,291,277 A | 9/1981 | Davis et al. | |
| 4,329,655 A | 5/1982 | Nojima et al. | |
| 4,465,980 A | 8/1984 | Huang et al. | |
| 4,554,514 A | 11/1985 | Whartenby et al. | |
| 4,559,635 A | 12/1985 | Sari | |
| 4,564,816 A | 1/1986 | Kumar et al. | |
| 4,591,800 A | 5/1986 | Opas | |
| 4,669,092 A | 5/1987 | Sari et al. | |
| 4,700,151 A | 10/1987 | Nagata | |
| 4,772,856 A | 9/1988 | Nojima et al. | |
| 4,835,493 A | 5/1989 | Walsh | |
| 4,879,519 A | 11/1989 | Myer | |
| 4,890,300 A | 12/1989 | Andrews | |

(Continued)

OTHER PUBLICATIONS

Bateman A, et al., "Linear Transceiver Architectures," IEEE Proc. Vehicular Technology Conference, 1988, pp. 478-484, EE Catalog 2622-9/88/0000-0478.

(Continued)

*Primary Examiner*—Simon Nguyen
(74) *Attorney, Agent, or Firm*—Knobbe Martens Olson & Bear LLP

(57) ABSTRACT

The invention is related to methods and apparatus for controlling and adapting a digital predistortion linearizer for amplification of bandlimited signals using non-linear amplifiers. The control method advantageously permits the predistortion function applied by a predistortion entity to provide a relatively constant gain. This attribute is advantageous for operation within cellular radio systems, which often employ digital power control systems. However, the disclosed techniques can also be applicable to virtually any type of digital predistortion for which an input signal or reference signal to be amplified is predistorted in a manner that is complementary to the distortion induced by a non-linear amplifier. Embodiments of the invention advantageously enhance the practicality of using digital linearization and predistortion amplification techniques. Embodiments of the invention can automatically adjust the characteristics of a predistorted signal so that a deviation from overall linearity is compensated and subsequently reduced while maintaining a nearly constant gain attribute.

18 Claims, 26 Drawing Sheets

U.S. PATENT DOCUMENTS

| | | | |
|---|---|---|---|
| 4,897,615 A | 1/1990 | Chen et al. | |
| 4,929,906 A | 5/1990 | Voyce et al. | |
| 4,943,783 A | 7/1990 | Nojima | |
| 4,987,378 A | 1/1991 | Eggleston et al. | |
| 4,993,047 A | 2/1991 | Moffatt et al. | |
| 5,023,937 A | 6/1991 | Opas | |
| 5,049,832 A | 9/1991 | Cavers | |
| 5,088,110 A | 2/1992 | Bonnerot et al. | |
| 5,105,164 A | 4/1992 | Fisher et al. | |
| 5,105,446 A | 4/1992 | Ravoalavoson et al. | |
| 5,132,634 A | 7/1992 | Suarez | |
| 5,132,639 A | 7/1992 | Blauvelt et al. | |
| 5,134,718 A | 7/1992 | Gailus | |
| 5,148,448 A | 9/1992 | Karam et al. | |
| 5,157,345 A | 10/1992 | Kenington et al. | |
| 5,159,287 A | 10/1992 | Furutani et al. | |
| 5,166,634 A | 11/1992 | Narahashi et al. | |
| 5,187,803 A | 2/1993 | Sohner et al. | |
| 5,193,224 A | 3/1993 | McNicol et al. | |
| 5,249,201 A | 9/1993 | Posner et al. | |
| 5,251,330 A | 10/1993 | Chiba et al. | |
| 5,262,734 A | 11/1993 | Dent et al. | |
| 5,266,906 A | 11/1993 | Inahashi | |
| 5,327,096 A | 7/1994 | Sakamoto et al. | |
| 5,334,946 A | 8/1994 | Kenington et al. | |
| 5,361,156 A | 11/1994 | Pidgeon | |
| 5,412,342 A | 5/1995 | Sakamoto et al. | |
| 5,418,818 A | 5/1995 | Marchetto et al. | |
| 5,420,536 A | 5/1995 | Faulkner et al. | |
| 5,426,641 A | 6/1995 | Afrashteh et al. | |
| 5,430,416 A | 7/1995 | Black et al. | |
| 5,507,014 A | 4/1996 | Wray et al. | |
| 5,508,663 A | 4/1996 | Konno | |
| 5,523,716 A | 6/1996 | Grebliunas et al. | |
| 5,524,286 A | 6/1996 | Chiesa et al. | |
| 5,561,397 A | 10/1996 | Kumar et al. | |
| 5,568,087 A | 10/1996 | Gatti | |
| 5,576,659 A | 11/1996 | Kenington et al. | |
| 5,598,127 A | 1/1997 | Abbiati et al. | |
| 5,598,436 A | 1/1997 | Brajal et al. | |
| 5,606,286 A | 2/1997 | Bains | |
| 5,650,758 A | 7/1997 | Xu et al. | |
| 5,675,285 A | 10/1997 | Winters | |
| 5,719,527 A | 2/1998 | Bateman et al. | |
| 5,740,520 A * | 4/1998 | Cyze et al. | 455/69 |
| 5,760,646 A | 6/1998 | Belcher et al. | |
| 5,789,976 A | 8/1998 | Ghannouchi et al. | |
| 5,789,979 A | 8/1998 | Kumar et al. | |
| 5,793,253 A | 8/1998 | Kumar et al. | |
| 5,796,307 A | 8/1998 | Kumagai et al. | |
| 5,867,065 A | 2/1999 | Leyendecker | |
| 5,892,397 A | 4/1999 | Belcher et al. | |
| 5,903,823 A | 5/1999 | Moriyama et al. | |
| 5,959,499 A | 9/1999 | Khan et al. | |
| 5,959,500 A * | 9/1999 | Garrido | 330/151 |
| 6,112,062 A * | 8/2000 | Hans et al. | 455/114.3 |
| 6,141,390 A | 10/2000 | Cova | |
| 6,266,517 B1 | 7/2001 | Fitzpatrick et al. | |
| 6,304,140 B1 * | 10/2001 | Thron et al. | 330/149 |
| 6,396,345 B2 | 5/2002 | Dolman | |
| 6,449,466 B1 * | 9/2002 | Jin et al. | 455/127.2 |
| 6,577,192 B2 * | 6/2003 | Maniwa et al. | 330/149 |
| 6,600,792 B2 | 7/2003 | Antonio et al. | |
| 6,697,436 B1 | 2/2004 | Wright et al. | |
| 6,799,021 B1 | 9/2004 | Tapio | |
| 6,934,341 B2 * | 8/2005 | Sahlman | 375/297 |
| 6,968,163 B2 * | 11/2005 | Kuechler et al. | 455/126 |
| 6,987,954 B2 * | 1/2006 | Nielsen | 455/114.3 |
| 2002/0079965 A1 * | 6/2002 | Maniwa et al. | 330/149 |
| 2002/0101938 A1 * | 8/2002 | Horaguchi et al. | 375/297 |
| 2003/0035494 A1 * | 2/2003 | Bauder et al. | 375/296 |

OTHER PUBLICATIONS

Cavers, J.K., "Amplifier Linearization Using a Digital Predistorter With Fast Adaptation and Low Memory Requirements," IEEE Transactions on Vehicular Technology, Nov. 1999, pp. 374-383, vol. 39.

Cavers, J.K., "The Effect of Quadrature Modulator and Demodulator Errors on Adaptive Digital Predistorters for Amplifier Linearization," IEEE Transactions on Vehicular Technology, May 1997, vol. 46, No. 2.

Faulkner, M., et al. "Adaptive Linearization Using Predistortion—Experimental Results," IEEE Transactions on Vehicular Technology, May 1994, pp. 323-332, vol. 43, No. 2.

Lee, E., et al., "The Nonlinear Spectral Line Method" in: Digital Communication, 1990, Ch. 15.2.2, Kluwer Academic, New York.

Nagata, Y., "Linear Amplification Technique for Digital Mobile Communications," IEEE Vehicular Technology Conference, 1989, pp. 159-165, San Francisco, CA.

Saleh, A.A.M., et al., "Adaptive Linearization of Power Amplifiers in Digital Radio Systems," Bell System Technical Journal, Apr. 1983, pp. 10-19-1033, vol. 62, No. 4.

Stewart, R.D., et al., "Feedforward Linearization of 950 MHz Amplifiers," IEE Proceedings, Oct. 1988, pp. 347-350, vol. 135, Pt. H, No. 5.

Sundstrom, L., et al., "Quantization Analysis and Design of a Digital Predistortion Linearizer for RF Power Amplifiers," IEEE Transactions on Vehicular Technology, Nov. 1996, pp. 707-719, vol. 45, No. 4.

Wright, et al., "Experimental Performance of an Adaptive Digital Linearized Power Amplifier," IEEE Transactions on Vehicular Technology, Nov. 1992, pp. 395-400, vol. 41, No. 4.

* cited by examiner

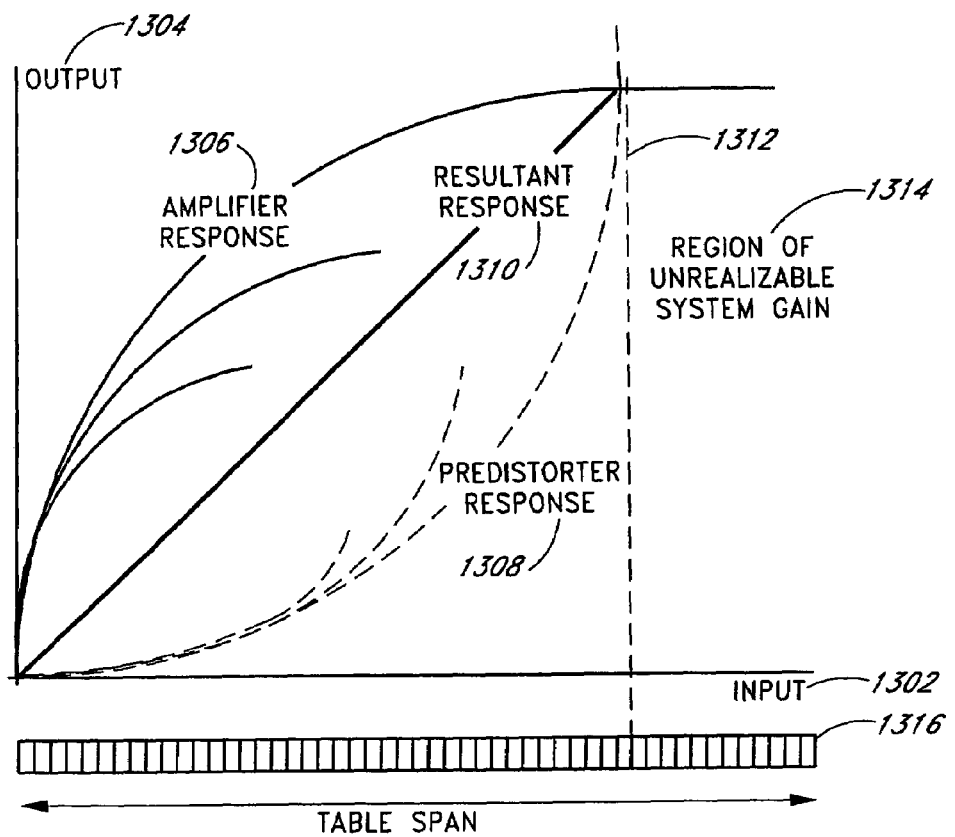
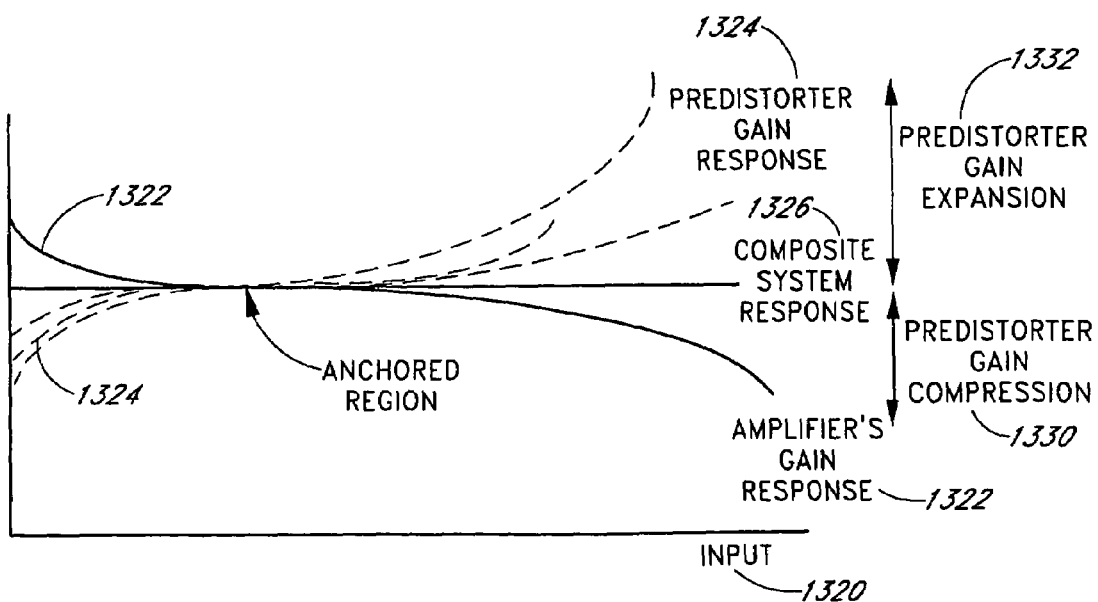
FIG. 13

CONSTANT GAIN DIGITAL PREDISTORTION CONTROLLER FOR LINEARIZATION OF NON-LINEAR AMPLIFIERS

CROSS-REFERENCE TO RELATED APPLICATIONS

This application is a divisional application of U.S. application Ser. No. 10/302,782, filed Nov. 21, 2002 now U.S. Pat. No. 7,058,369, which claims the benefit under 35 U.S.C. § 119(e) of U.S. Provisional Application No. 60/332,151, filed Nov. 21, 2001, the disclosures of which are hereby incorporated by reference in their entireties herein.

This application is related to copending applications Ser. No. 11/392,453, Ser. No. 11/392,180, Ser. No. 11/392,460, Ser. No. 11/392,286, all filed on the same date as the present application, all of which are also divisional applications of U.S. application Ser. No. 10/302,782, filed Nov. 21, 2002.

BACKGROUND OF THE INVENTION

1. Field of the Invention

The invention generally relates to communications systems. In particular, the invention relates to linearizing radio frequency (RF) power amplifiers.

2. Description of the Related Art

Radio frequency (RF) power amplifiers are widely used to transmit signals in communications systems. Typically, a signal to be transmitted is concentrated around a particular carrier frequency that occupies a defined channel. Information is provided in the form of a modulation of amplitude, phase, frequency, or some combination of these, which causes the information to be represented by energy spread over a band of frequencies around the carrier frequency. In many schemes, the carrier itself is not sent since it is not essential to the communication of the information.

When an amplifier amplifies a signal that contains amplitude variations, the signal will become distorted if the amplifier does not exhibit a linear amplitude and phase transfer characteristic. This means that the output of the amplifier is not linearly proportional to the input of the amplifier. It will also suffer distortion if the phase shift introduced by the amplifier is not linear over the range of frequencies present in the signal or if the phase shift caused by the amplifier varies with the amplitude of the input signal. The distortion introduced includes inter-modulation of the components of the input signal. The products of the inter-modulation can appear within the bandwidth of the signal causing undesirable interference. They can also extend outside the bandwidth originally occupied by the signal. This can cause interference in adjacent channels and violate transmitter licensing and regulatory spectral emission requirements. Although filtering can be used to remove the unwanted out-of-band distortion, filtering is not always practical, especially when the amplifier is operates on several different frequencies.

Distortion products that are at multiples of the carrier frequency can also be produced in a non-linear amplifier, but these are relatively easy to remove by filtering. Inter-modulation is also a problem when multiple signals are amplified in the same amplifier even if individually, they do not have amplitude variations. This is because the combination of the multiple signals produces amplitude variations as the various components beat with each other by adding and subtracting as their phase relationships change.

Even well-designed amplifiers can introduce some distortion. In practice, perfect linearity over a wide range of amplitude is difficult to realize. In addition, as any amplifier nears its maximum output power capacity, the output no longer increases as the input increases. At this point, the amplifier is not regarded as linear. A typical amplifier becomes significantly non-linear at a relatively small fraction of its maximum output capacity. In order to maintain linearity, an amplifier is often operated at an input and output amplitude that is low enough such that the signals to be amplified are within a part of the amplifier's transfer characteristic that is substantially linear. This is a method of operation, described as "backed off," in which the amplifier has a relatively low supplied-power-to-transmitted-power conversion efficiency. A "Class A" amplifier operating in this mode may be linear enough to transmit a signal relatively cleanly, but might typically be only about 1% efficient. This wastes power and means that the amplifier has to be large and relatively expensive. It also means that the waste power is dissipated as heat, which has to be removed by relatively bulky and expensive cooling systems.

Communication schemes using signals that have constant amplitude with frequency and phase modulation can use relatively non-linear amplifiers. These types of signals are relatively immune to the effects of distortion, and the corresponding amplifiers can be smaller, cooler running, more power efficient, and less expensive than "Class A" amplifiers. For example, modulation of this type is used in conventional radio paging systems, which use continuous phase frequency shift keying (CPFSK) modulation.

Many of the newer, bandwidth-efficient modulation schemes have both amplitude and phase variations. There is also frequently a desire to be able to transmit multiple signals on different channels through a single amplifier. This reduces the number of separate amplifiers required and avoids the need for relatively large and costly high level output signal combining filters, which can incur undesirable power losses.

Digital Predistortion

Conventional digital cellular telephony services employ linear modulation schemes to encode baseband information in both the amplitude and phase of the RF carrier. This is undertaken to achieve an increase in spectral efficiency. In a conventional RF amplifier, if significant inter-modulation and distortion products are to be avoided, Class A linear amplifiers should be employed. However, relatively high-power linear amplifiers are generally inefficient and undesirable in a system where cost and heat dissipation are prohibitive factors, e.g., a cellular telephone base station. To avoid the compromise of constraints between the regulatory spectral emission mask and amplifier efficiency, attempts have been made to harness the efficiency of non-linear Class AB amplifiers by various linearization techniques.

Experimental analog feedback techniques are disadvantageously limited to relatively narrow operating bandwidths, are extremely sensitive to amplifier variations, and are prone to instability. See A. Bateman, D. M. Haines and R. J. Wilkinson, *Linear Transceiver Architectures*, IEEE Proc. Veh. Technology. Conf., Philadelphia, Pa. 1988, IEEE Catalog 2622-9/88/0000-0478, pp. 478–484. Also see R. D. Stewart and F. F. Tusubira, *Feedforward Linearization of 950 MHz Amplifiers*, Inst. Elec. Eng. Proc., Vol. 1, pt H, No. 5, pp. 347–350, October 1988.

Consequently, these amplifier configurations are not appropriate for mass production. Simulation work has been presented that postulates the advantage of employing adaptive digital feedback for the predistortion at baseband. See J. K. Cavers, *Amplifier Linearization Using A Digital Predistorter With Fast Adaptation And Low Memory Requirements*, IEEE Trans Veh. Technol., Vol. 39, pp. 374–383, November 1990. Also see Y. Nagata, *Linear Amplification Technique For Digital Mobile Communications*, in proc. IEEE Veh. Technology. Conf., San Francisco, Calif., 1989, pp. 159–164. Such simulation work has promised excellent reductions in out-of-band spectral emissions, typically in excess of 25 dB. These techniques are relatively insensitive to amplifier variations and provide an attractive design that is suitable for mass production.

SUMMARY OF THE INVENTION

The invention is related to methods and apparatus for controlling and adapting a digital predistortion linearizer for amplification of bandlimited signals using non-linear amplifiers, such as RF power amplifiers. These non-linear amplifiers can form part of a cellular base station. A control method advantageously permits the predistortion function applied by a predistortion entity to provide a relatively constant gain. The relatively constant gain can advantageously improve the stability of the predistortion entity.

One embodiment of the invention is related to an RF power amplifier system. The RF power amplifier system can be incorporated in a cellular base station. The RF power amplifier can include: a complex gain predistorter configured to receive a reference signal and to predistort the reference signal to a predistorted signal; at least one digital to analog converter coupled to the complex gain predistorter and configured to convert the predistorted signal from digital to analog; a baseband to RF upconversion circuit coupled to the digital to analog converter, where the baseband to RF upconversion circuit is configured to upconvert the analog predistorted signal; an RF power amplifier coupled to the baseband to RF upconversion circuit; an RF coupler coupled to an output of the RF power amplifier; an RF to baseband downconversion circuit coupled to the RF coupler, where the RF to baseband downconversion circuit generates an observed signal in analog form; at least one analog to digital converter coupled to the RF to baseband downconversion circuit, where the analog to digital converter converts the observed signal from analog to digital form.

The RF power amplifier further includes: a normalizing signal pre-processor coupled to the analog to digital converter, where the normalizing signal pre-processor is configured to scale the observed signal to a modified observed signal such that the modified observed signal has an approximately constant magnitude ratio relative to the reference signal; an adaptive estimator coupled to the normalizing signal pre-processor, where the adaptive estimator is configured to compare the modified observed signal and the reference signal, and is further configured to compute a predistortion function for the complex gain predistorter that is intended to provide a predistortion response that is approximately complementary to a response of the RF power amplifier; and a constant gain predistortion controller coupled to the adaptive estimator, where the constant gain predistortion controller is configured to scale the predistortion function from the adaptive estimator such that a selected region of the predistortion function maintains approximately the same gain for a plurality of adaptive updates, and wherein the constant gain predistortion controller is configured to load the scaled predistortion function to the complex gain predistorter.

Selected embodiments of the invention are related to the control or anchoring of gain in an adaptive predistorter. One embodiment of the invention includes a method of controlling gain in an adaptive predistorter for an RF power amplifier system. The method includes identifying a region to be used as an anchored gain region within a predistorter response; selecting an overall target gain for the RF power amplifier system; scaling at least a portion of the predistorter response such that the gain of the predistorter response in the region identified as the anchored gain region corresponds to the overall target gain; and storing the scaled predistorter response in a predistorter engine.

Another embodiment of the invention includes a method of selecting a region to be used as an anchored gain region in a predistorter for an RF power amplifier. The method includes: accumulating sample data over at least a first time period, wherein the data is arranged such that a frequency of occurrence for a plurality of input signal levels is identifiably maintained; selecting an input signal level with a high frequency of occurrence to be used as a center for the anchored gain region; and selecting a predetermined range including the input signal level with the high frequency of occurrence as the anchored gain region.

Another embodiment of the invention includes a gain controller for an adaptive predistorter for an RF power amplifier system. The gain controller can include: a scanning circuit configured to identify a region to be used as an anchored gain region within a predistorter response; a gain select module configured to select an overall target gain for the RF power amplifier system; a scaling circuit configured to scale at least a portion of the predistorter response such that the gain of the predistorter response in the region identified as the anchored gain region corresponds to the overall target gain; and a data transfer circuit configured to store the scaled predistorter response in a predistorter engine.

Selected embodiments of the invention are related to a normalizing signal processor that normalizes an observed signal to a modified observed signal. One embodiment is a method that includes: receiving a reference signal to the RF power amplifier, where the reference signal is digitally represented; receiving an observed signal that is intended to be used as a feedback signal, where the observed signal is derived from an output of the RF power amplifier and is digitally represented; multiplying the observed signal with a gain scaling factor to generate the modified observed signal; comparing the reference signal to the modified observed signal; adaptively adjusting the gain scaling factor in response to the comparison; and providing the modified observed signal to the feedback loop such that the modified observed signal can be used to control the feedback loop.

Another embodiment includes a method of processing an observed signal to a modified observed signal in a feedback loop of an RF power amplifier. The method further includes: receiving a reference signal to the RF power amplifier, where the reference signal is digitally represented; receiving an observed signal as a feedback signal that is derived from an output of the RF power amplifier, where the observed signal is digitally represented; multiplying the observed signal with a gain scaling factor; performing further signal procession on the multiplied observed signal, where the further signal processing includes at least one of frequency offset correction, phase adjustment, and DC adjustment; comparing the reference signal to the multiplied observed signal as further signal processed by at least one of the frequency offset correction, the phase adjustment, and the DC adjustment; adaptively adjusting the gain scaling factor in response to the comparison such that the observed signal, as multiplied by the gain scaling factor, is normalized relative to the reference signal; and providing an at least partially processed observed signal as the modified observed signal in the feedback loop, where the at least partially processed observed signal has at least been multiplied with the gain scaling factor.

Another embodiment includes a normalizing signal pre-processor that receives a reference signal and an observed signal as inputs and generates a modified observed signal as an output. The normalizing signal pre-processor can further include: a first multiplier circuit adapted to scale the observed signal; a subtraction circuit adapted to generate an error signal from a difference between the modified observed signal and the reference signal; and adaptation logic adapted to receive the reference signal, the observed signal, the modified signal, and the error signal as inputs, and to adaptively adjust the scaling by the first multiplier circuit to reduce the magnitude of the error signal.

Selected embodiments of the invention are related to the identification of a boundary between a region of realizable system gain and a region of unrealizable system gain. One embodiment includes a method of identifying a boundary between a region of realizable system gain and a region of unrealizable system gain for an RF power amplifier system with predistortion compensation. The method can further include: retrieving a plurality of output signal levels stored in a predistortion lookup table; computing an overall system gain based on the plurality of output signal levels and associated input signal levels; calculating a slope of the overall system gain; determining a point at which the slope of the overall system gain corresponds to a first predetermined amount; and subtracting a second predetermined amount from the point to identify the boundary.

Selected embodiments of the invention are related to the adjusting of gain in a region of unrealizable system gain. One embodiment includes a method of stabilizing a predistortion function that is stored in a lookup table, where at least a portion of the predistortion function is approximately complementary to a transfer function of a power amplifier. The method can include: identifying a portion of the lookup table that corresponds to a region of unrealizable system gain; scaling entries from the identified portion of the lookup table such that the overall gain of the predistortion function in the identified portion of the lookup table is reduced; and storing the scaled entries back into the lookup table.

One embodiment include a method of stabilizing a predistortion function, where at least a portion of the predistortion function is approximately complementary to a transfer function of a power amplifier. The method can include: receiving updates to at least some of the coefficients of the predistortion function, where a first region of the predistortion function corresponds to a region of realizable system gain, and where a second region of the predistortion function corresponds to a region of unrealizable system gain; computing new coefficients for the second region of the predistortion function based on received coefficients of the predistortion function in the first region to provide a modified predistortion function; and loading the modified predistortion function to a real-time predistorter.

One embodiment includes a method of stabilizing a predistortion function, where at least a portion of the predistortion function is approximately complementary to a transfer function of a power amplifier. The method can include: intercepting an update for a predistortion function from adaptation logic to a real-time predistortion engine such that the update is not loaded into the real-time predistortion engine; modifying a portion of the predistortion function in the update, where the modification includes changing the values of the predistortion function for input signal levels corresponding to a region of unrealizable system gain based on values for the predistortion function for input signal levels corresponding to a region of realizable system gain, wherein the change in value does not increase the gain of the predistortion function; and loading the updated predistortion function, as modified, to the real-time predistorter.

Selected embodiments of the invention are related to the adaptive estimation of a predistortion function. One embodiment includes an adaptive estimator for a predistorter system, where the adaptive estimator receives at least a reference signal and an observed signal as inputs and generates a predistortion function that is implemented by a real-time predistortion engine, the adaptive estimator comprising: a normalizing circuit configured to receive the reference signal and the observed signal, where the normalizing circuit is configured to at least scale the observed signal to a modified observed signal such that the modified observed signal and the reference signal are of approximately the same magnitude; an estimator circuit adapted to compare the reference signal and the modified observed signal, where the estimator circuit is further configured to calculate a predistortion function for the real-time predistortion engine that is approximately complementary to a transfer function of a corresponding RF power amplifier based on the comparison; and a constant gain circuit configured to receive the predistortion function from the estimator circuit, where the constant gain circuit is further configured to select a region of the predistortion function, where the constant gain circuit is configured to adjust the gain of the predistortion function such that the selected region has a target gain, and where the constant gain circuit is configured to load the gain-adjusted predistortion function to the real-time predistortion engine.

One embodiment includes a method of generating a predistortion function to be applied by a real-time predistortion engine to reduce distortion in a RF power amplifier. The method can include: receiving a reference signal, where the reference signal is a digital signal that is related to an input to a real-time predistortion engine; receiving an observed signal, where the observed signal is a digital signal that is demodulated and downconverted from an output of the RF power amplifier; comparing at least a magnitude of the reference signal to the observed signal; normalizing the observed signal to a modified observed sa region of realizable system gain and a region of unrealizable system gain-ignal, wherein normalizing includes scaling magnitude in response to the comparison; comparing the modified observed signal and the reference signal; estimating a predistortion function for a real-time predistortion engine, where the predistortion function is estimated to provide an approximately complementary distortion to a distortion in the RF power amplifier; scaling the estimated predistortion function such that a selected region of the scaled predistortion function exhibits the same gain when the process is repeated; and loading the scaled predistortion function to the real-time predistortion engine.

Selected embodiments of the invention are related to a feedback signal. One embodiment includes a modified signal in a feedback loop of a predistortion circuit useful in an RF power amplifier system. The modified signal includes: an average magnitude for the modified signal that is maintained at a constant ratio relative to a magnitude of a first signal; and signal characteristics for the modified signal that are related to the signal characteristics of a second signal, where the second signal is modulated, amplified, coupled and demodulated from a first signal, where the second signal is at a different magnitude from the first signal and the modified signal.

Selected embodiments of the invention are related to a control loop. One embodiment of the invention includes an inner predistortion control loop for an RF power amplifier system. The control loop includes: a forward signal processing path starting from an input to a digital predistortion entity, the forward signal processing path further including: a digital predistortion entity; a conversion from digital to analog; a modulation stage; a baseband to RF upconversion; and an RF power amplifier. The control loop further includes a feedback signal processing path starting from an actual output of the RF power amplifier, the feedback signal processing path further including: a coupling of an actual output of the RF power amplifier; an RF to baseband downconversion; a demodulation stage; a conversion from analog to digital; a gain scaling stage that normalizes the magnitude of an output of the analog to digital conversion to the magnitude of the input to the digital predistortion entity; an adaptation engine that is configured to communicate with the digital predistortion entity to change the predistortion behavior of the digital predistortion entity; and a constant gain stage configured to receive an output of the adaptation engine and scale the output such that the gain of a predistortion function that is applied to the input signal by the digital predistortion entity exhibits a substantially constant gain in a selected region.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

FIG. 13 illustrates system scaling for a lookup table for a constant gain controller.

DETAILED DESCRIPTION OF PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

Embodiments of the invention include a method and an apparatus for controlling and adapting digital predistortion linearizers for amplification of bandlimited signals using non-linear amplifiers. Advantageously, a predistortion function for a predistortion entity can be controlled to provide a relatively constant gain. The disclosed techniques can be applied to virtually any digital predistorter for an amplifier intended for bandlimited, and yet relatively wideband RF signals. The disclosed techniques can further be used in connection with multiple signals and with virtually any modulation scheme or combination of modulation schemes. In systems where multiple signals are amplified, the multiple signals can use different modulation types.

The digital predistortion and relatively constant gain processing techniques disclosed are relatively simple to implement as compared with other amplifier linearizing techniques. Furthermore, embodiments of the invention advantageously exhibit relatively high performance and relatively high efficiency.

The Wideband Digital Predistortion Linearizer for Non-Linear Amplifiers with Constant Gain Processing technique is useful in a variety of applications including wideband third generation cellular basestation designs for wide-band code division multiple access (W-CDMA), IMT-2000 and UMTS-2000. These basestation configurations are preferably relatively linear and relatively power efficient multi-carrier amplification. The design is also applicable to other commercial systems such as point-to-point, point-to-multipoint, wireless local loop, Multipoint Multichannel Distribution Service (MMDS) and Local Multipoint Distribution Services (LMDS) wireless systems. The constant gain approach is also applicable to existing cellular systems. The technique can also find relatively broad utilization in the satellite, cable broadcast and terrestrial broadcast industries, where linear amplification is desirable. The disclosed techniques can also be advantageously applied to amplify digital radio and digital television signals, where amplification with relatively low distortion is also desirable.

Complex Gain Predistortion

Figure 1:
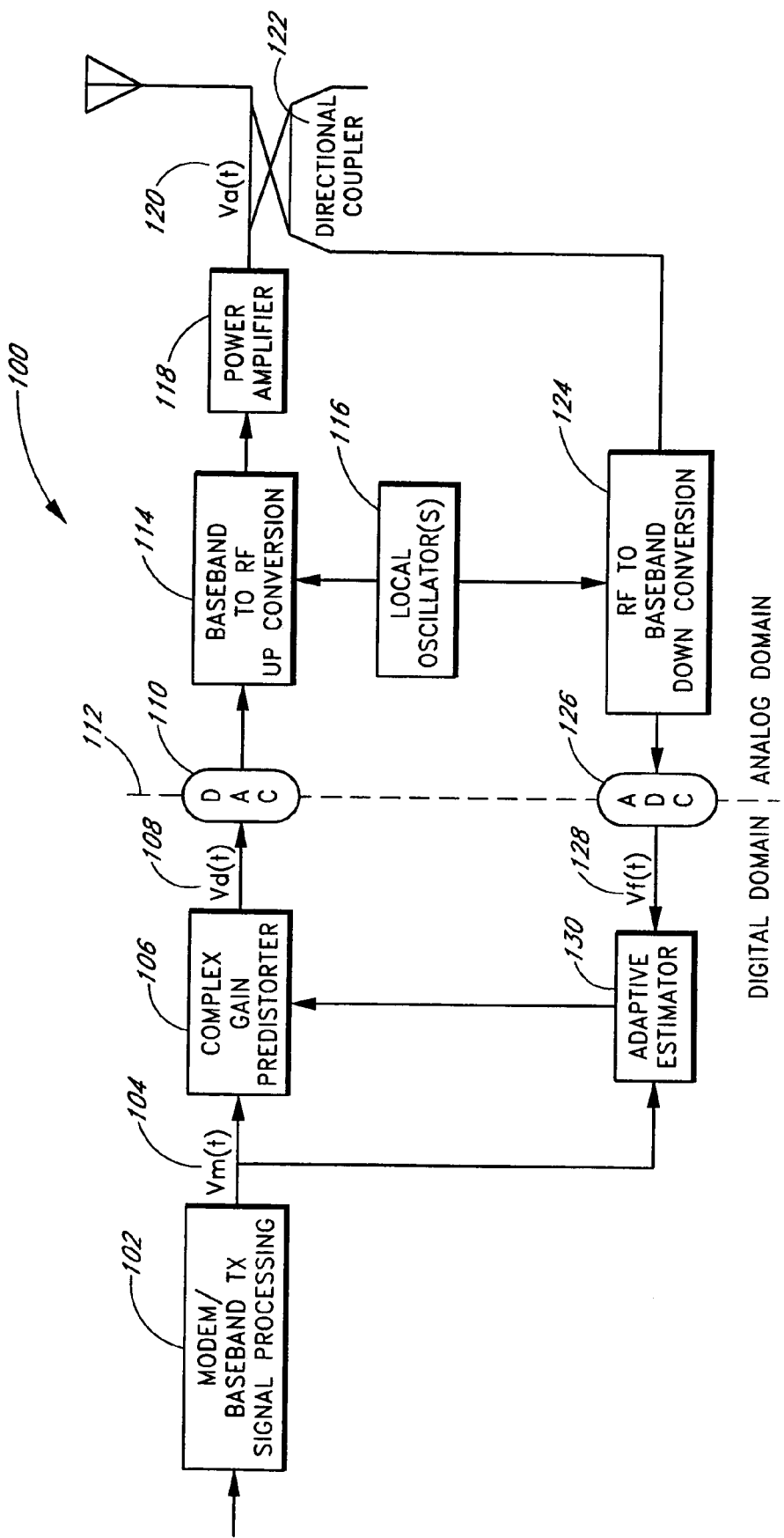
FIG. 1 illustrates an adaptive linearization circuit.

FIG. 1 illustrates an example of a configuration of an adaptive linearization circuit 100. It will be understood that some portions of the adaptive linearization circuit 100 can be implemented in hardware and other portions can be implemented in software. In FIG. 1, a feedback loop formed by an RF coupler 122, an RF to baseband down conversion circuit 124, and an analog-to-digital converter 126 has been added to a conventional power amplifier configuration. In the illustrated embodiment, the RF coupler 122 is a directional coupler. In one embodiment, the RF to baseband down conversion circuit 124 can correspond to a quadrature demodulator. The signal designations refer to the complex baseband signals or the complex envelope of the bandpass signals, and this notation is consistent with seminal work in the field, see J. K. Cavers, "Amplifier Linearization Using a Digital Predistorter with Fast Adaption and Low Memory Requirements," IEEE Trans. Veh. Technol., Vol. 39, pp. 374–383, November 1990. A dashed line 112 represents the boundary between the digital domain to the left and the analog domain to the right.

A complex gain predistorter (DCSP) 106 generates a baseband complex modulation envelope $V_d(t)$ 108 that anticipates and corrects for the non-linearities introduced by a power amplifier (PA) 118. An adaptive estimator 130 compares the desired complex modulation envelope of a reference signal $V_m(t)$ 104 with the complex modulation envelope of an observed signal $V_f(t)$ 128 that is derived from an actual output signal $V_a(t)$ 120 of the power amplifier 118. In response, the adaptive estimator 130 estimates the complex gain predistortion coefficients that are used by the complex gain predistorter (DCSP) 106. The observed signal $V_f(t)$ 128 is a scaled, rotated, and delayed version of the actual output signal $V_a(t)$ 120, and the complex modulation envelopes of the observed signal $V_f(t)$ 128 and of the actual output signal $V_a(t)$ 120 should correspondingly be similar. The characteristics of the complex gain predistorter (DCSP) 106 are selected such that its non-linearity is approximately complementary to that of the power amplifier 118, as described in further detail later in connection with FIG. 2, where the complex modulation plane is mapped onto itself.

The original modulation trajectory is mapped to a new trajectory in the complex modulation plane by the complex gain predistorter (DCSP) 106. This new trajectory is carefully selected such that upon amplification by the non-linear power amplifier 118, it is mapped back to the original and desired modulation trajectory. As a result, the distortion and inter-modulation products at the actual output signal $V_a(t)$ 120 are reduced, since the actual output signal $V_a(t)$ 120 is now constrained to the spectral characteristics of the linear modulation scheme. The complex gain predistortion technique assumes that the power amplifier 118 may be characterized by memoryless amplitude-to-amplitude and amplitude-to-phase non-linearities. This amplifier characteristic is expressed in Equation 1.

$$V_a(t)=V_d(t)\cdot G\{|V_d(t)|^2\} \quad \text{(Eq. 1)}$$

In Equation 1, $V_d(t)$ and $V_a(t)$ are complex baseband representations of the instantaneous input and output complex modulation envelopes, respectively, of the power amplifier 118. A digital to analog converter (DAC) 110 converts the baseband complex modulation envelope $V_d(t)$ 108 from digital to analog. A baseband to RF up conversion circuit 114 receives a local oscillator signal from a local oscillator 116 and upconverts the baseband complex modulation envelope $V_d(t)$ 108 to RF. The baseband to RF up conversion circuit 114 can, for example, correspond to a quadrature upconverter/modulator. The complex gain $G\{|V_d(t)|^2\}$ defines the non-linear amplifier gain to be a function of instantaneous input amplitude. This eases the computation of the adaptive estimator 130, which determines the appropriate predistortion coefficients. The complex gain predistorter (DCSP) 106 is described by a similar complex gain equation expressed in Equation 2.

$$V_d(t)=V_m(t)\cdot F\{|V_m(t)|^2\} \quad \text{(Eq. 2)}$$

In Equation 2, $V_m(t)$ and $V_d(t)$ are complex baseband representations of the instantaneous input and output complex modulation envelopes, respectively, of the complex gain predistorter (DCSP) 106. A characteristic function, $F\{|V_m(t)|^2\}$, of the complex gain predistorter (DCSP) 106 is determined by the adaptive estimator 130 to minimize a loop error vector. One simplified example of the loop error vector is expressed in Equation 3 as the difference between the actual output signal $V_a(t)$ 120 of the power amplifier 118 and the reference signal $V_m(t)$ 104. It will be understood that there is a time delay between the actual output signal $V_a(t)$ 120 and the reference signal $V_m(t)$ 104 that is not shown in Equation 3. It will also be understood that the actual output signal $V_a(t)$ 120 may be observed by the adaptive estimator 130 via the observed signal $V_f(t)$ 128.

$$V_{error}(t)=V_a(t)-V_m(t) \quad \text{(Eq. 3)}$$

Figure 3:
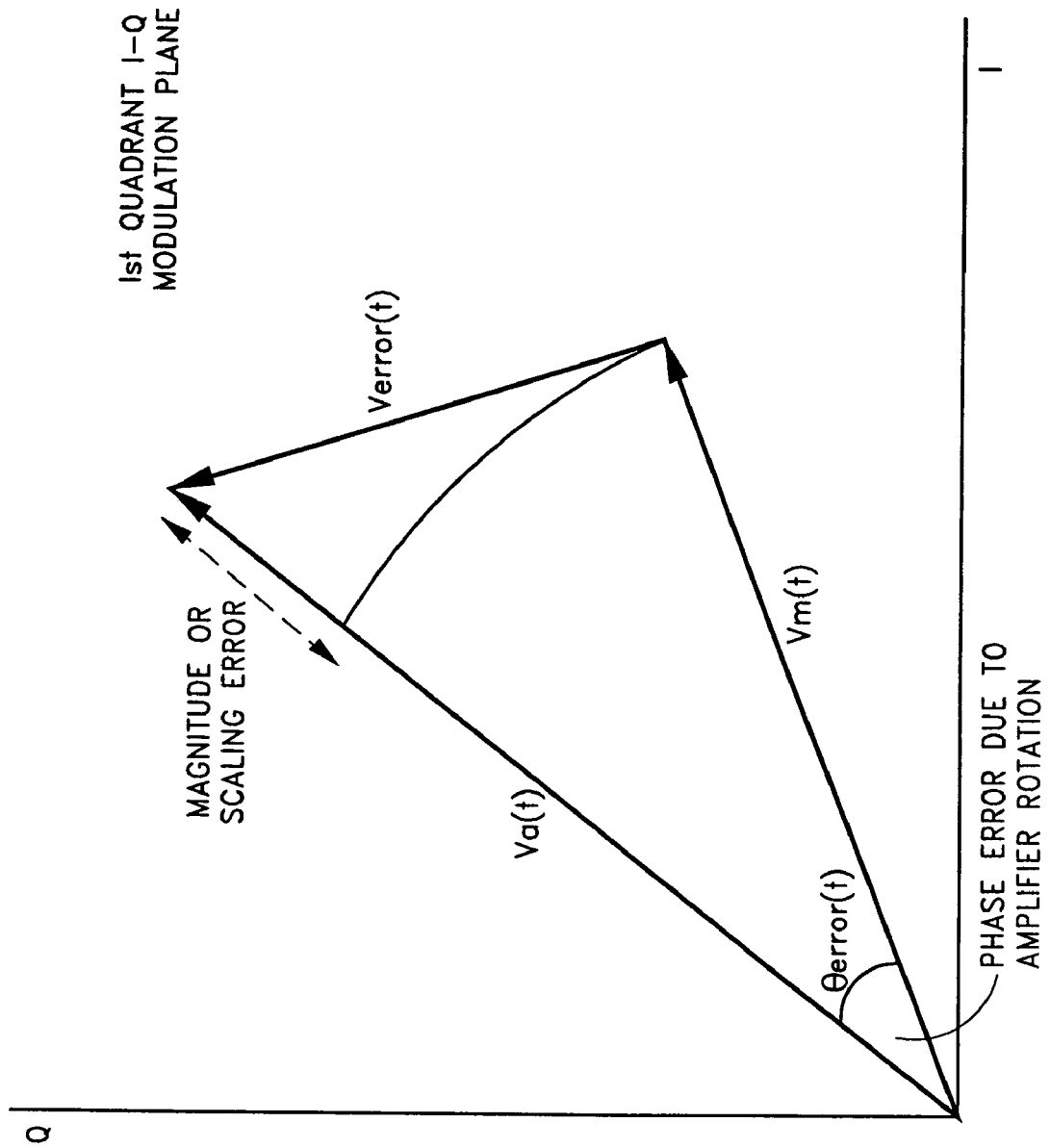
FIG. 3 illustrates a loop error vector.

FIG. 3 illustrates a loop error vector that shows the complex modulation error between modulation and amplifier trajectories.

The Adaptive Estimator 130

A direct link may be established between the loop error vector and characteristic function of the predistorter by eliminating $V_d(t)$ from Equation 1 and Equation 2, and then substituting for $V_a(t)$ in Equation 3. Thus, the error vector can be rewritten as expressed in Equation 4.

$$V_{error}(t) = V_m(t)\cdot F\{|V_m(t)|^2\}\cdot G\{|V_m(t)F\{|V_m(t)|^2\}|^2\} - V_m(t) \quad \text{(Eq. 4)}$$

Figure 2:
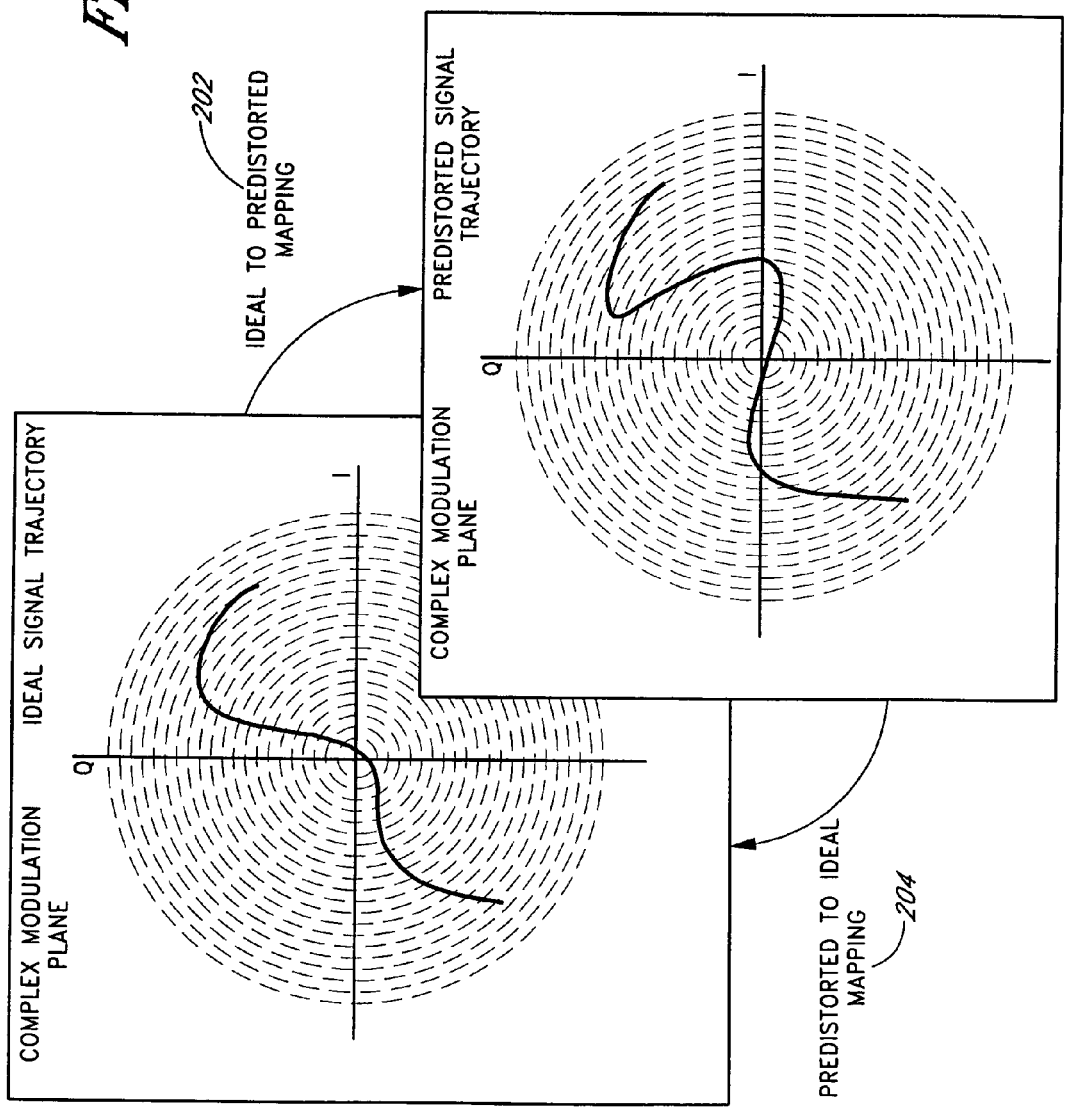
FIG. 2 illustrates complex modulation plane mapping.

The task of the adaptive estimator 130 is to calculate the characteristic function, $F\{|V_m(t)|^2\}$, of the predistorter such that for a selected value of $V_m(t)$, the loop error vector, $V_{error}(t)$ is reduced and/or minimized, e.g., zero. One method of representing the characteristic function, $F\{|V_m(t)|^2\}$, is to introduce a one-dimensional quantized lookup table, which is indexed by the modulus of the baseband complex modulation envelope. The annular rings shown in FIG. 2 are a direct consequence of this quantization, and it is assumed that the amplifier's AM-AM and AM-PM non-linear characteristics are relatively constant over the width of the annulus and are relatively invariant with phase.

While illustrated in the context of a lookup table, it will be understood by one of ordinary skill in the art that the principles and advantages described herein are applicable to other data storage techniques, such as a multidimensional data structure.

The corresponding table entry is a complex number representing the complex gain used to predistort the complex modulation envelope of the reference signal $V_m(t)$ 104 for that specific instantaneous amplitude. The effects of table size and quantization step have been studied, and it has been demonstrated that lookup tables of about 32 or 64 entries provide sufficient spectral control of a non-linear amplifier when used in conjunction with a 16-level quadrature amplitude modulation (QAM) scheme. See Cavers, id. However, since the power amplifier's non-linear characteristics are a function of temperature, frequency, operating point and aging, the contents of the lookup table should be continually updated to ensure accurate predistortion.

A linear convergence technique, known as rotate and scale (RASCAL), has been developed for the adaptive estimator 130. In one embodiment, the adaptive estimator 130 updates the predistortion lookup table by continually comparing the original complex modulation envelope of the reference signal $V_m(t)$ 104 with the observed signal $V_f(t)$ 128 or sampled feedback complex modulation trajectory. As previously mentioned, the feedback signal is a delayed version of the amplifier's output, $V_a(t)$, and this delay should be eliminated, i.e., compensated, before comparisons are made. To estimate and remove the delay, several techniques are available. See Y. Nagata, Linear Amplification Technique For Digital Mobile Communications, in proc. IEEE Veh. Technology. Conf., San Francisco, Calif., 1989, pp. 159–164. Also see E. A. Lee and D. G. Messerschmitt, Digital Communication, New York: Kluwer Academic, 1990 ch 15, pp. 566–569. To effect the comparisons and update the lookup table, the loop error vector $V_{error}(t)$ is broken into magnitude and phase error equations as expressed below in Equations 5, 6, and 7.

$$V_{error}(t) = V_a(t) - V_m(t) = |V_{error}(t)| \cdot e^{-j\phi_{error}(t)} \quad \text{(Eq. 5)}$$

Upon converting Equation 5 to polar coordinates, two orthogonal error functions are expressed below in Equations 6 and 7.

$$e_{scale}(|V_m(t)|^2) = |V_a(t)| - |V_m(t)| \quad \text{(Eq. 6)}$$

$$e_{rotate}(|V_m(t)|^2) = \arg(V_a(t)) - \arg(V_m(t)) \quad \text{(Eq. 7)}$$

FIG. 3 provides a graphical interpretation of these error functions. For inputs to the amplifier with identical instantaneous signal amplitude, the scaling and rotational distortion (AM-AM and AM-PM) is predictable. Consequently, the adaptive estimator 130 seeks the correct complimentary rotation and scaling to compensate for the distortion of the amplifier. This can be achieved by employing an iterative linear convergence to minimize the error functions expressed in Equations 6 and 7.

Figure 4:
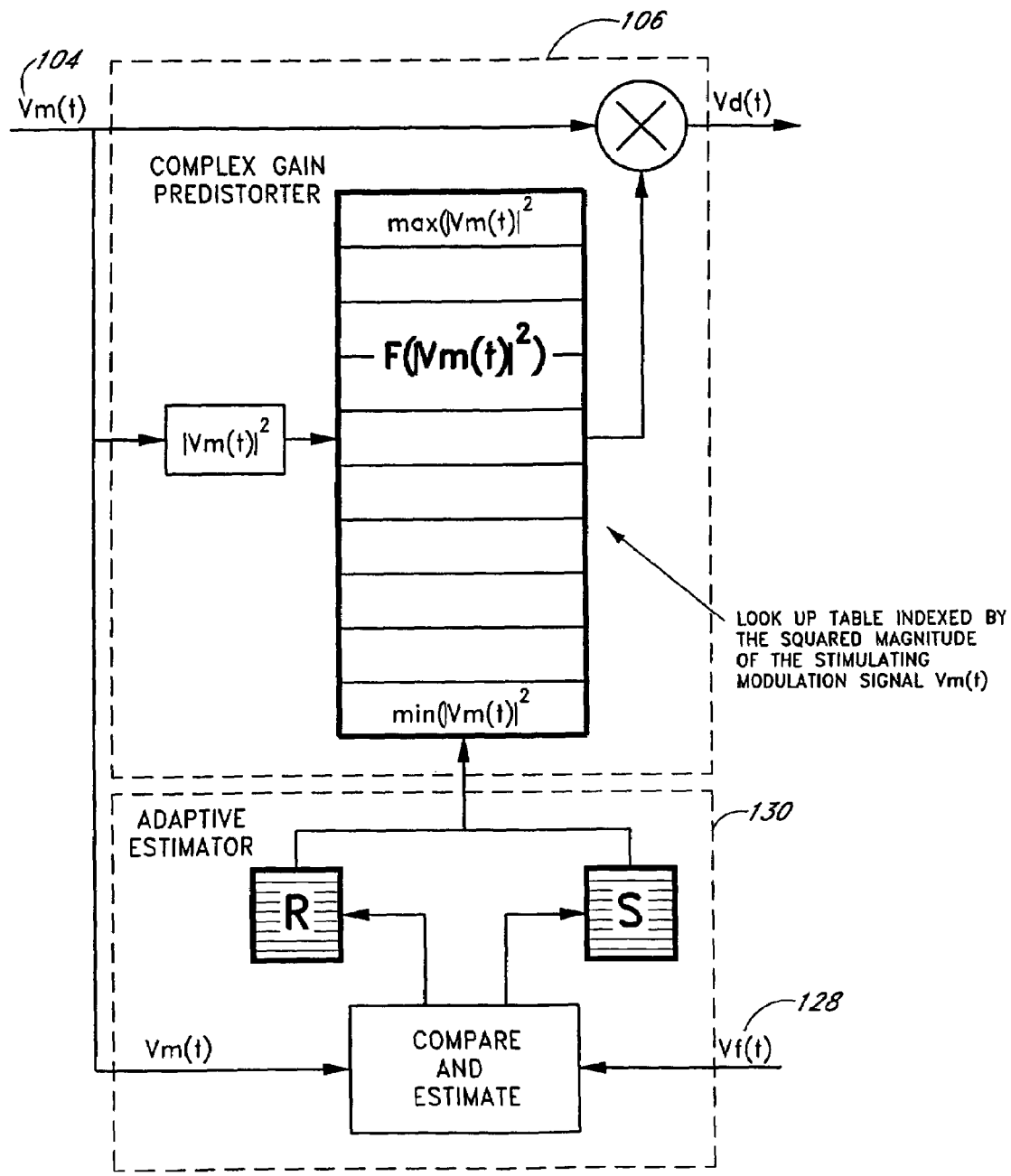
FIG. 4 illustrates a combined predistorter/adaptive estimator structure.

The operation of one embodiment of the adaptive estimator 130 is expressed by Equations 8 and 9. A combined predistorter/adaptive estimator structure is illustrated in FIG. 4.

$$S_{i,n+1} = S_{i,n} - \alpha \cdot e_{scale}(|V_m(t)|^2) \quad \text{(Eq. 8)}$$

$$R_{i,n+1} = R_{i,n} - \alpha \cdot e_{rotate}(|V_m(t)|^2) \quad \text{(Eq. 9)}$$

In Equations 8 and 9, $\alpha$ is the update gain, which controls the rate of convergence and is usually restricted to be less than unity, and the subscript "i" refers to a specific table entry. This iteration occurs when the complex modulation envelope traverses a given table entry. When a new rotate factor $R_{inew}$ and a new scale $S_{inew}$ factor are estimated, they are recombined to form the complex gain of the predistorter, $F\{|V_m(t)|^2\}$, and stored in the lookup table. This technique is directly analogous to proportional and integral feedback familiar to control engineers.

The foregoing is a synopsis of the principles utilized in the design and operation of a complex baseband predistortion linearizer that may be employed with a non-linear amplifier. For further information, see Andrew S. Wright and Willem G. Durtler *Experimental Performance of an Adaptive Digital Linearized Power Amplifier*, IEEE Trans. Vehicular Technology, Vol 41, No. 4, November 1992. Also see Y. Nagata, *Linear Amplification Technique For Digital Mobile Communications*, in proc. IEEE Veh. Technology Conf, San Francisco, Calif., 1989, pp. 159–164, which is attached hereto as Appendix I, and see J. K. Cavers, *Amplifier Linearization Using A Digital Predistorter With Fast Adaptation And Low Memory Requirements*, IEEE Trans. Veh. Technol., Vol. 39, pp. 374–383, November 1990, which is attached hereto as Appendix II. Also see U.S. Pat. No. 5,049,832 to Cavers and U.S. Pat. No. 5,867,065 to Leyendecker, the entireties of which are hereby incorporated by reference herein.

Radio Resource Management Entity

Figure 5:
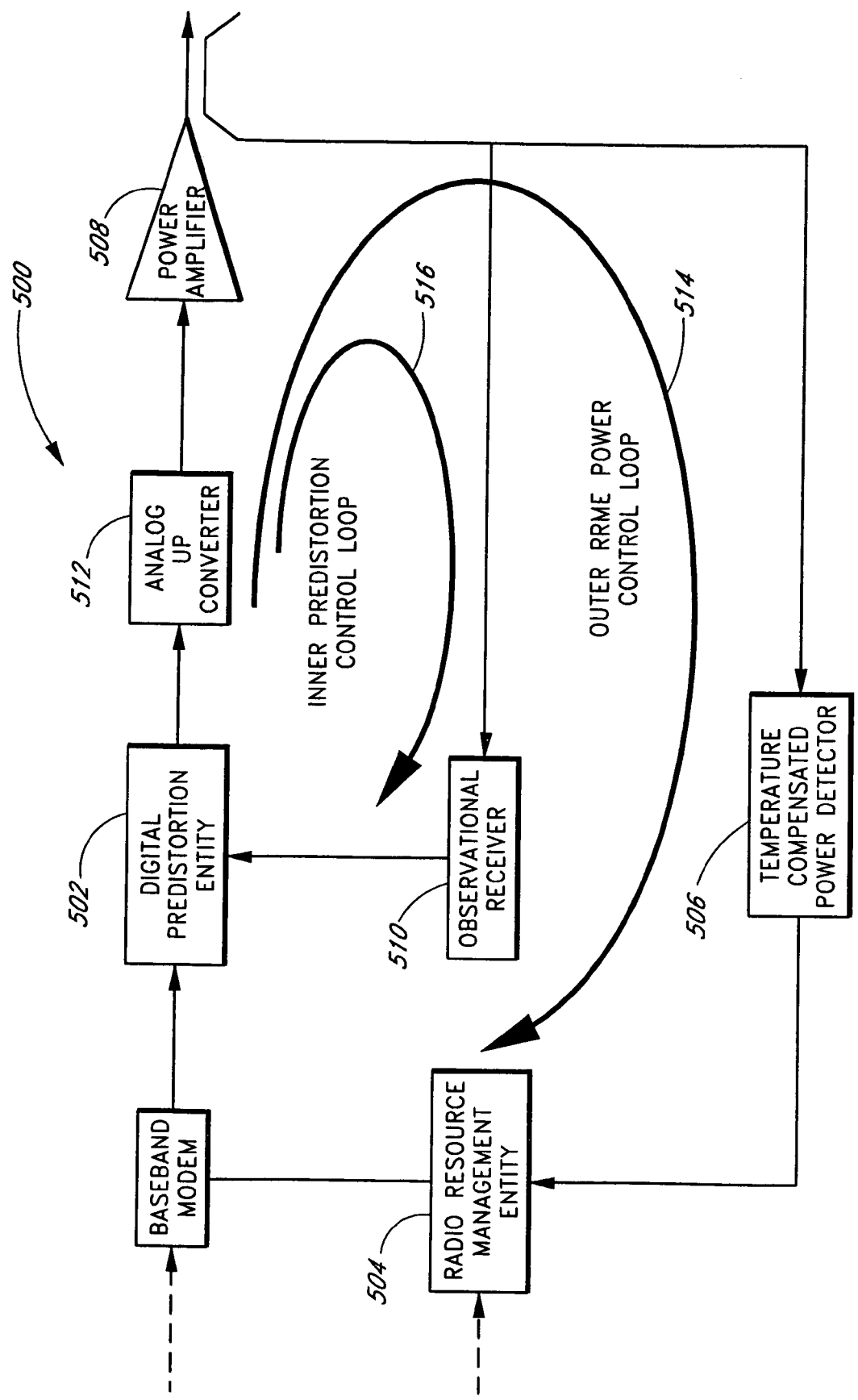
FIG. 5 illustrates a conventional integrated predistortion system.

FIG. 5 illustrates a conventional integrated predistortion system 500 in which a digital predistortion entity 502 has been embedded. The integrated predistortion system 500 includes an observational receiver 510, which can include, for example, the RF to baseband down conversion circuit 124, such as a quadrature downconverter, the analog-to-digital converter 126, and the adaptive estimator 130 described earlier in connection with FIG. 1. Conventional multicarrier-multibearer systems, such as those employed in third and fourth generation radio systems, can employ a radio resource management entity (RRME) 504 that ensures individual and global carrier power transmission levels are critically set and maintained, i.e., the RRME 504 is responsible for overall power control. Ordinarily, a temperature compensated diode power detector 506 is utilized by the RRME 504 to ensure that the overall power delivered to the antenna from a power amplifier 508 is maintained at an absolute level. Theoretically, this circuitry could be eliminated because the observational receiver 510 could permit the digital predistortion entity to maintain the power amplifier output at a precise level. In practice, however, this would be difficult because the predistortion subsystem operates by attempting to normalize the performance of the entire loop and not just an upconverter 512 and the power amplifier 508. Consequently, drifts due to component tolerances, aging, and thermal effects in the down converter or upconverter or combination thereof will cause the predistortion system to completely correct the loop, which could potentially cause the power amplifier 508 to be over-driven with a rapid decrease in linearization performance or alternatively cause the power amplifier 508 to be under-driven with an associated loss of efficiency.

FIG. 5 illustrates that this problem may be identified as two nested control loops 514, 516, each of which attempts to correct and eliminate departures from an optimal operating point. Furthermore, it is important to note that the control loops operate independently of each other and without the knowledge of the other's presence. This occurs because the RRME and the predistortion control engines are typically located in different subsystems with relatively limited control interaction. In practice, interaction problems could be overcome by stipulating individual time constants for each control loop, but for the designer and manufacturer of predistortion sub-systems that may be utilized with various radio systems from many different radio system manufacturers, this is impractical. The following paragraphs illustrate some of the problems that can be encountered when operating in this dual closed loop scenario.

A fundamental goal of complex predistortion is to apply a first specific non-linear mapping 202 to an input or reference signal trajectory such that upon amplification, a subsequent mapping 204 that is provided by the amplifier causes the signal trajectory to follow the loci of the original input or reference signal. This concept is illustrated in FIG. 2. The first mapping 202 undertaken in this description is commonly invoked by and referred to as the process of predistortion. The process illustrated in FIG. 2 assumes that the mapping invoked by the amplifier and predistortion engines can be described by a simple memoryless non-linear AM-AM and AM-PM function. In practice, this is known to be too simplistic for power amplifiers. However, FIG. 2 provides a means to discuss the overall concept of predistortion and the practical matters addressed herein. To summarize, predistortion may be regarded as the process of determining how to cascade a pair of non-linear functions such that the overall composite system mimics a linear system.

Figure 6A:
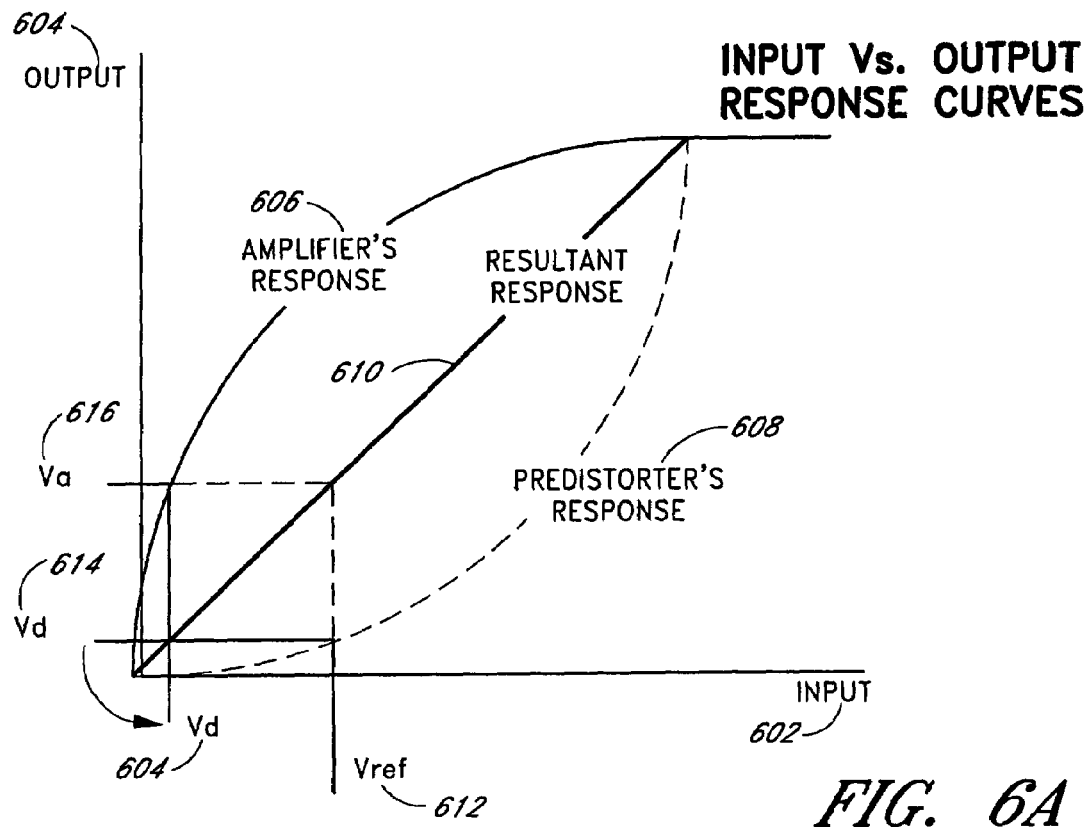
FIG. 6A illustrates input versus output response curves.

The previous discussion illustrates the overall objective of predistortion at a very abstract level. FIG. 6A overlays this abstraction with the response of a hypothetical AM-AM amplifier non-linearity. FIG. 6A is a chart of input vs. output response curves. An input magnitude 602 is indicated along a horizontal axis. It will be understood by one of ordinary skill in the art that the "input" in FIG. 6A can correspond to the input of a predistorter, as well as to the input to a power amplifier. Similarly, the "output" in FIG. 6A can correspond to the output of the predistorter, as well as to the output of a power amplifier. An output magnitude 604 is indicated along a vertical axis. FIG. 6A illustrates a convex amplifier response 606, which eventually reaches a saturated value. Saturation implies that in a physical amplifier, an operating point can be reached where no additional output power, irrespective of how hard the input signal level is driven, can be supplied/generated by the amplifier. The upper diagram also illustrates how a cascade of a concave predistortion response 608 can result in an overall linear response 610.

Utilizing FIG. 6A, an overall linear system response can be obtained by consideration of the following. An input reference signal $V_{ref}$ 612 is mapped by the concave predistortion response 608 to a significantly lower level predistortion signal $V_d$ 614. The signal level of the input reference signal $V_{ref}$ 612 is mapped by the concave predistortion response 608 to a value shown by the vertical axis of the FIG. 6A. The predistortion signal $V_d$ 614 is then applied as an input to the amplifier as represented by the convex amplifier response 606, which transfers to an output level $V_a$ 616. This output level $V_a$ 616 is approximately identical to that provided by a pure linear response driven with the original input reference signal $V_{ref}$ 612.

It should be noted that limitations on the gradient of the overall linear response are predetermined by the maximum output signal level that the amplifier can source. A linear response that permits an overall steeper gradient permits an increase in average power levels, but the question of what happens upon signal peaks immediately arises. The foregoing has also introduced a concept of the "linear response gradient" and its subsequent manipulation for higher average operating powers. This notion is readily adopted by skilled practitioners as a visualization technique for exploring such ideas. An alternate visualization technique will be described later in connection with FIGS. 10 and 11.

Figure 6B:
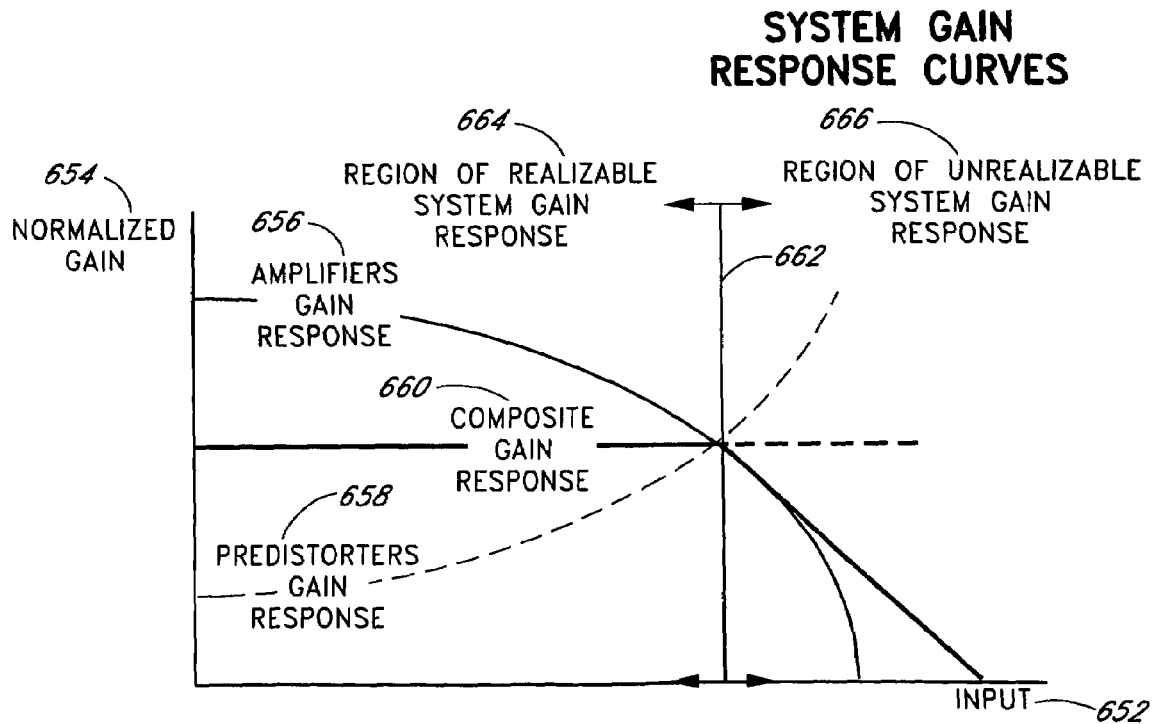
FIG. 6B illustrates system gain response curves.

FIG. 6B is a graph that illustrates an example of a gain response 656 of a non-linear amplifier and a gain response 658 of a corresponding predistortion stage with respect to an input signal level 652. The input signal level 652 is indicated along a horizontal axis. A normalized gain 654 is indicated along a vertical axis. FIG. 6B illustrates that if the concave predistortion response 608 is replaced with a plot of the gain response 656 of the amplifier, the product of the amplifier and predistortion gain curves can be visualized as a relatively linear gain response 660, i.e., a relatively constant gain irrespective of the input signal level 652. This mental construct is accurate until the point of maximum saturated output power of the particular amplifier. Beyond its maximum saturated output power point, an amplifier cannot provide any additional power, and the gain response 656 of the amplifier falls rapidly. Over-driving the amplifier with a complimentary gain level will not result in a linear gain response beyond the maximum saturated output power.

FIG. 6B includes a line 662, which partitions FIG. 6 into a region of realizable system gain 664 and a region of unrealizable system gain 666. The region of unrealizable system gain 66 is also known as a region of unsupportable system gain. It is the behavior and management of a predistortion system that transgresses this boundary that causes difficulties. Non-linearity has traditionally caused many difficulties in signal analysis. Moreover, the transition across to the region of unrealizable system gain 666 results in a non-linear "step" function, which further increases the difficulty of signal analysis. The difficulties can be illustrated by the following example. Consider a conventional lookup table based predistortion system in which the upper quarter of the table entries correspond to input signal levels that exceed the maximum saturated output power that the amplifier can deliver. In an adaptive scheme, the predistortion engine observes that the amplifier's signal level falls short of the desired output level. Thus, without an indication that the amplifier has reached saturation, the digital predistortion entity 502 can continue to increase system gain in accordance with the stored values for these table entries of the adaptation logic. This results in a massive step in the predistortion response. Consequently, it may be envisioned that the table entries that overlap the region of unrealizable composite system gain will continue to grow, and can eventually reach inappropriately high levels, such as the maximum complex magnitude integer that can be represented in a fixed point system. Furthermore, it has been observed in conventional systems that such step functions will eventually cause other LUT entries, i.e., LUT entries corresponding to less than maximum saturated output power, to also become corrupted.

Existing predistortion systems often operate by identifying the power amplifier's saturated output power and ensuring that the predistortion system does not overdrive the amplifier into a region of unrealizable gain. When coupled with a basestation vendor's specific outer loop power control, uncontrolled overdrive situations can arise as dual control loops contend for absolute system power control. Under such circumstances, the outer loop power controller RRME 504 may request/force an average operating power level that causes the predistortion logic to operate in the region of unrealizable system gain. Clearly, the utilization of the current predistortion processes in such circumstances is not a viable product option.

Furthermore, existing predistortion methodologies and designs are ill suited to an application in which an amplifier is deliberately overdriven to achieve a higher average operating power. An infrequent overdrive event can be tolerated without unduly degrading distortion levels. It may be desirable to permit an amplifier to be occasionally overdriven in order to increase the efficiency of the system.

Inner and Outer Control Loop Interactions

The following paragraphs identify some operating scenarios in which outer loop RRME power control can cause a system failure or significant degradation in linearization performance.

FIG. 5 illustrates components of the integrated predistortion system 500 within a cellular radio system. The illustrated analog upconverter 512, the power amplifier 508, the observational receiver 510, and the temperature compensated diode power detector 506 are analog components that are subject to drift due to temperature, operating conditions, and component aging processes. Drift or variation in the gain provided by these stages can provoke a variety of responses from both control loops 514, 516. Various scenarios are discussed in the following sections, which are based upon a practical assumption that the engine for the inner predistortion control loop 516 operates with a faster time constant than the engine for the outer RRME power control loop 514, which is the RRME 504 in the embodiment illustrated in FIG. 5.

Scenario I: Increase in Upconverter Gain and/or Power Amplifier Gain

When an increase in the gain of the upconverter 512 and/or the power amplifier 508 occurs, then the following sequence of events can be observed:

a short-term increase in output power will occur with a potential increase in observed distortion products;

the relatively fast inner predistortion control loop 516 will reduce predistortion entity gain;

absolute output power levels will return to predetermined levels; and residual distortion will be substantially eliminated or reduced.

In summary, an increase in the gain of the upconverter 512 and/or the power amplifier 508 is a relatively benign event that does not provoke a response from the RRME 504. Furthermore, the digital predistortion entity 502 will still be operating within the region of realizable system gain 664.

Scenario II: Decrease in Upconverter Gain and/or Power Amplifier Gain

When a decrease in upconverter and/or power amplifier gain occurs, then the following sequence of events can be observed:

a short-term decrease in output power;

the fast inner predistortion control loop 516 will increase predistortion gain;

absolute output power levels will return to predetermined levels;

residual distortion may increase due to the resulting overdrive of the power amplifier 508; and predistortion instability can occur as the predistortion process or predistortion entity operates the integrated predistortion system 500 within the region of unrealizable system gain 666 such that the power amplifier 508 is overdriven.

In summary, a decrease in the gain of the upconverter 512 and/or the power amplifier 508 is an event that does not provoke a response from the RRME 504. However, the digital predistortion entity 502 will be operating within the region of unrealizable system gain, and this could lead to system instability depending upon the design of the digital predistortion entity 502.

Scenario III: Increase in Observational Receiver Gain

When an increase in the observational receiver gain occurs, then the following sequence of events can be observed;

the fast inner predistortion control loop will decrease predistortion gain;

a temporary drop in the absolute power level to the antenna will be observed;

the RRME 504 will increase drive level to compensate for the loss in power; and output power will rise to the predetermined levels but wideband noise floor will be degraded as a result of loss of digital gain in the digital predistortion entity 502.

In summary, an increase in observational receiver gain is a benign response that provokes a response from the outer RRME power control loop 514. If the drift is substantial, the loss in numerical precision due to mis-scaling of the digital predistortion entity 502 can result in a performance loss. The system should, however, remain stable in this scenario.

Scenario IV: Decrease in Observational Receiver Gain

When a decrease in the observational receiver gain occurs, then the following sequence of events can be observed:

the relatively fast inner predistortion control loop 516 will increase predistortion gain;

a temporary increase in absolute power level to the antenna will be observed as the power amplifier 508 is overdriven;

the power amplifier 508 will be overdriven with a significant increase in distortion products;

the RRME 504 will decrease drive level to compensate for the increase in power;

output power will fall to the predetermined levels, but the wideband noise floor will be degraded as a result of loss in the digital gain of the outer RRME power control loop 514; and instability in the algorithms may occur depending upon the duration in which the system remains operating in the region of unrealizable system gain 666.

In summary, a decrease in observational receiver gain results in a potentially catastrophic scenario that provokes a response from the outer RRME power control loop 514. If the drift is substantial and has significant duration, the power amplifier 508 can be destroyed due to an overdrive condition. If the outer RRME power control loop 514 is sufficiently fast, then the power amplifier 508 may survive the overdrive event, but system performance is degraded due to instabilities in the predistortion adaptation process as it attempts to recover from operation in the region of unrealizable system gain 666.

Scenario V: Positive Drift in Temperature Compensated Power Detector Response

The RRME 504 erroneously determines that too much power is delivered to the antenna when a positive drift in the response of the temperature compensated diode power detector 506 occurs. The following sequence of events can be observed:

the RRME 504 will decrease drive level to the digital predistortion entity 502;

actual RF power level delivered to the antenna will fall; and the digital predistortion entity 502 will remain operating with the region of realizable system gain 664.

In summary, a positive drift in temperature compensated power detector response is a benign event with little impact upon the predistortion entity.

Scenario VI: Negative Drift in Temperature Compensated Power Detector Response

The RRME 504 erroneously determines that not enough power is delivered to the antenna when a negative drift in the response of the temperature compensated diode power detector 506 occurs. The following sequence of events can be observed:

the RRME 504 will increase drive level to the digital predistortion entity 502;

actual RF power level delivered to the antenna will increase;

the digital predistortion entity 502 will operate within the region of unrealizable system gain 666;

distortion levels will increase;

system stability can be compromised as the predistortion entity attempts to accommodate an unrealizable gain; and the power amplifier 508 may fail due to an extended period of overdrive or failure in the predistortion entity.

In summary, a negative drift in the response of the temperature compensated diode power detector 506 is potentially catastrophic.

Summary of Troublesome Scenarios

In the foregoing discussion, several scenarios have been considered in which undesirable system behavior has been identified. The severity of these scenarios can be significantly worse when the time constants associated with the inner predistortion control loop 516 and the outer RRME power control loop 514 are comparable or are reversed, such that the inner predistortion control loop 516 is slower than the outer RRME power control loop 514. Under such scenarios, oscillatory responses can be anticipated, which can increase the likelihood of system instability. This expected oscillatory response can also be exacerbated by the change in the severity of an amplifier's non-linearity as the drive level rapidly changes. As will be appreciated by one of ordinary skill in the art, time-varying non-linearities within a nested control loop can be particularly difficult to stabilize.

The foregoing discussion illustrates that a predistortion entity in a radio system in an environment with outer loop power control can exhibit at least two disadvantages. One disadvantage is that system instabilities can occur as inner and outer control loops contend at different rates to resolve perceived variances in power. Another disadvantage is that various operating scenarios can lead to operation in the region of unrealizable system gain 666. Conventional predistortion entities have not been able to provide unconditional stability when operating in the region of unrealizable system gain 666. Embodiments of the invention include a method of controlling a predistortion engine that advantageously permits operation in a dual-loop control system environment and provides for stable operation when the region of unrealizable system gain 666 is transgressed.

Figure 7:
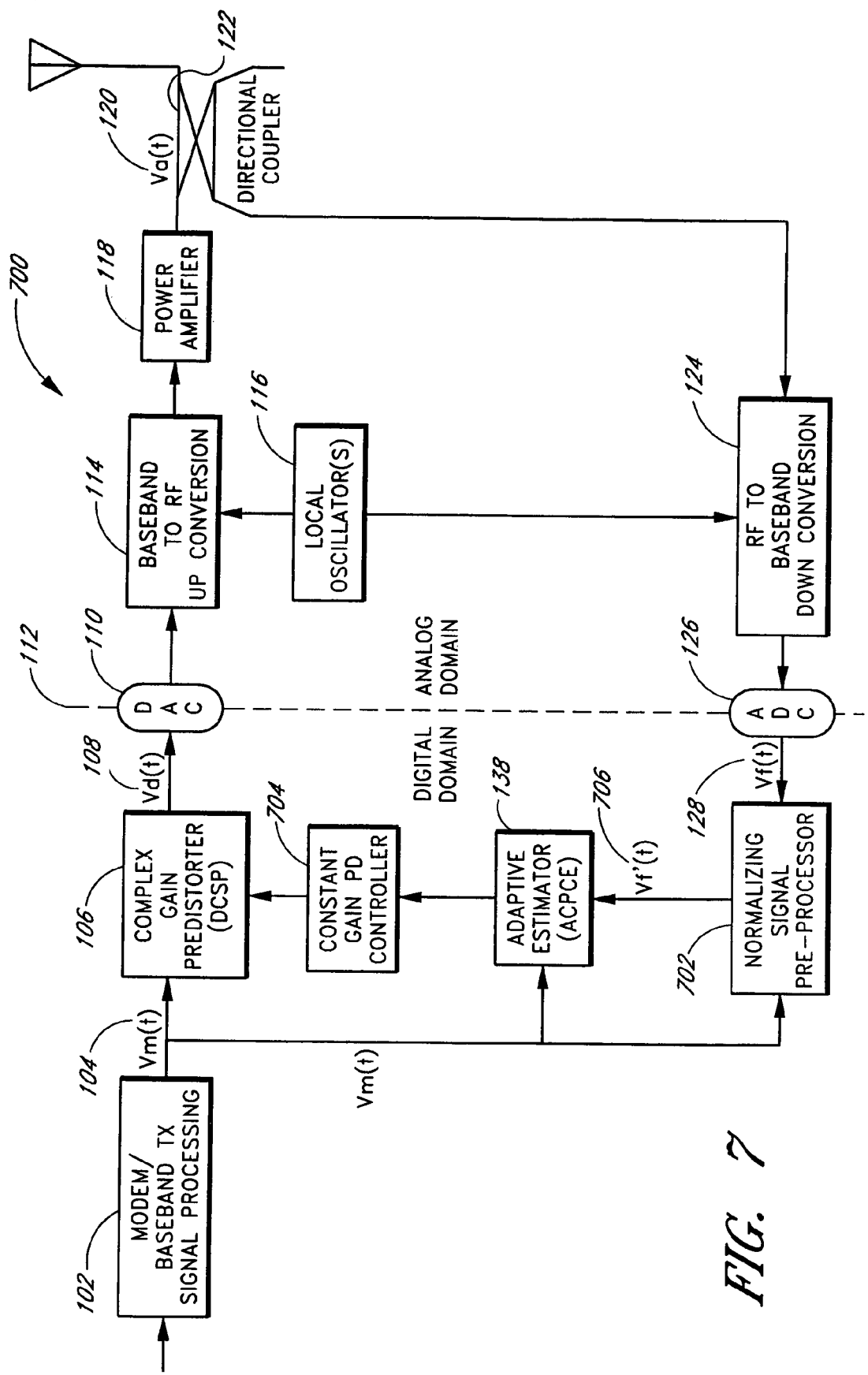
FIG. 7 illustrates a constant gain predistortion controller according to one embodiment of the invention.

FIG. 7 illustrates a constant gain predistortion system 700 according to one embodiment of the invention. A conventional predistortion system that is representative of the state of the art was described earlier in connection with FIG. 1. The constant gain predistortion system 700 illustrated in FIG. 7 advantageously augments the representative predistortion system described earlier in connection with FIG. 1 with two novel additional signal processing blocks to achieve constant gain operation. While illustrated in contrast to the adaptive linearization circuit 100 of FIG. 1, the skilled artisan will appreciate that the principles and advantages described herein are applicable to other configurations of predistortion systems. For example, embodiments of the invention include those configurations in which the constant gain predistortion circuitry is integrated with the RF power amplifier, as well as those configurations in which portions of the constant gain predistortion circuitry interface with other RF power amplifier components, such as through an existing or conventional predistortion circuit.

The adaptive linearization circuit 100, which was described in greater detail earlier in connection with FIG. 1, will be utilized for comparison. The complex gain predistorter (DCSP) 106 or digital compensation signal processor (DCSP) operates on the real-time data flow from the transmit modem 102 and typically operates at 4 to 16 times the input signal bandwidth. The adaptive estimator or adaptation control and processing compensation engine (ACPCE) 130 is often, but not necessarily so, a non-real-time process that operates on previously captured data sets. The ACPCE 130 compares at least a portion of the reference signal $V_m(t)$ 104 with the observed signal $V_f(t)$ 128, which is derived from the actual output signal $V_a(t)$ 120 to compute optimized predistortion coefficients, which are loaded to the complex gain predistorter (DCSP) 106 or digital compensation signal processing engine. The ACPCE 130 may be embodied as a software process running on a dedicated processor, such as a DSP or microprocessor, or as a hardware specific circuit.

The constant gain predistortion system 700 illustrated in FIG. 7 includes a normalizing signal pre-processor 702, a constant gain predistortion controller 704, and additional processes. The normalizing signal pre-processor 702, the constant gain predistortion controller 704, and the associated processes isolate a coupled inner predistortion control loop 708 and an outer RRME power control loop (external to the circuit illustrated in FIG. 7) into two relatively independent processes with relatively little interaction. Advantageously, this isolation permits unconditionally stable operation to be achieved.

The constant gain approach relinquishes responsibility for absolute power control to an external or outer RRME power control loop. One example of an external or outer RRME power control loop was described earlier in connection with FIG. 5 as the outer RRME power control loop 514. To compliment this responsibility for absolute power control, the coupled inner predistortion control loop 708 is configured to correct for "relative" non-linear variations of the power amplifier 118 about a reference linear response to achieve a linear response from the composite response of the complex gain predistorter (DCSP) 106 and the power amplifier 118, both of which are non-linear. It will be understood that the absolute gradient of the resulting linear response can be selected within a very broad range because the external or outer RRME power control loop can compensate within a broad range. For example, if the overall gain is set low, the RRME power control loop can compensate for this condition by increasing drive level. Similarly, if the resultant gain is set high, then the external or outer RRME power control loop can compensate by decreasing drive level. The circuit illustrated in FIG. 7 stabilizes and reduces variation in the characteristic of the complex gain predistorter (DCSP) 106 or digital predistortion entity in response to external variations in the analog circuitry, such as the power amplifier 118, that may arise due to thermal drift, aging variations, and the like.

In one example, an existing predistortion system can be modified to a constant gain predistortion system by incorporating a signal pre-processing step and a predistortion coefficient post-processing step. Either or both of the signal pre-processing step and the predistortion coefficient post processing step can be embodied as processes in software or as hardware circuits. The pre-processing step is illustrated in FIG. 7 as the normalizing signal pre-processor 702. One embodiment of the normalizing signal pre-processor 702 will be described in greater detail later in connection with FIG. 8A. The post-processing step is illustrated in FIG. 7 as the constant gain predistortion controller 704. One embodiment of the constant gain predistortion controller 704 will be described in greater detail later in connection with FIGS. 13–21. The post-processing or the constant gain predistortion controller 704 examines the predistortion function from the ACPCE 130, manipulates the predistortion function to a manipulated predistorted function, and loads the manipulated predistortion function to the predistortion component of the complex gain predistorter (DCSP) 106. While the constant gain predistortion controller 704 is illustrated in FIG. 7 as a separate block, it will be understood by one of ordinary skill in the art that the constant gain predistortion controller 704 can be integrated with components or functional blocks of the constant gain predistortion system 700. For example, in one embodiment, the constant gain predistortion controller 704 is integrated with components or processes from the ACPCE 130.

In one embodiment, the normalizing signal pre-processor 702 manipulates the predistortion function to reduce or minimize the difference between observed data from the observed signal $V_f(t)$ 128 and reference data from the reference signal $V_m(t)$ 104 on a per data capture basis. One embodiment of the normalizing signal pre-processor 702 performs a linear least square fit between the observed data and the true or reference data, and determines the gain, phase, delay, dc offset and, if appropriate, residual frequency offset between the observed signal $V_f(t)$ 128 and the reference signal $V_m(t)$ 104. It will be understood that the reference signal $V_m(t)$ 104 (or data sample thereof) that is provided as an input to the normalizing signal pre-processor 702 or to the ACPCE 130 can correspond to a time-delayed sample of the reference signal $V_m(t)$ 104 that is provided as an input to the complex gain predistorter (DCSP) 106 in real time. The time delay can be internal or external, in hardware or in software, and at least partially compensates for the delay in the observed signal $V_f(t)$ 128 from the reference signal $V_m(t)$ 104.

Data from the observed signal $V_f(t)$ 128 is then scaled by an appropriate factor to form data for a modified observed signal $V_{f'}(t)$ 706 which is used to reduce or minimize the root mean square (RMS) error between the reference signal $V_m(t)$ 104 and the observed signal $V_f(t)$ 128. The modified observed signal $V_{f'}(t)$ 706 (or corresponding data) is then passed to the ACPCE 130, which can correspond to a conventional adaptive estimator. This pre-processing step advantageously ensures that linear gain variations due to external analog component thermal dependencies is reduced or eliminated from consideration by the coupled inner predistortion control loop 708. Moreover, this pre-processing step still permits the ACPCE 130 to calculate predistortion coefficients, which exhibit a transfer gain that is free to float in any direction in a relatively unconstrained manner.

Undesirably, round-off error in fixed point mathematical processing can generate a slight bias, which if repetitively repeated, could grow (or shrink) without bound. This can lead to massive system instability and should not be permitted. The post-processing performed by the constant gain predistortion controller 704 examines the predistortion coefficients or predistortion function prior to the loading of the coefficients to the complex gain predistorter (DCSP) 106 or real-time predistortion component. Advantageously, the constant gain predistortion controller 704 fixes or anchors the apparent predistortion system gain to advantageously achieve unconditional system stability. This approach also advantageously permits stable operation to be secured even when the outer RRME power control loop 514 directs operation to occur within the region of unrealizable system gain 666.

Normalizing Signal Pre-Processor 702

Constant gain operation is achieved by the utilization of two processes. The first is the normalization of the observed signal $V_f(t)$ 128 to the reference signal $V_m(t)$ 104. Normalization refers to the scaling of the magnitude of the observed signal $V_f(t)$ 128 such that after normalization, the magnitude of the observed signal $V_f(t)$ 128 and the magnitude of the reference signal $V_m(t)$ 104 maintain a relatively constant ratio. For example, the relatively constant ratio can be 1:1 such that the magnitude of the observed signal $V_f(t)$ 128 and the magnitude of the reference signal $V_m(t)$ 104 are about the same. It will be understood however, that the ratio can be selected in a broad range. This process is undertaken to ensure that the predistortion characteristic calculated by the ACPCE 130 results in a relatively low and preferably minimum departure from a linear response. The normalizing signal pre-processor 702 can be implemented in dedicated hardware, in the form of software that runs on a digital signal processor or a microprocessor, or a combination thereof. Equation 10 expresses an objective for the normalizing signal pre-processor 702. In one embodiment, the normalizing signal pre-processor 702 finds the linear complex gain (amplitude gain and phase rotation), time/delay shift, and dc offset that, when applied to the observed signal $V_f(t)$ 128 to create the modified observed signal $V_{f'}(t)$ 706 reduces and preferably minimizes the overall error between the reference signal $V_m(t)$ 104 and the modified observed signal $V_{f'}(t)$ 706 in some least mean square sense.

$$e = \sum (V_m(t) - V_f(t)\alpha e^{j(\omega t + \phi)}\delta(t - \tau) - V_{DC}) \qquad \text{(Eq. 10)}$$

In Equation 10, $V_m(t)$ corresponds to the reference signal $V_m(t)$ 104, $V_f(t)$ corresponds to the observed signal $V_f(t)$ 128, and the summation indicates that the error, e, is computed by examining a fixed window in time of the signal samples or signal waveform. Once the amplitude gain $\alpha$, phase offset $\phi$, delay shift $\tau$, complex DC level $V_{DC}$, and, where desired, frequency offset $\omega$, have been computed to reduce or to minimize this error, then these values can be utilized in normalizing the observed signal $V_f(t)$ 128 before the observed signal $V_f(t)$ 128, or sample thereof, is provided to the ACPCE 130 or adaptive predistortion engine as the modified observed signal $V_{f'}(t)$ 706. In one embodiment, Equation 11 can be utilized to compute the modified observed signal $V_{f'}(t)$ 706, which is then passed to the predistortion adaptation engine.

$$V_{f'} = V_f(t)\alpha e^{j(\omega t + \phi)}\delta(t-\tau) - V_{DC} \qquad \text{(Eq. 11)}$$

A calculation according to Equation 11 normalizes the modified observed signal $V_{f'}(t)$ 706. Computation of the normalization parameters can be achieved by using a variety of numerical algorithms and circuits. For example, least mean square (LMS), Kalman filtering, recursive least square (RLS), vector projection, or one of a plethora of gradient search cost function minimization techniques can be used. The selection of the specific algorithm is not critical, as many algorithms will generate a set of parameters that can be employed in normalizing the observed signal. In one embodiment, the system employs an LMS, an RLS/Kalman, or a vector projection algorithm for implementation simplicity.

One embodiment of the normalizing signal pre-processor 702 forms the modified observed signal $V_f(t)$ 706 such that the modified observed signal $V_f(t)$ 706 has linear DC, gain, phase, frequency and time displacement offsets removed when compared to the reference signal $V_m(t)$ 104. It will be understood that in another embodiment, the normalizing signal pre-processor 702 can process the modified observed signal $V_f(t)$ 706 with fewer than or with more than the mathematical operations described later in connection with FIGS. 8A and 8B. When generating the modified observed signal $V_f(t)$ 706, the normalizing signal pre-processor 702 should not alter the spectral content of the observed signal $V_f(t)$ 128. The retention of the purity of the original spectral content should be carefully observed when a finite impulse response (FIR) filter is used to implement a time-shifting filter, such as a time-shifting interpolation finite impulse response (FIR) filter 814 that will be described later in connection with FIG. 8A. The normalizing signal pre-processor 702, whether implemented in hardware, software, or a combination of both, should be configured such that minimal spectral impairment is introduced to the modified observed signal $V_f(t)$ 706.

Figure 8A:
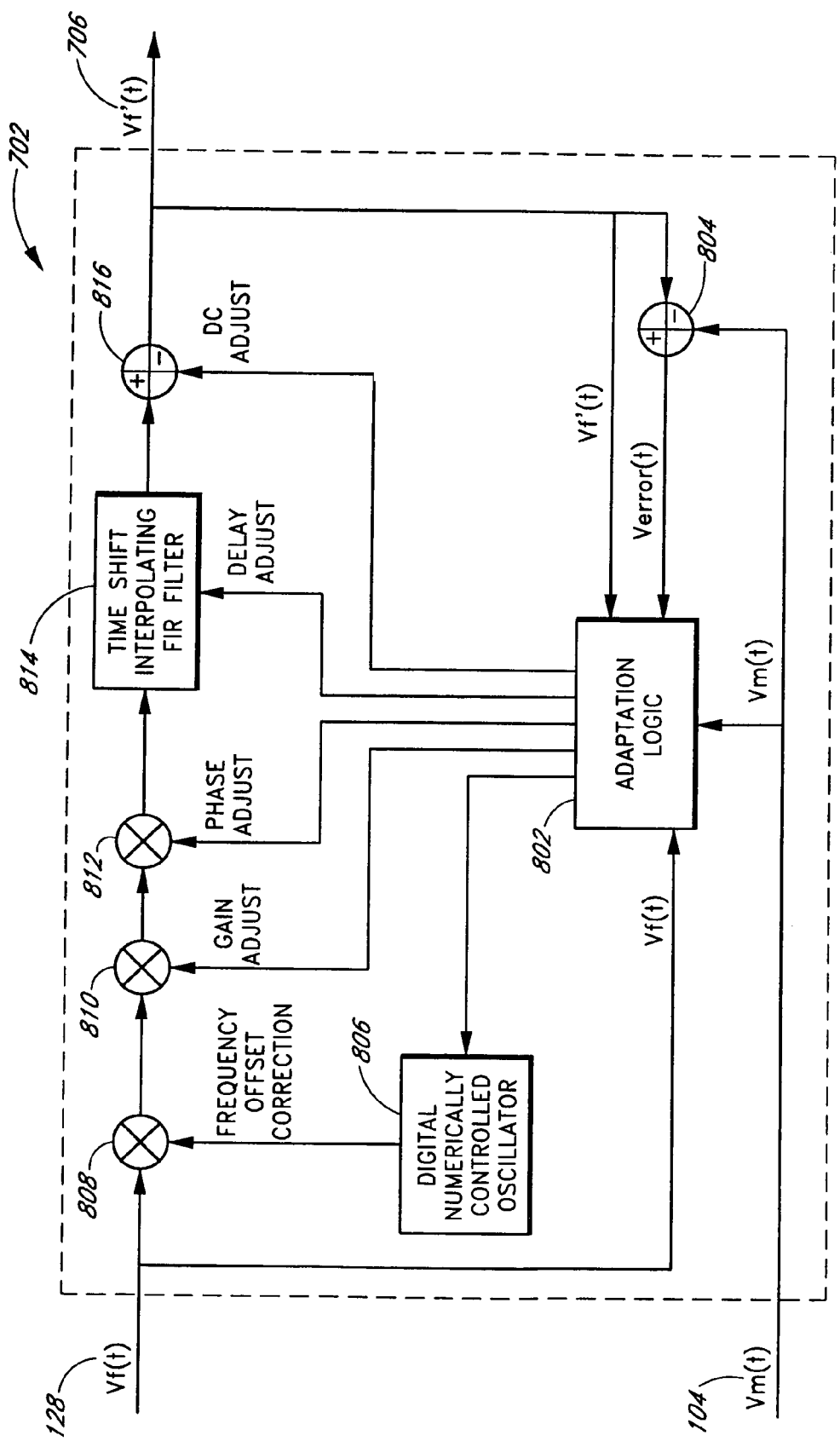
FIG. 8A illustrates a normalizing signal pre-processor according to one embodiment of the invention.
Figure 8B:
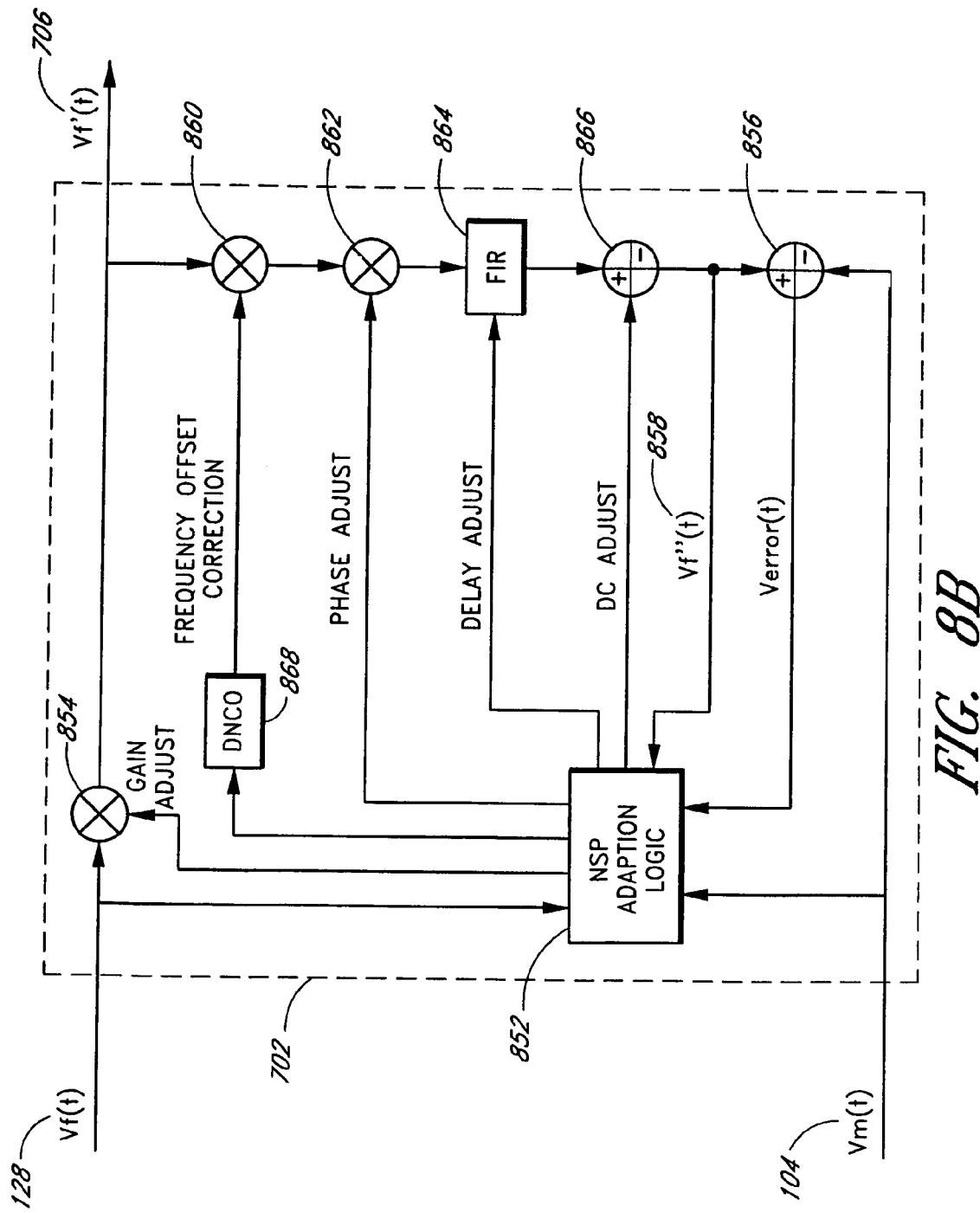
FIG. 8B illustrates a normalizing signal pre-processor according to another embodiment of the invention.

FIGS. 8A and 8B illustrate further details of hardware circuit examples of the normalizing signal pre-processor 702. Those skilled in the art will recognize that this circuit can be constructed in an almost infinite number of variations, using digital signal processing hardware circuits, software processes, or a combination of both. The skilled practitioner will also appreciate that the signal processing within the normalizing signal pre-processor 702 can be applied in a variety of sequences or orders, and that except for the gain adjustment, the signal processing can be applied to the data stream associated with either the reference signal $V_m(t)$ 104 or the observed signal $V_f(t)$ 128. The normalizing signal pre-processor 702 advantageously normalizes data prior to adaptation by the ACPCE 130. An adaptation logic 802 controls the operation of the normalizing signal pre-processor 702.

The adaptation logic 802 computes the frequency offset, amplitude, phase delay and DC offset parameters that are applied by other components or modules of the normalizing signal pre-processor 702 to normalize the observed signal $V_f(t)$ 128. A variety of techniques can be used to implement the adaptation logic 802. For example, the adaptation logic 802 can correspond to a collection of simple direct proportional control loops and LMS algorithms running in dedicated hardware circuits. In another example, the adaptation logic 802 can correspond to an adaptation process that is executed by a processor, such as a microprocessor, a microcontroller, or a general-purpose digital signal processor.

The illustrated normalizing signal pre-processor 702 includes a data flow in which an input signal stream to the normalizing signal pre-processor 702 corresponds to the observed signal $V_f(t)$ 128. The observed signal $V_f(t)$ 128 is manipulated by the various stages of the normalizing signal pre-processor 702 to generate the modified observed signal $V_f(t)$ 706. It will be understood that the manipulation of the observed signal $V_f(t)$ 128 by the normalizing signal pre-processor 702 can be performed in non-real time and that the observed signal $V_f(t)$ 128 and the reference signal $V_m(t)$ 104 inputs to the normalizing signal pre-processor 702 can correspond to data retrieved from memory. The term "input signal stream" will be used in connection with FIG. 8A to describe the manipulation of the observed signal $V_f(t)$ 128 to the modified observed signal $V_f(t)$ 706 or to describe the manipulation of the corresponding data.

In the illustrated embodiment of the normalizing signal pre-processor 702, the observed signal $V_f(t)$ 128 is provided as the input signal stream, and the input signal stream flows through the following blocks: a first multiplication stage 808, a second multiplication stage 810, a third multiplication stage 812, the time-shifting interpolation FIR filter 814, and a first subtraction stage 816. It will be understood by one of ordinary skill in the art that the various blocks of the normalizing signal pre-processor 702 can be combined or integrated, and that the order in which a block processes the input signal stream in the data flow can be varied. It will further be understood that another embodiment can include fewer processing blocks or more processing blocks than the embodiments illustrated in FIGS. 8A and 8B. For example, in one alternate embodiment of the normalizing signal pre-processor 702, only the second multiplication stage 810 for gain adjustment is present in the forward signal path.

The input signal stream is provided as an input to the first multiplication stage 808 and is multiplied with the output of a digital numerical controlled oscillator 806. The frequency of the output of the digital numerical controlled oscillator 806 is selected by the adaptation logic 802 to substantially eliminate a frequency offset between the reference signal $V_m(t)$ 104 and the output of the normalizing signal pre-processor 702, which is the modified observed signal $V_f(t)$ 706. The output of the first multiplication stage 808 is provided as an input to the second multiplication stage 810, which adjusts the gain of the input signal stream to reduce or substantially eliminate a difference in amplitude between the reference signal $V_m(t)$ 104 and the modified observed signal $V_f(t)$ 706. The output of the second multiplication stage 810 is provided as an input to the third multiplication stage 812. The third multiplication stage 812 shifts the phase of the input signal stream to reduce or substantially eliminate the absolute phase differences between the reference signal $V_m(t)$ 104 and the modified observed signal $V_f(t)$ 706.

The output of the third multiplication stage 812 is provided as an input to the time-shifting interpolation FIR filter 814. The time-shifting interpolation FIR filter 814 aligns the input signal stream such that the modified observed signal $V_f(t)$ 706 and the reference signal $V_m(t)$ 104 are preferably aligned to the nearest fractions of a sampling duration. In one embodiment, the time-shifting interpolation FIR filter 814 corresponds to an oversampling filter with a pipeline of data registers that permits the selection of a sample of the modified observed signal $V_f(t)$ 706 at the fraction of the sampling duration. For example, an oversampling filter of 2X or 4X can provide additional samples at fractions of one-half and one-quarter, respectively.

The time-shifting interpolation FIR filter 814 is preferably configured such that it does not affect the spectral content of the observed waveform. Thus, the amplitude, phase and roll off characteristics of the time-shifting interpolation FIR filter 814 should be carefully selected. The first subtraction stage 816 removes a residual DC (complex) from the input signal stream to reduce or eliminate the offset difference between the reference signal $V_m(t)$ 104 and the modified observed signal $V_f(t)$ 706. The modified observed signal $V_f(t)$ 706 and the reference signal $V_m(t)$ 104 are provided as inputs to a second subtraction stage 804 to provide the adaptation logic 802 with a feedback of the DC offset difference between the two signals, such that the adaptation logic 802 can adjust the offset removed by the first subtraction stage 816. Advantageously, the modified observed signal $V_f(t)$ 706 is relatively free from linear differences and is effectively normalized as it egresses to the next stage of the constant gain predistortion system 700.

FIG. 8B illustrates another embodiment of the normalizing signal pre-processor 702. The skilled practitioner will appreciate that the signal processing within the normalizing signal pre-processor 702 described in FIG. 8B can be applied in a variety of sequences or orders, and that except for the gain adjustment, the signal processing can be applied to the data stream associated with either the reference signal $V_m(t)$ 104 or the observed signal $V_f(t)$ 128. In addition, the normalizing signal pre-processor 702 can be configured with fewer than all of the signal processing blocks described or even with additional signal processing blocks. The normalizing signal pre-processor 702 advantageously normalizes data prior to adaptation by the ACPCE 130.

An NSP adaptation logic 852 controls the operation of the normalizing signal pre-processor 702. The NSP adaptation logic 852 can perform, for example, a least mean square (LMS) computation to process the observed signal $V_f(t)$ 128 to the modified observed signal $V_{f'}(t)$ 706 such that the modified observed signal $V_{f'}(t)$ 706 is normalized to the reference signal $V_m(t)$ 104.

In the illustrated normalizing signal pre-processor 702 of FIG. 8B, the observed signal $V_f(t)$ 128 is provided as an input to the NSP adaptation logic 852 and to a gain adjust multiplier 854. The gain adjust multiplier 854 scales the magnitude of the modified observed signal $V_{f'}(t)$ 706 in response to a gain adjust control from the NSP adaptation logic 852 such that the modified observed signal $V_{f'}(t)$ 706 is normalized in magnitude relative to the reference signal $V_m(t)$ 104.

The NSP adaptation logic 852 selects the appropriate gain adjustment at least partially in response to an error signal $V_{error}(t)$ provided by a subtraction circuit 856. The subtraction circuit 856 provides the error signal $V_{error}(t)$ by comparing the reference signal $V_m(t)$ 104 to the modified observed signal $V_{f'}(t)$ 706 or to a processed modified observed signal $V_{f''}(t)$ 858. For example, the illustrated normalizing signal pre-processor 702 of FIG. 8B can further process the modified observed signal $V_{f'}(t)$ 706 with a frequency offset correction circuit 860, a phase adjustment circuit 862, a delay adjustment circuit 864, and a DC adjustment circuit 866 to generate the processed modified observed signal $V_{f''}(t)$ 858.

In the illustrated embodiment of the normalizing signal pre-processor 702 of FIG. 8B, the NSP adaptation logic 852 provides updates to a digital numerically controlled oscillator 868, which is coupled to the frequency offset correction circuit 860. The frequency offset correction circuit 860 is configured to remove or reduce a frequency offset between the processed modified observed signal $V_{f''}(t)$ 858 and the reference signal $V_m(t)$.

Similarly, the NSP adaptation logic 852 can provide control inputs to the phase adjustment circuit 862, the delay adjustment circuit 864, and the DC adjustment circuit 866. The additional processing to the processed modified observed signal $V_{f''}(t)$ 858 can improve the accuracy by which the modified observed signal $V_{f'}(t)$ 706 is normalized with respect to the reference signal $V_m(t)$ 104. In one embodiment, the frequency offset correction circuit 860 and the phase adjustment circuit 862 can correspond to multiplier circuits, the DC adjustment circuit 866 can correspond to a subtraction circuit. and the delay adjustment circuit 864 can correspond to a finite impulse response (FIR) filter. The FIR filter can be used to align the processed modified observed signal $V_{f''}(t)$ 858 and the reference signal $V_m(t)$ 104 to a fraction of a sample period.

It will be appreciated by one of ordinary skill in the art that hardware circuits can implement a variety of numerical algorithms that are useful in normalizing signals, including algorithms such as recursive least square (RLS), Kalman filter, and vector projection approaches. However, it should be noted that even these more numerically intensive approaches can be resolved relatively easily by a microprocessor that is configured to execute the appropriate software or firmware.

Figure 9:
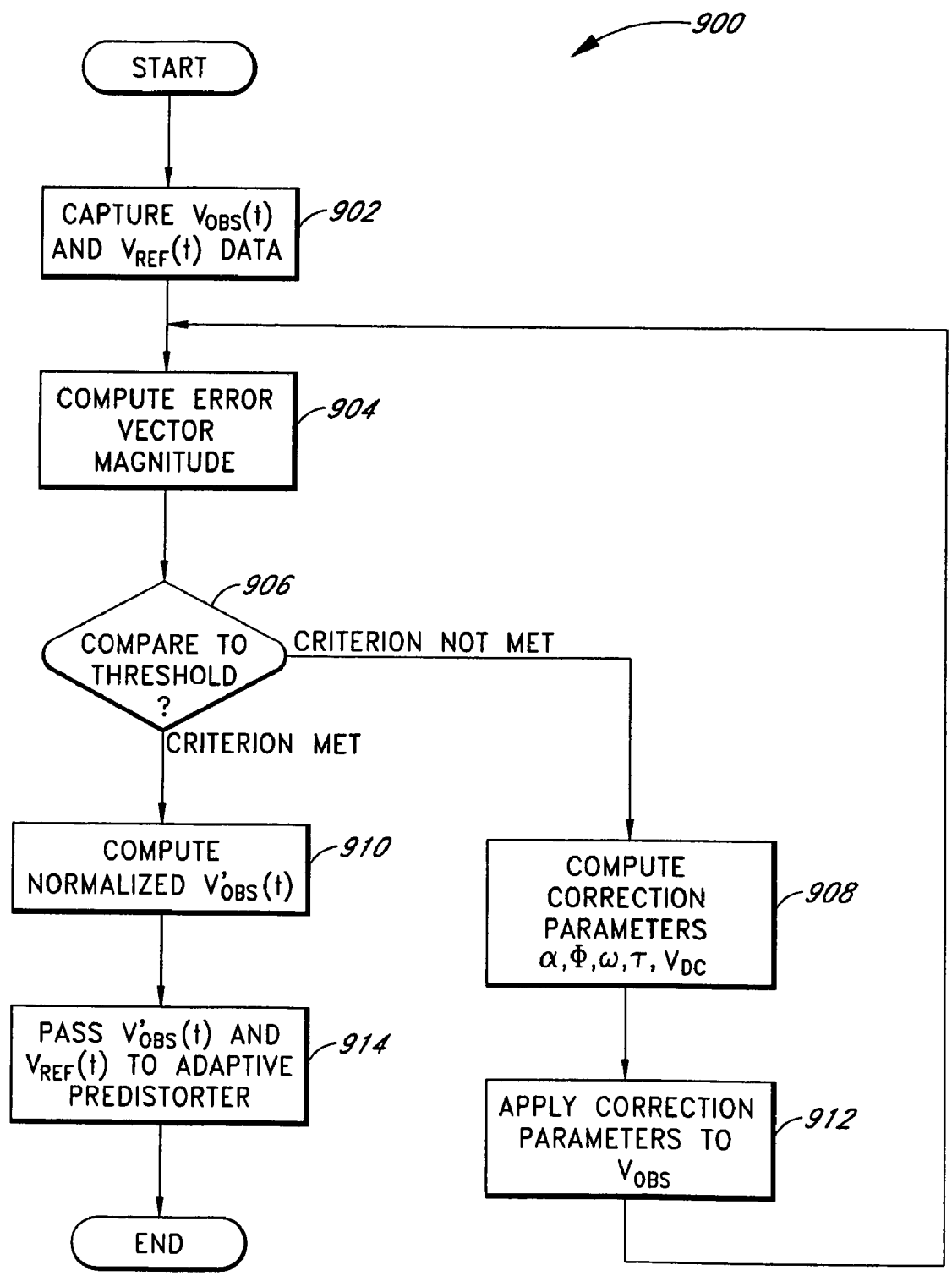
FIG. 9 is a flowchart generally illustrating a process of normalizing an observed signal according to one embodiment of the invention.

FIG. 9 is a flowchart 900 generally illustrating a process of normalizing an observed signal according to one embodiment of the invention. Advantageously, at least a portion of the illustrated process can be implemented in software or firmware. A software embodiment of the normalizing signal pre-processor 702 may be preferred from a cost perspective. This may be particularly true in non-real-time adaptive predistortion designs where a general purpose digital signal processor (DSP) or a microprocessor is already present in a predistortion system.

The normalizing process begins at a first state 902. In the first state 902, observed data from the observed signal $V_f(t)$ 128 and reference data from the reference signal $V_m(t)$ 104 is captured and stored in, for example, a memory device. It will be understood that the portions of the data captured should correspond to the same portions of original data, i.e., the same symbols. The process advances from the first state 902 to a second state 904.

In the second state 904, the process determines an error vector magnitude. The error vector magnitude corresponds to the difference in magnitude or integrated/summed error between the reference data from the reference signal $V_m(t)$ 104 and observed data from the observed signal $V_f(t)$ 128. The observed data can correspond to the observed data captured in the first state 902, as well as to modified data, as will be described in greater detail later in connection with a third state 908 and a fourth state 912. The process advances from the second state 904 to a decision block 906.

In the decision block 906, the process determines whether or not the observed data is normalized based on the error vector magnitude computed in the second state 904. In one embodiment, the error vector magnitude computed in the second state 904 is compared to a predetermined threshold. The predetermined threshold can be selected such that when the error vector magnitude is less than the predetermined threshold, the observed signal $V_f(t)$ 128 is considered normalized. The process proceeds from the decision block 906 to the third state 908 if the observed data is not normalized. The process proceeds from the decision block 906 to a fifth state 914 if the observed data is normalized.

In the third state 908, the frequency offset ($\omega$), time delay ($\tau$), gain ($\alpha$), phase offsets ($\phi$) and complex DC level ($V_{DC}$) offset correction parameters are computed. These correction parameters are calculated to reduce the error vector magnitude between the reference data and the observed data when applied via appropriate signal processes to modify the observed data. A broad variety of computation methods can be used in the third state 908 to compute the frequency offset, time delay, gain, phase offsets, and complex DC level ($V_{DC}$) offset that are present between the reference data and the observed data. As described earlier in connection with FIG. 8A, least mean square (LMS), recursive least square (RLS), Kalman filtering, vector projection, frequency discrimination, complex correlation, as well as a host of alternate techniques familiar to those skilled in the art of signal processing can be used to extract values for these parameters. The process advances from the third state 908 to the fourth state 912.

In the fourth state 912, the process applies the correction parameters computed in the third state 908 to modify the observed data. The modification to the observed data can result in the normalization of such data. The process then returns from the fourth state 912 to the second state 904, and the process recalculates the error vector magnitude for the modified observed data. In one embodiment, the process can iterate through the second state 904, the decision block 906, the third state 908, and the fourth state 912 as necessary, until the error vector magnitude is below the predetermined threshold. It will also be apparent to one of ordinary skill in the art that the process can also include looping limits to prevent infinite loops.

In the fifth state 914, the observed data and the corresponding reference data are provided to the ACPCE 130 or other adaptive predistortion engine. It will be appreciated that the observed data can correspond to modified observed data or to unmodified observed data, as appropriate. The process then ends and waits for a new set of data to be readied before the process is reinitiated.

Figure 10:
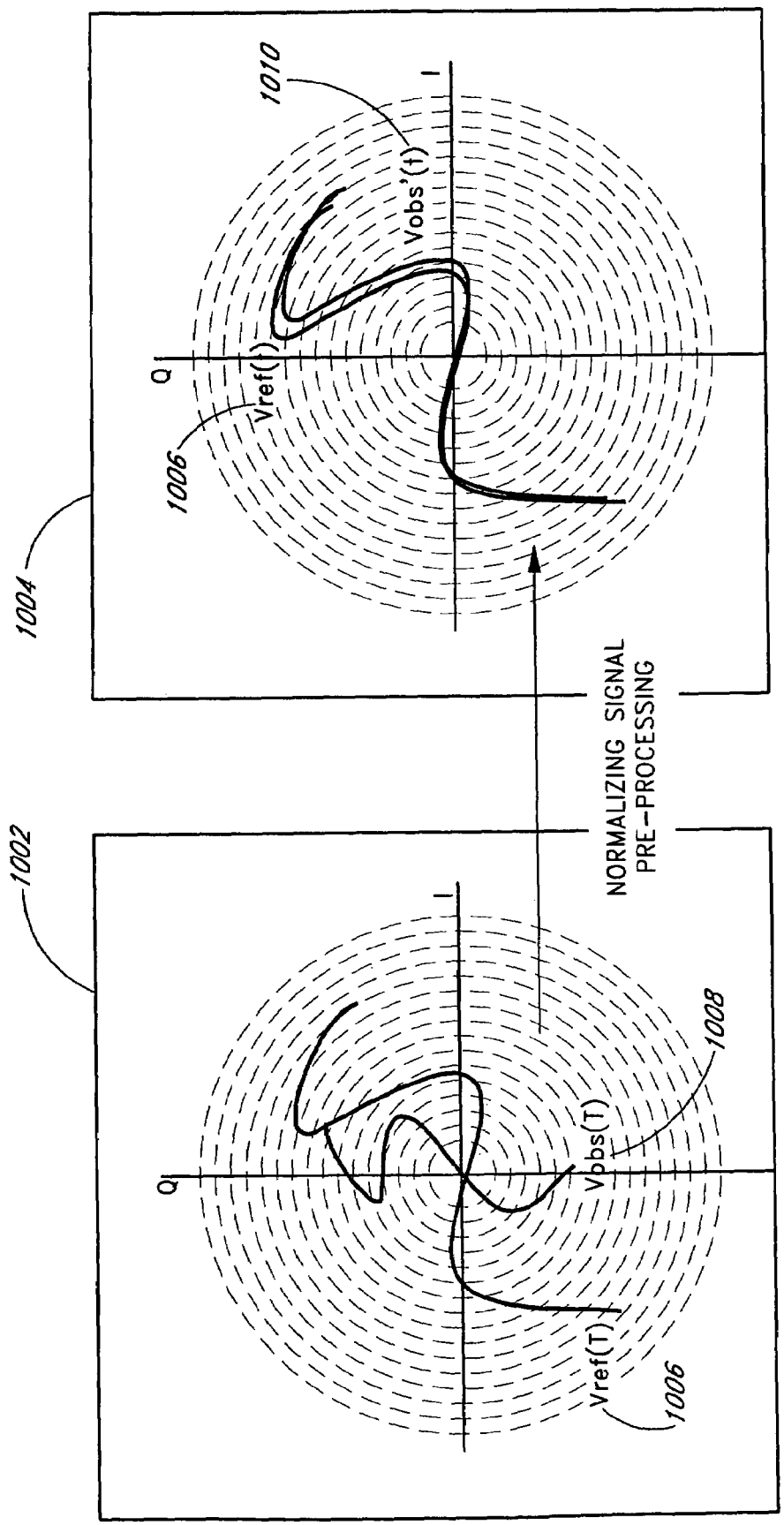
FIG. 10 illustrates an example of the effect of normalizing signal pre-processing.

FIG. 10 illustrates an example of the effect of normalizing signal pre-processing. The normalizing signal processing can be performed in hardware by a normalizing signal pre-processor as described earlier in connection with FIG. 8A or by software as described earlier in connection with FIG. 9.

A first diagram 1002 of FIG. 10 illustrates a demonstrative comparison between a portion 1006 of the reference signal and a corresponding portion 1008 of the raw (unprocessed) observed signal. As illustrated by the first diagram 1002, time delay offset, frequency offset, gain scaling, phase rotation and DC offsets are present between the portion 1006 of the reference signal and the corresponding portion 1008 of the raw observed signal.

A second diagram 1004 in FIG. 10 illustrates a demonstrative comparison between the portion 1006 of the reference signal and a portion 1010 of the modified observed signal, as modified by normalizing signal pre-processing operations. As illustrated by the second diagram 1004, the normalizing signal pre-processing advantageously pre-aligns the portion 1006 of the reference signal and the portion 1010 of the normalized observed signal. The aligned portion 1006 of the reference signal and the portion 1010 of the normalized observed signal are then passed to the adaptive predistortion entity or the ACPCE 130. Beneficially, the normalizing signal pre-processing illustrated in FIG. 8A and FIG. 9 can also permit the adaptive predistortion engine or the ACPCE 130 to perform less work. This can beneficially reduce the loading on an associated processor, such as a microprocessor or a general-purpose DSP.

Constant Gain Predistortion Controller 704

Advantageously, invocation of normalizing signal pre-processing can allow the adaptive predistortion component to observe a unity system loop gain. This advantageously eliminates the need for the adaptive predistortion component to control absolute power at the antenna output port. It does, however, come at a cost because the normalizing signal pre-processing (which effectively decouples the inner predistortion loop from interacting with the outer power control loop) permits the adaptive predistortion component to develop or compute a predistortion function that could otherwise be free to float in gain over an unconstrained range. This is of concern because if systematic drift or bias is present in a digital signal processing or external analog element, then the gain of the predistorter may disadvantageously grow or shrink without bound. Undesirably, systemic system failure could occur if the gain becomes sufficiently high that digital saturation and overflow occur, or alternatively, the system gain of the predistortion engine becomes insignificant.

Figure 11:
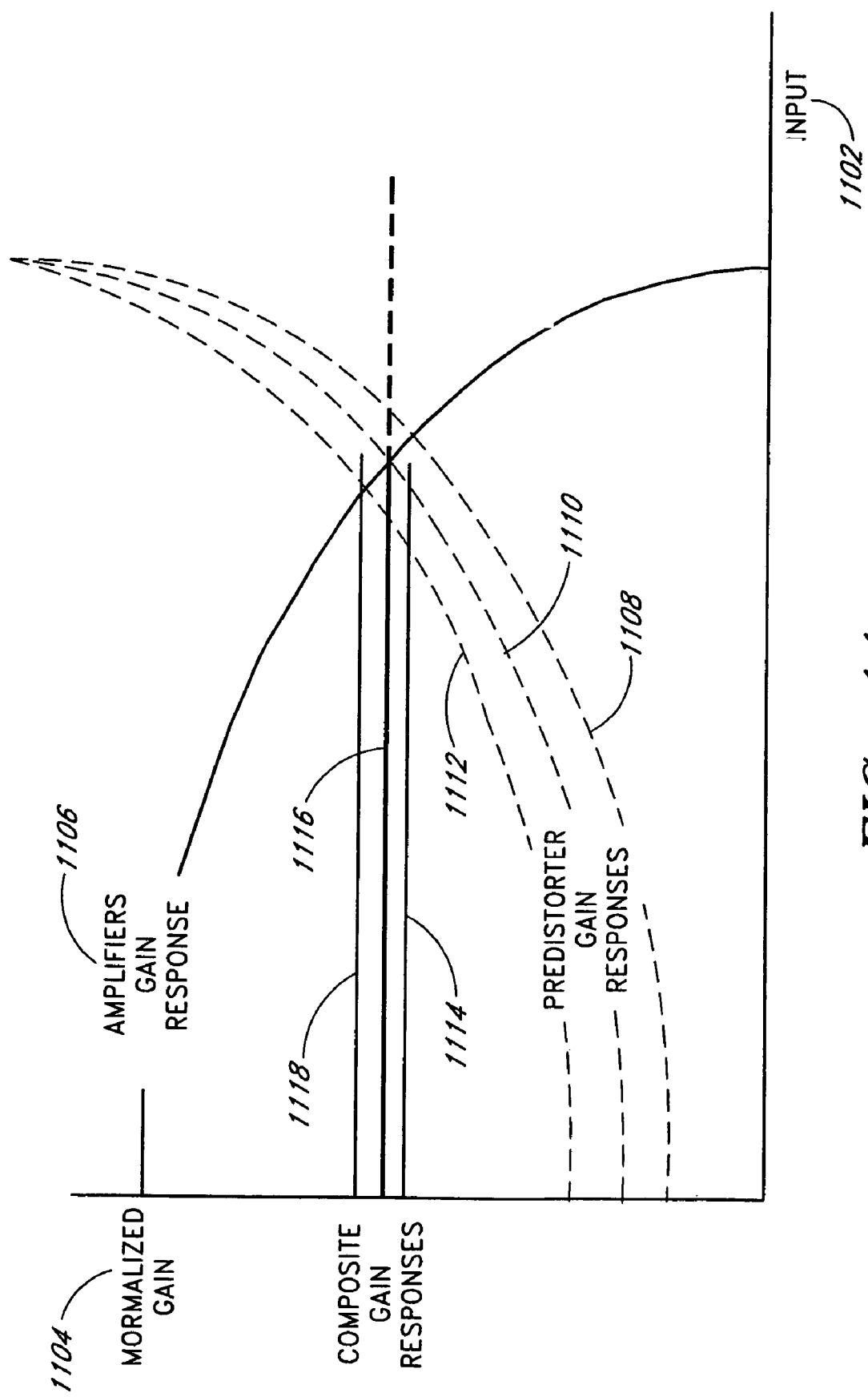
FIG. 11 illustrates variations in predistorter system gain.

FIG. 11 illustrates situations where variations in predistorter system gain result in various composite gain responses. An input level is indicated along a horizontal axis 1102. Normalized gain is indicated along a vertical axis 1104. Illustrated in FIG. 11 include an amplifier's gain response 1106. Also illustrated in FIG. 11 are various gain responses of a predistorter, as shown by a first predistorter gain response 1108, a second predistorter gain response 1110, and a third predistorter gain response 1112. The corresponding composite gain responses include a first composite gain response 1114, a second composite gain response 1116, and a third composite gain response 1118.

These variations in gain responses are not observed by the predistortion component, which advantageously observes a nominal unity gain system response due to the normalizing signal pre-processing that is applied to the observed data or to the observed signal $V_f(t)$ 128. The nominal unity gain system response is exemplified by the second composite gain response 1116. Thus, should a mechanism affect the predistortion component, such that over many iterations, the gain of the predistortion component is subjected to a small and yet consistent bias, then the gain of the predistortion can grow or shrink without bound since the absolute closed loop reference has been broken by the normalizing signal pre-processing.

Thus, to prevent growth or shrinkage without bound, the constant gain predistortion controller 704 advantageously ensures that the gain response of the predistortion component remains relatively fixed or anchored and is not free to drift in an unconstrained manner. This represents a quantum shift in the manner in which a predistortion system is managed or is controlled as when compared to control for a conventional predistortion system.

Figure 12:
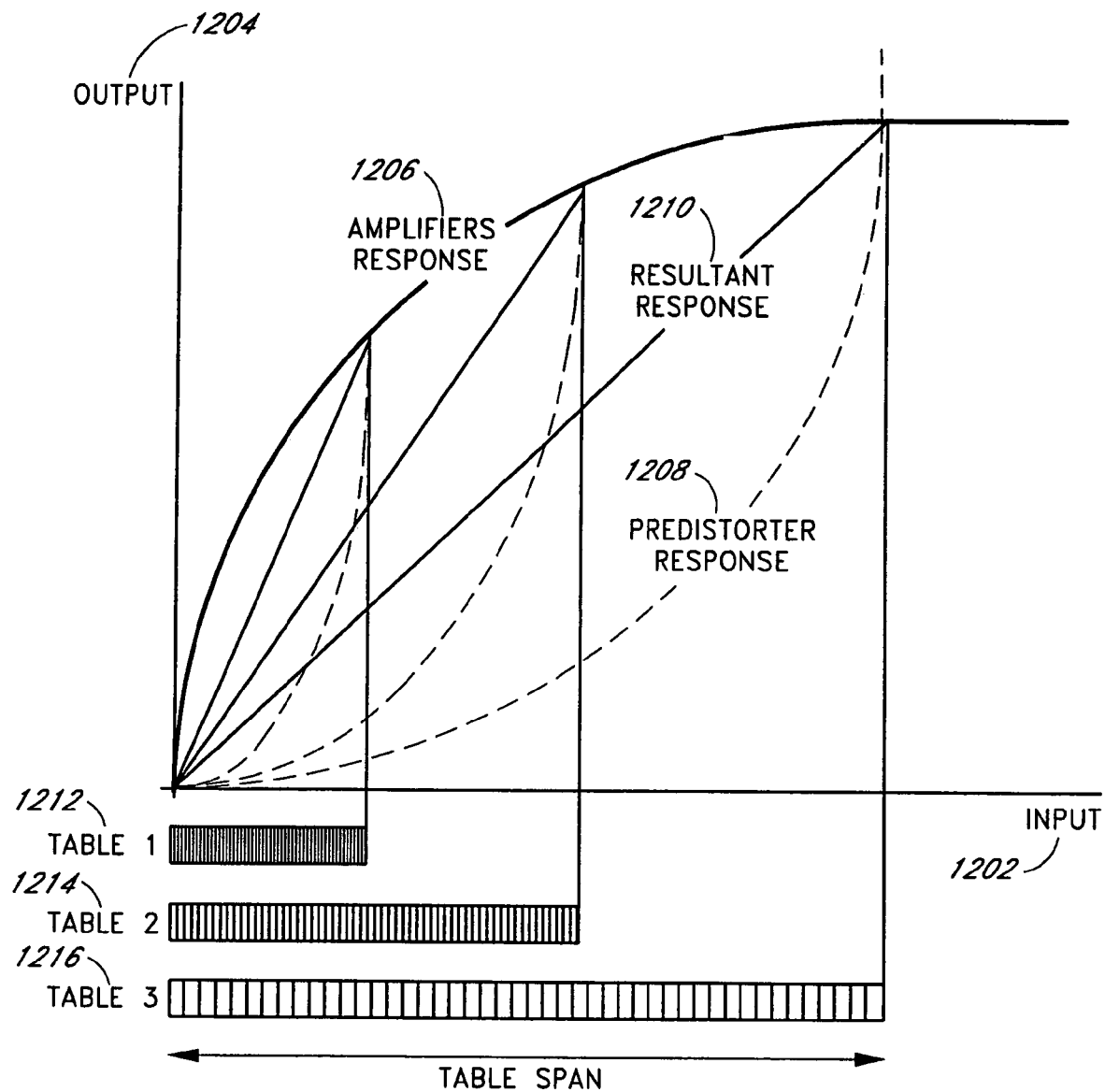
FIG. 12 illustrates system scaling for a lookup table.

FIG. 12 illustrates system scaling for a lookup table for a power amplifier with a conventional predistorter system. An input level is indicated along a horizontal axis 1202. An output level is indicated along a vertical axis 1204. A first curve 1206 represents a power amplifier's response (before linearization). Dashed lines represent examples of a predistorter's response. A first dashed curve 1208 represents a predistortion response for a relatively narrow range of input signal levels. A second dashed curve 1210 represents a predistortion response for a broader range than the range expressed by the first dashed curve 1208. A third dashed curve 1212 represents a predistortion response for a relatively broad input level range.

The composite response of the linearized amplifier is also shown in FIG. 12. A first resultant response line 1214 represents the composite response of the amplifier and the relatively narrow predistortion response, as represented by the first dashed curve 1208. A second resultant response line 1216 represents the composite response of the amplifier and the broader predistortion response, as represented by the second dashed curve 1210. A third resultant response line 1218 represents the composite response of the amplifier and the relatively broad predistortion response, as represented by the third dashed curve 1212.

FIG. 12 also illustrates exemplary table spans corresponding to the predistortion responses for a conventional predistorter configuration. A first table 1220 corresponds to the relatively narrow predistortion response indicated by the first dashed curve 1208. A second table 1222 corresponds to the broader predistortion response indicated by the second dashed curve 1210. A third table 1224 corresponds to the relatively broad predistortion response indicated by the third dashed curve 1212. FIG. 12 illustrates how the contents of a lookup table are scaled in a standard predistorter design such that the input signal's dynamic range spans the table. The maximum entries are scaled against the peak operating power point of the amplifier. As the input signal drives the amplifier to different power levels, the composite system gain disadvantageously changes as the predistorter function is scaled to correct the amplifier's non-linearity. Thus, for example, in an amplifier with a conventional predistorter, the system gain will disadvantageously tend to fall as the average operating power increases.

The anchored constant gain approach obviates these disadvantages. Advantageously, the anchored constant gain approach permits a predistorter's non-linear function to be scaled to span the operating dynamic range of the amplifier, including the region beyond the saturated output power level ($P_{sat}$) of the amplifier, which indicates the onset of the region of unrealizable system gain.

Constant Gain Controller

FIG. 13 illustrates system scaling for a lookup table for a power amplifier with a predistorter system according to an embodiment of the invention. A horizontal axis 1302 of an upper diagram indicates an input level. A vertical axis 1304 of the upper diagram indicates an output response level. A first family of curves 1306 (solid lines) indicates exemplary non-linear amplifier responses. A second family of curves 1308 (dashed lines) indicates exemplary corresponding predistorter system responses. FIG. 13 also illustrates a resultant response 1310, i.e., a composite of an amplifier response and a predistorter response. A vertical line 1312 separates a region of realizable system gain from a region of unrealizable system gain 1314. A table 1316 indicates a span of the lookup table for the predistorter system.

A lower diagram of FIG. 13 illustrates how a predistortion system can be reconfigured such that a predistortion function can advantageously span the amplifier's entire operating range, including overdrive into the region of unrealizable system gain 1314. FIG. 13 illustrates an exemplary amplifier gain response 1322, exemplary predistorter gain responses 1324, and a composite system response 1326 versus an input signal level, which is indicated along a horizontal axis 1320.

FIG. 13 also demonstrates that, as the average operating power changes and different predistortion functions are computed to counter the effective changes in the amplifier's non-linearity, the system gain of the predistorter can advantageously remain constant. As illustrated in the lower diagram of FIG. 13, this is achieved by selecting a region of the predistorter's non-linear characteristic and anchoring or locking a selected region 1328 to an absolute value, while allowing the characteristic of the predistorter to float outside this region.

Advantageously, even though the selected region 1328 is locked or anchored, the remaining regions of the predistorter gain response will, by the default operation of the adaptation component, remain piece-wise smooth and continuous with the selected region 1328. The locking or anchoring of the selected region 1328 can advantageously ensure that the non-linear gain characteristic of the predistorter is not free to float in an unconstrained manner. FIG. 13 also illustrates that the predistorter function is partitioned into a region of gain compression 1330 and a region of gain expansion 1332. Typically, the response of an amplifier will require up to 3 dB of gain expansion in the predistorter before the region of unrealizable system gain 1314 is encountered. In one embodiment, the gain anchoring function can be set such that the predistortion function exhibits −3 dB of gain at the anchor point, thereby allowing room for the subsequent expansion. In one embodiment, the constant gain controller product includes a selectable anchor gain, which allows for a range of amplifier responses to be compensated without unduly sacrificing digital headroom.

Thus, the constant gain predistortion controller should identify and set an anchored gain region, set and maintain the gain of the anchored region while maintaining a piece wise linear/smooth predistortion function, and constrain the predistortion function if operation within the region of unrealizable system gain is encountered.

Depending upon the application, the operation of the constant gain predistortion controller need not be embodied as a real-time process. Thus, the constant gain predistortion controller can advantageously be embodied in software executed by, for example, a DSP processor, as described in further detail later in connection with FIG. 14. However, where alternate embodiments require real-time operation, such real-time operation can be implemented by hardware circuits.

Exemplary Software Embodiment of Constant Gain Control

Figure 14:
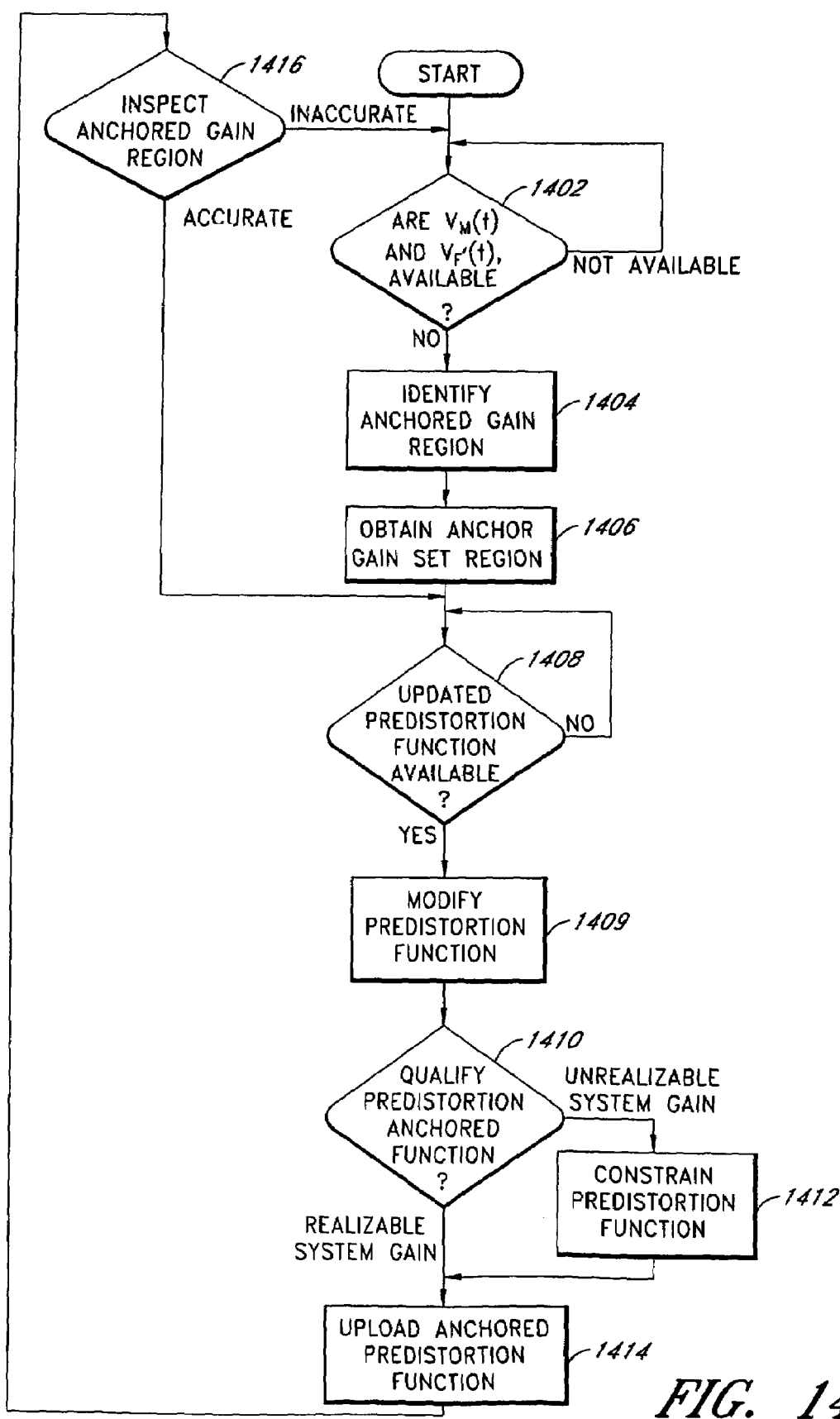
FIG. 14 is a flowchart that generally illustrates a constant gain controller process.

FIG. 14 is a flowchart that generally illustrates a control flow of a process for constant gain control. In one embodiment, a process for constant gain control, as represented in FIG. 7 by the constant gain predistortion controller 704, is advantageously integrated with a process for adaptive estimation, as represented in FIG. 7 by the ACPCE 130. The same processor, e.g., the same microprocessor, microcontroller, DSP, and the like, can advantageously execute both processes or a single integrated process, which permits data to be advantageously shared between processes.

The constant gain control (CGC) process begins at a first decision block 1402. In the first decision block 1402, the CGC process determines whether data corresponding to the reference signal $V_m(t)$ 104 and to the modified observed signal $V_f(t)$ 706 is available. It will be understood that this data can be captured and stored in a memory device, such as RAM. If the requisite data is not available, the CGC process waits for the data to become available, as illustrated by the loop back to the first decision block 1402. The CGC process proceeds from the first decision block 1402 to a first state 1404 when data corresponding to the reference signal $V_m(t)$ 104 and data corresponding to the modified observed signal $V_f(t)$ 706 are available.

In the first state 1404, the CGC process identifies the region of the predistortion function that should be anchored to a fixed gain. Identification of the anchored gain region is described in greater detail later in connection with FIG. 15 and FIG. 16. Upon successful identification of the anchored gain region of the predistortion function, the CGC process advances from the first state 1404 to a second state 1406.

In the second state 1406, the overall target system gain $\gamma_{target}$ corresponding to the anchored region is obtained from the overall predistortion system controller, which can correspond to, for example, the constant gain predistortion controller 704 described earlier in connection with FIG. 7. The overall target system gain $\gamma_{target}$ can be retrieved from a prior calculation. In one example, the predistortion system can obtain the approximate gain at the boundary between the region of realizable system gain and unrealizable system gain, and predistortion system can set the overall target system gain $\gamma_{target}$ to correspond to a gain of about −3 dB less than the gain at the boundary. When information regarding the overall target system gain $\gamma_{target}$ for the anchored region is not available, a default target value can be selected, such as a value between the range of −2 dB to −6 dB. Preferably, the default target value is about −3 dB. Once the target anchor gain has been identified, the CGC process proceeds to a second decision block 1408.

In the second decision block 1408, the process determines whether an updated predistortion function is available from an adaptive predistortion controller, such as the ACPCE 130 described earlier in connection with FIG. 1 and FIG. 7. It will be understood that the adaptive predistortion controller can itself be implemented in hardware or in software, and in real time or in non-real time. The CGC process can remain in the second decision block 1408 until the updated predistortion function becomes available, as indicated by the loop back to the second decision block 1408. When the updated predistortion function is available, the CGC process advances to a third state 1409.

In the third state 1409, the CGC process examines the received predistortion function and modifies the predistortion function as appropriate such that the system gain of the predistortion function in the anchored gain region corresponds to the target anchor gain. Appropriate modification processes, which anchor the gain of the predistortion function, are described in greater detail later in connection with Equation 14. The CGC process advances from the third state 1409 to a third decision block 1410.

In the third decision block 1410, the CGC process evaluates the modified anchored gain predistortion function that was generated in the third state 1409. The third decision block 1410 examines the modified anchored gain predistortion function and determines whether this function is indeed anchored appropriately. Further, the CGC process examines the modified anchored gain predistortion function to determine if use of the predistortion function would invoke operation within the region of unrealizable system gain. Processes to determine operation in the region of unrealizable system gain are described in greater detail later in connection with FIG. 17.

The CGC process proceeds from the third decision block 1410 to a fourth state 1412 if the CGC process determines that the modified anchored gain predistortion function cannot be qualified because the region of unrealizable system gain would be transgressed. Otherwise, i.e., the CGC process determines that the modified anchored gain predistortion function has been successfully qualified, then the CGC process proceeds from the third decision block 1410 to a fifth state 1414, where the CGC process can pass the modified anchored gain predistortion function directly to the predistortion component.

In the fourth state 1412, the CGC process examines the system gain of the modified anchored gain predistortion function and determines those regions in which the system gain exceeds the 0-dB threshold. In one embodiment, this 0-dB threshold is indicated by a digital numerical format of a fixed-point radix that the system employs. These regions are then constrained or modified so that the overall gain expansion does not exceed the 0-dB threshold. This additional modification step to the predistortion function can take several forms. Constraining of the modified anchored gain predistortion function is described in greater detail later in connection with FIG. 20. Once the overall maximum system gain of the predistortion function has been appropriately constrained, the CGC process passes the constrained modified anchored gain predistortion function to the predistortion component by proceeding to the fifth state 1414.

The CGC process can also optionally inform the adaptive predistortion controller of the modification to the table, and of the region of the modifications. This information can advantageously be used by the adaptive predistortion controller to improve its adaptation behavior based upon an indication that the CGC process has taken some action.

In the fifth state 1414, the CGC process loads the modified predistortion function into the active real-time predistortion component. Once this task is complete, the CGC process exits the fifth state 1414 and can optionally advance to an optional fourth decision block 1416. Without the optional fourth decision block 1416, the CGC process can exit the fifth state 1414 and return to the second decision block 1408 to process an updated predistortion function.

In the optional fourth decision block 1416, the CGC process verifies that the current anchored gain region is appropriate for the current operating conditions, as indicated by the average power and signal probability amplitude profile. The CGC process proceeds from the fourth decision block 1416 to the second decision block 1408 when the current anchored gain region meet the predefined target anchored gain criteria. If the CGC process determines that the anchored gain and current operating conditions are mismatched, then the CGC process proceeds from the fourth decision block 1416 and returns to the first decision block 1402, where the anchored gain region is re-assessed.

Identification of the Gain Region to be Anchored

Figure 15:
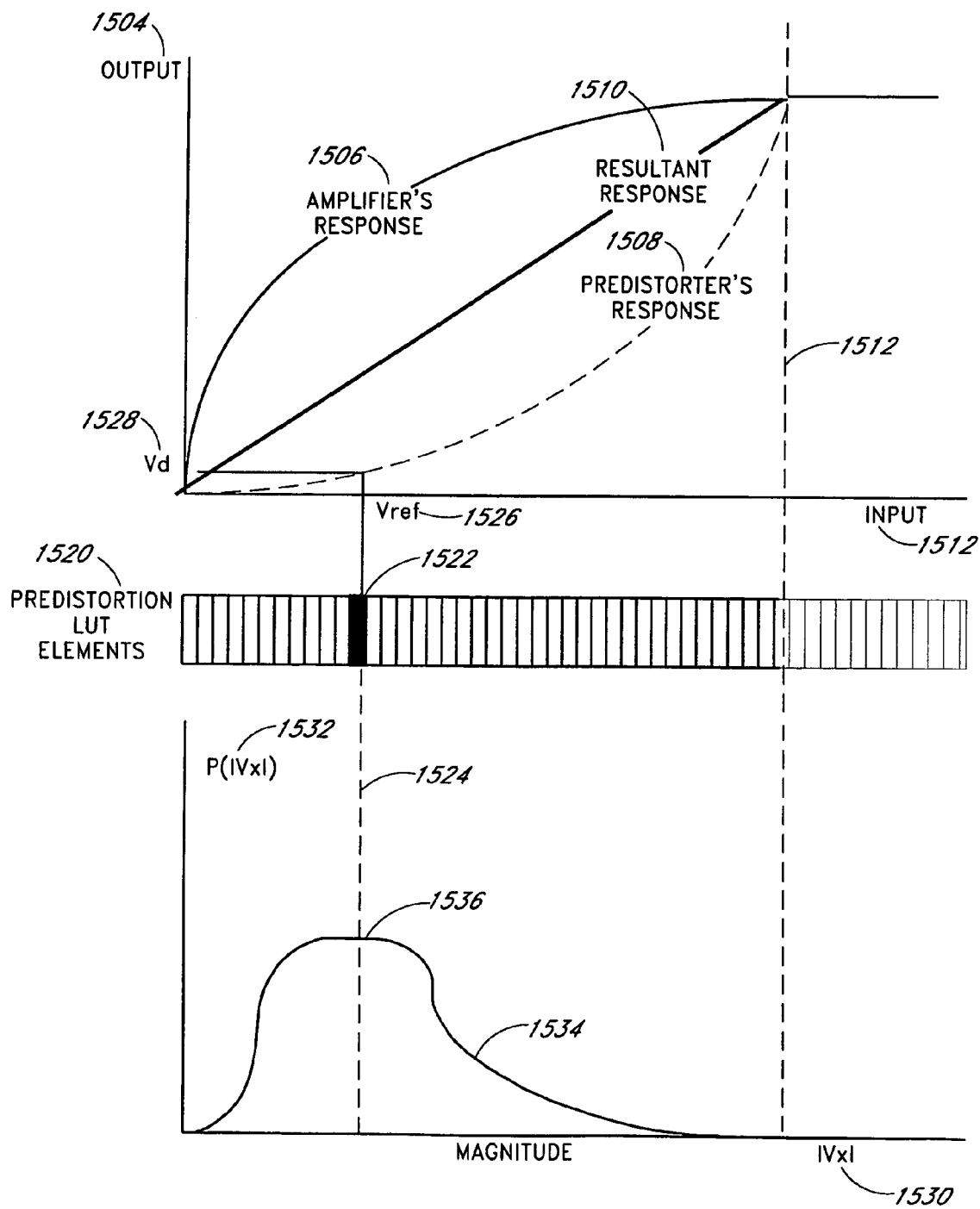
FIGS. 15 and 16 illustrate a process for identifying an anchored gain region.
Figure 16:
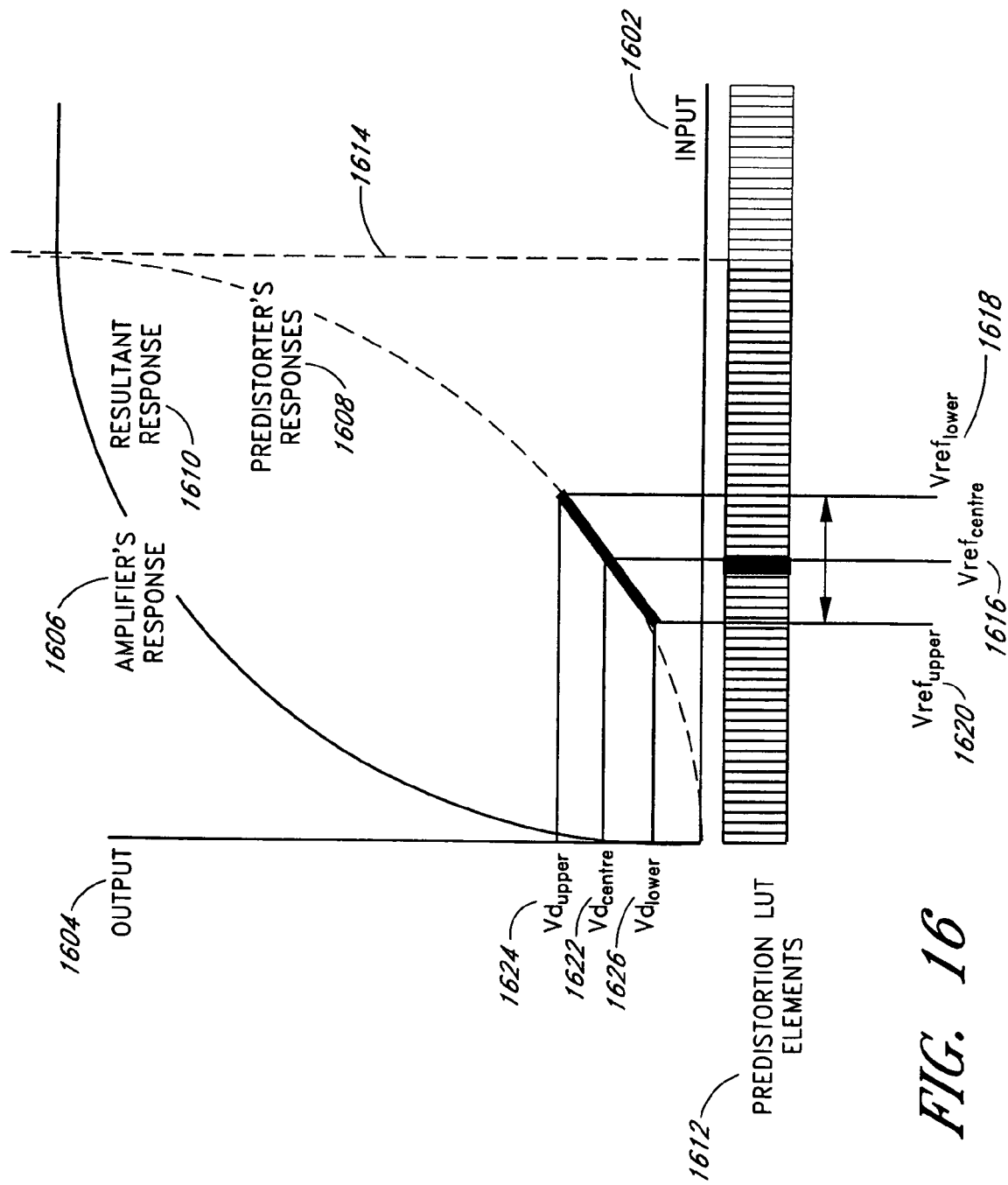

FIG. 15 and FIG. 16 illustrate further details of a process for identifying a region of the predistorter gain that will be anchored. It will be understood that the process can be embodied in either hardware or in software, and can be performed in real time or in non-real time.

In the upper graph of FIG. 15, the level of the input drive or reference signal is indicated along a horizontal axis 1502. An output level is indicated along a vertical axis 1504. An upper curve 1506 corresponds to an amplifier's response, and a lower dashed curve 1508 corresponds to the predistorter's complementary response. A line 1510 corresponds to the resultant response. A first dashed line 1512 separates a region of realizable system gain to the left in FIG. 15, and a region of unrealizable system gain to the right in FIG. 15.

Examination of the input signal statistics and the predistortion function permit the anchored region to be readily identified. This ensures that the system gain appears to be relatively constant from an outer loop perspective. The input drive or reference signal is examined and the average power of the input signal is computed as illustrated in the lower graph of FIG. 15.

In the lower graph of FIG. 15, the magnitude of the input drive or reference signal is indicated along a horizontal axis 1530. Probability is indicated along a vertical axis 1532. An exemplary curve 1534 corresponds to a probability of magnitude density function. Typically, the input drive or reference signal's instantaneous statistics vary over a wide range as the number of users and information sources change. However, over a relatively long duration, i.e., a period of time for which the average of the power waveform appears relatively constant, an average power level can be readily identified. For example, the lower graph of FIG. 15 indicates a point 1536 of relatively high probability, which can be used to estimate the average power level. This point 1536 of high probability is related to a particular value for an input drive level and corresponds to an average input drive level 1526.

This average input drive level 1526 is then utilized to identify the center of the anchored gain region by examining the predistortion function to determine what system response is associated with the drive level that is commensurate with the input signal's average power. The average input drive level 1526 is mapped to a corresponding element 1522 of a predistortion lookup table 1520 as shown by a second dashed line 1524.

Once the center of the anchored gain region has been identified, the gain of the predistortion function can be computed by determining the ratio of the predistorter's output level $V_d$ 1528 for the drive level corresponding to the anchored gain center input drive $V_{ref(avg)}$, i.e., $V_d/V_{ref(avg)}$.

FIG. 16 illustrates a span of the anchored gain region. FIG. 16 includes an input drive level along a horizontal axis 1602 and an output level along a vertical axis 1604. An upper curve corresponds to a sample amplifier output response 1606. A lower dashed curve corresponds to a sample predistorter response 1608. A line corresponds to a resultant response 1610 of the combination of the amplifier and predistorter responses. FIG. 16 also illustrates a predistortion lookup table 1612, which spans at least the region of realizable system gain. A dashed line 1614 separates the region of realizable system gain to the left and a region of unrealizable system gain to the right. It will be understood by one of ordinary skill in the art that a functional predistorter, i.e., a circuit that implements a non-linear function, can be equivalently utilized without a change in the algorithmic approach.

To determine a span of the anchored region, the gain of the predistortion function can be examined on both sides of the selected point, e.g., both sides of the center. For example, a center of the input level for the anchored gain region is indicated as $Vref_{center}$ 1616, which corresponds to a center for the gain of the predistortion function. A corresponding output level is indicated in FIG. 16 as $Vd_{center}$ 1622. In one embodiment, the anchored gain region is specified as that region of input stimulus for which the predistorter's response 1608 does not change by more than a predetermined amount, such as an amount k, which can be selected according to a particular radio system's gain variation criteria for increases and decreases in system drive level. One example of a value that can be used for k is 0.25 dB. In one embodiment, k varies in a range from about 0 to about 2 dB.

The lower chart of FIG. 16 graphically illustrates the selected upper and lower limits of the anchored gain region. The input drive levels for the upper and lower limits of the anchored gain region are shown in FIG. 16 as $Vref_{upper}$ 1618 and $Vref_{lower}$ 1620, respectively. An upper limit of the anchored gain region for the predistorter's response is indicated in the lower chart of FIG. 16 as $Vd_{upper}$ 1624, which corresponds to a gain of $Vd_{center}$ 1622+k. An exemplary lower limit for the gain of the predistortion function is indicated in the lower chart FIG. 16 as $Vd_{lower}$ 1626, which corresponds to a gain of $Vd_{center}$ 1622-k. In one example, the predistorter gains corresponding to $Vd_{upper}$ 1624 and to $Vd_{lower}$ 1626 can be obtained by inspection of the contents of the predistortion lookup table 1612 and by application of Equation 13.

The anchored gain region for the predistorter (PD) can also be expressed mathematically as provided in Equations 12a and 12b, where k is the gain variation threshold.

$$PD\ Gain_{lower} = PD\ Gain_{center} - k \quad \text{(Eq. 12a)}$$

$$PD\ Gain_{upper} = PD\ Gain_{center} + k \quad \text{(Eq. 12b)}$$

In Equations 12a and 12b, the term "PD Gain" relates to the ratio between the input level and the output level of the predistorter as expressed in Equation 13.

$$PDGain = \frac{V_d}{V_{ref}} \quad \text{(Eq. 13)}$$

Anchoring the Gain of a Predistortion Function

After the region of the predistorter gain to be anchored has been identified, as described earlier in connection with FIGS. 15 and 16, the process anchors the gain of the predistortion function. In one embodiment, anchoring the gain function of the predistortion function is achieved in a two-step process.

In a first step, the process computes or estimates the overall or average gain response of the predistorter in the region to be anchored, termed anchored gain region. An estimate of the overall gain ($\gamma_{pd}$) of the predistorter in the anchored gain region can be achieved by integrating the gain of the predistorter over the anchored gain region as expressed in Equation 14.

$$\gamma_{pd} = \frac{1}{UL - LL} \cdot \int_{LL}^{UL} pd(x)dx \quad \text{(Eq. 14)}$$

In Equation 14, pd(x) represents the gain function of the predistorter, e.g., the predistorter's response 1608, LL corresponds to the lower limit of the anchor region, e.g., $Vref_{lower}$ 1620, and UL corresponds to the upper limit of the anchor region, e.g., $Vref_{upper}$ 1618.

Alternatively, where an indexed table or a multi-dimensional based predistorter is used instead of a lookup table, an example of which is described in greater detail later in connection with FIG. 22, the elements of the predistortion gain can be combined over a specified range of indexes to estimate the gain.

In a second step, the process scales the predistortion function such that the gain exhibited in the anchored gain region meets the target anchored gain value. In practice, the computed overall gain can be found to be outside the target for the anchored region. This can be corrected by computing a linear scale factor, which can then be applied to the entire predistortion function. Application of the scale factor permits the average gain for the anchored region to meet the target anchored gain, $\gamma_{target}$. This can be computed by utilizing the result of Equation 14 in Equation 15.

$$\alpha = \frac{\gamma_{target}}{\gamma_{pd}} = \frac{\gamma_{target}}{\frac{1}{UL - LL} \cdot \int_{LL}^{Ul} pd(x)dx} \quad \text{(Eq. 15)}$$

In Equation 15, $\alpha$ corresponds to the anchored gain scaling factor. Once the scaling factor $\alpha$ has been computed, the scaling factor $\alpha$ can be applied to the entire predistortion function, predistortion table, or predistortion multi-dimensional data structure to generate the new or modified predistortion function, pd'(x), as expressed in Equation 16. It will be understood that in some embodiments, the scale factor a can be applied to fewer than the entire predistortion function, predistortion table, or predistortion multi-dimensional data structure, as appropriate. The modified function, pd'(x), is then loaded into the real-time predistortion component.

$$pd'(x) = \alpha Pd(x) \quad \text{(Eq. 16)}$$

A phenomena that can occur during this scaling process is that the initial adjustment to the predistorter gain can potentially cause an outer control loop, e.g., the outer RRME power control loop 514 described earlier in connection with FIG. 5, to observe an increase or a decrease in system power that is delivered to the antenna. In response, a control entity, such as the RRME 504 described in connection with FIG. 5, may respond to the change in system power with an appropriate decrease or increase in drive level. If this occurs, the predistortion function can adaptively alter slightly as the non-anchored elements are re-adjusted to ensure that the overall response of the system still remains linear. Thus, the anchoring approach effectively resets the predistortion characteristic in one region, i.e., in the anchored region, which may result in a relatively slight mis-scaling in non-anchored regions. However, this mis-scaling is rapidly eliminated by the adaptive predistortion engine working in conjunction with the normalizing signal pre-processing.

Identification of Operation in the Region of Unrealizable System Gain

Figure 17:
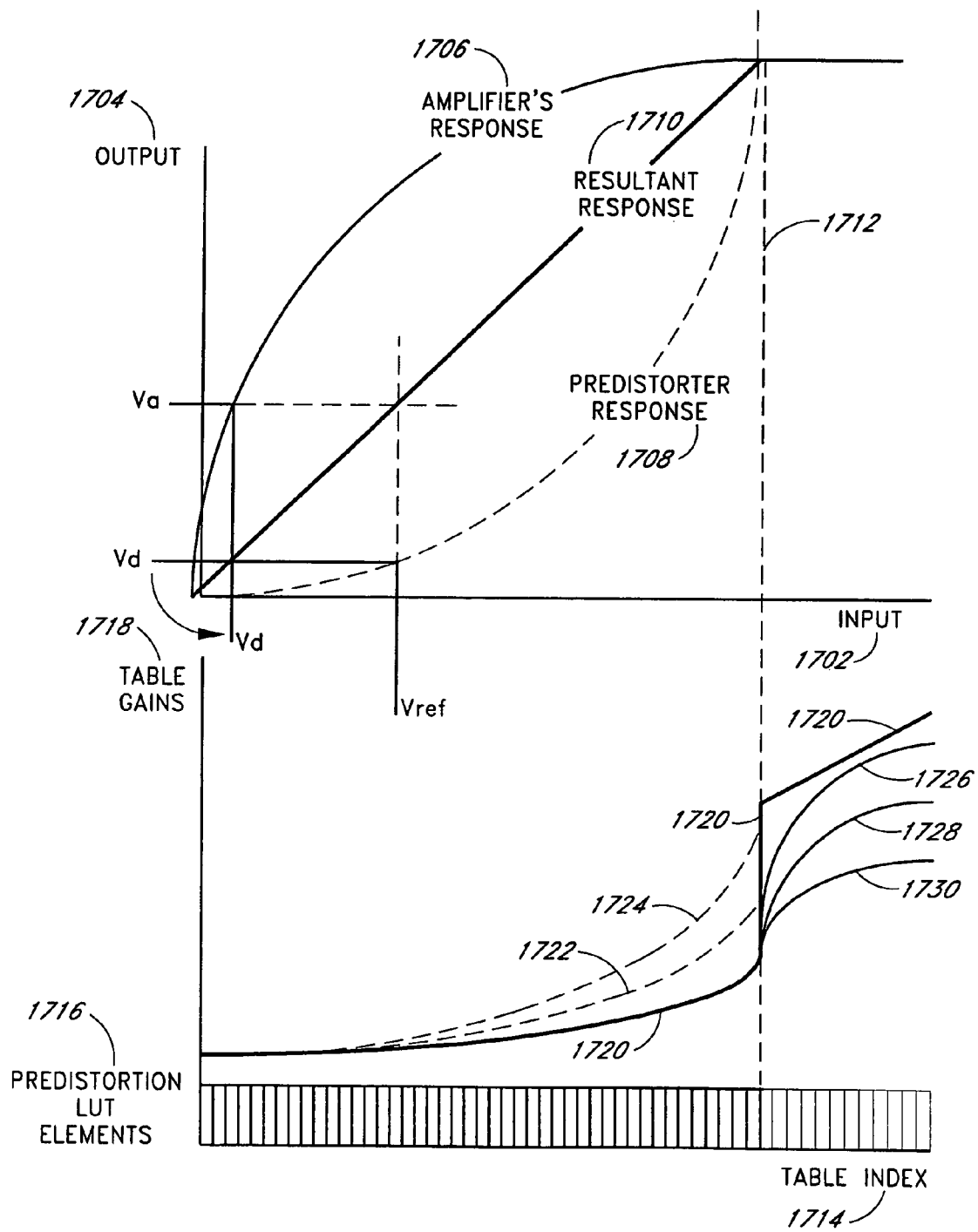
FIG. 17 illustrates the behavior of a predistorter system when there is overlap of the lookup table entries or predistortion function with the region of unrealizable system gain.

FIG. 17 illustrates the behavior of a typical predistorter system (without compensation for operation in the region of unrealizable system gain) when there is overlap of the lookup table entries or predistortion function with the region of unrealizable system gain. An upper portion of FIG. 17 illustrates gain behavior. In the upper portion of FIG. 17, a horizontal axis 1702 indicates an input level. A vertical axis 1704 indicates an output level. An upper curve 1706 corresponds to an amplifier's response. A lower dashed curve 1708 corresponds to a predistorter's response. The combined resultant response of the predistorter and the amplifier is represented as a line 1710. A dashed line 1712 divides FIG. 17 into a region of realizable system gain to the left, and a region of unrealizable system gain to the right.

A lower portion of FIG. 17 illustrates potential corruption to a predistorter response. For illustrative purposes, the response of the predistorter is stored in a lookup table 1716 with the index of the lookup table shown along a horizontal axis 1714. A sample predistorter response in a region of realizable system gain is represented by a lower curve 1720 in bold. A response of the predistorter function in the region of unrealizable system gain is represented by a curve 1721 to the right of the dashed line 1712.

Assuming for discussion purposes that the predistortion function can be independently adjusted by an adaptation component in the region of unrealizable system gain, then the lower portion of FIG. 17 illustrates that as the adaptation process proceeds, the gain of the function in the area that overlaps the region of unrealizable system gain continually grows. This occurs because the adaptation component valiantly tries to find a predistortion gain that will cause the overall system output to reach a specified level. However, since this level exceeds the maximum power level that the power amplifier can supply, the adaptation process will continue to increase the predistortion gain as illustrated by a second curve 1722, which eventually leads to a hard step function at the cusp of the amplifier's saturated output power point, as illustrated by an upper line 1724 and a relatively large step 1726.

In practice, conventional adaptive predistortion components include smoothing algorithms to reduce function/table noise and enhance function/table stability. When a step is encountered, such as the relatively large step 1726, the smoothing algorithms can bias the lower table elements in the region of realizable system gain, thereby undesirably providing excess gain and corrupting the lower table elements. For example, such a smoothing algorithm can increase the gain of the original predistorter response in the realizable system gain region, as represented by the lower curve 1720, to higher gains as represented by a first dashed curve 1728 and a second dashed curve 1730, such that the relatively large step 1726 is smoothed.

Figure 18:
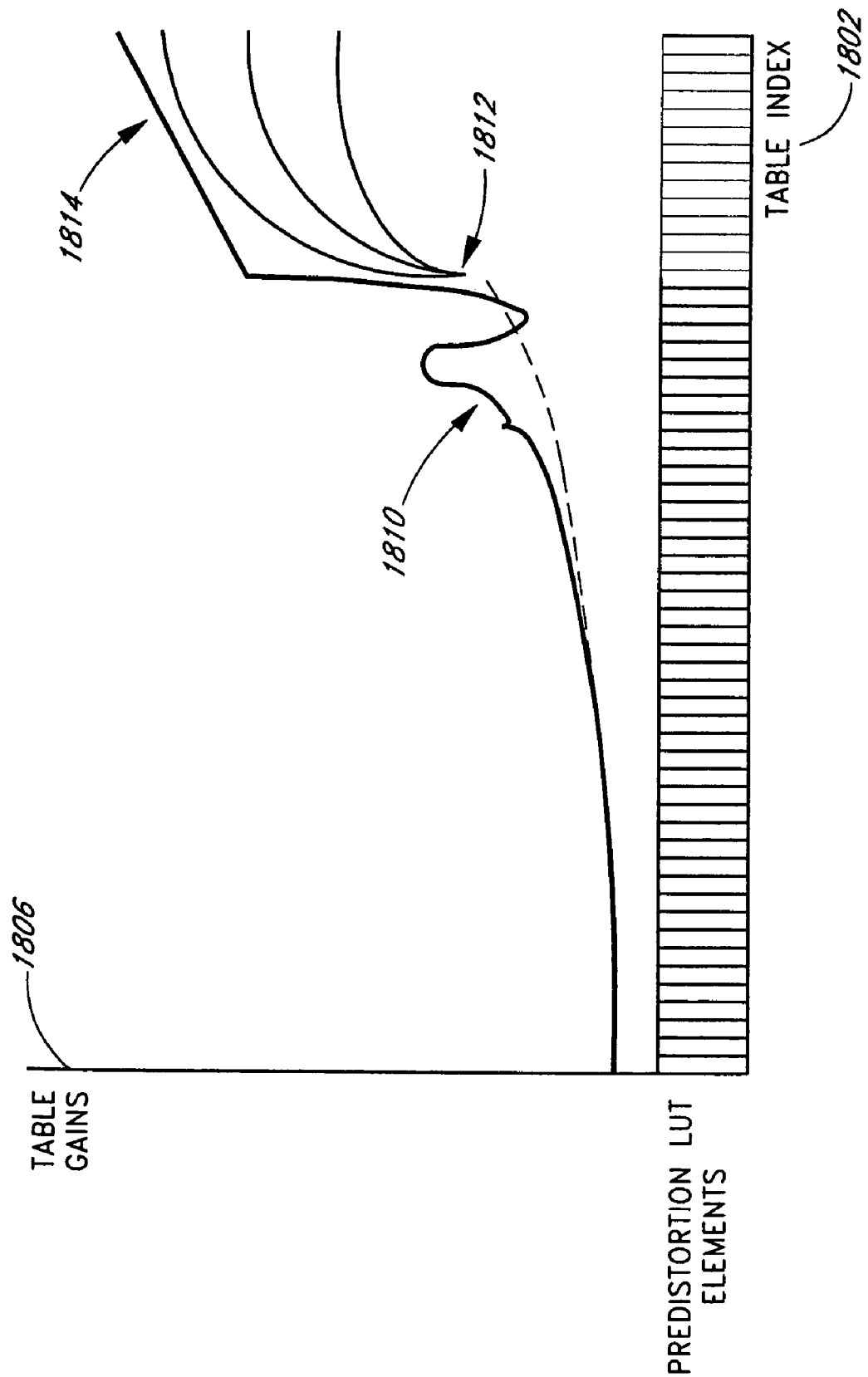
FIG. 18 illustrates the effects of time-domain ringing as a further potential source of instability.

FIG. 18 illustrates the effects of time-domain ringing as a further potential source of instability that can be mitigated by embodiments of the invention. FIG. 18 illustrates a response of a predistortion function. A horizontal axis 1802 includes a table index of a lookup table that holds the predistortion function. The table index can be used to reference or to index the entries in a predistortion lookup table 1804. A vertical axis 1806 indicates gain stored in the lookup table entries for the predistortion function. A dashed lower curve 1808 indicates a desired response for the predistortion function. As described earlier in connection with FIG. 17, operation in the region of unrealizable system gain can result in a relatively high level of gain for the predistorter response, as illustrated by an upper line 1810.

Operation in the region of unrealizable system gain can be further complicated by an additional mechanism, which further exacerbates instability. This mechanism may be envisioned by considering the predistortion mechanism in the presence of a relatively sharp or rapid change in non-linearity, as illustrated by a step 1812. As the baseband reference signal is non-linearly processed by the predistortion entity, the upper regions of the predistortion function/table in the region of unrealizable system gain will cause a relatively rapid and wide expansion in the signal bandwidth, which is transitory in nature. This relatively wide-bandwidth signal (ordinarily exceeding the upconverter bandwidth) is filtered by the bandpass upconverter's filter action, which in turn introduces the Gibb's phenomena, i.e., time-domain ringing, over adjacent signal samples.

The time-domain ringing and subsequent filtering can be problematic because the overall drive to the power amplifier varies significantly from what the predistortion entity had expected. This effectively causes the observational noise to increase, which ordinarily would merely cause the adaptation engine to adapt at a slower rate. However, if the time-domain ringing causes the drive level to be consistently biased, then biased predistortion entity updates will also occur, as illustrated by the deviations 1814 from the dashed lower curve 1808 that represents the desired response for the predistortion function. In addition, the table entries adjacent to the region of unrealizable system gain can also be corrupted. These entries can appear to be overdriven, and the adaptation engine can then attempt to build a decrease in predistortion gain for this region of the table as illustrated in a lower portion 1816 in FIG. 18. Disadvantageously, time-domain ringing causes further undesirably corruption to the values stored in the lookup table containing the predistortion function when the table includes values that overlaps into the region of unrealizable system gain.

One embodiment of the invention includes a data management method for the predistortion function or lookup table that stores the predistortion function. The data management method advantageously overcomes the drawbacks of corruption to the values of a lookup table due to extension of the lookup table into regions of unrealizable system gain. The data management method advantageously prevents a step function to be generated or built into the lookup table that stores the predistortion function. One embodiment of the technique works by post processing an adapted table in the following manner.

In a conventional system, transmitted reference data and observed data are captured and the predistortion elements are adapted in accordance with the adaptation component of choice, i.e., the predistortion function or table is updated as a function of the current predistortion function and the error measured between the reference signal entries and the observed signal entries. Equation 17 expresses a typical adaptation update for a basic IEEE memoryless Dirac predistortion system.

$$\text{New}_{tap} = \text{Old}_{tap} + \alpha(V_{ref} - V_{obs}) \quad \text{(Eq. 17)}$$

In a conventional system, the predistortion function characteristics or table entries that overlap with the region of unrealizable system gain will continuously grow as the predistortion adaptation engine continues to observe a difference between the desired output level and the maximum power level that the power amplifier is actually capable of delivering.

Post processing, the data processing method can advantageously alleviate the undesired growth of predistorter gain by scaling the predistortion function or entries that overlap with the region of unrealizable system gain such that the predistorter response does not contain rapid gain changes that can force the power amplifier into deep compression. One embodiment of the method achieves the scaling of the predistortion function in a three-step process. It will be understood by one of ordinary skill in the art that these steps can be combined with other steps and with each other such that the number of steps in a corresponding process may vary within a broad range.

In a first step, the process identifies the region of unrealizable system gain. Identification of the region of unrealizable gain is described in greater detail later in connection with FIG. 19. In a second step, the process scales the table entries that overlap this region so that "overzealous" gain expansions are not present in the table. The scaling of table entries is described in greater detail later in connection with FIG. 20. In a third step, the process propagates this scaled predistortion table into the active predistortion engine or component and optionally and advantageously further propagates the scaled predistortion table back into the adaptation engine. Advantageously, this optional backward propagation step permits the scaled predistortion table to become the reference point from which subsequent adaptation updates should occur.

Figure 19:
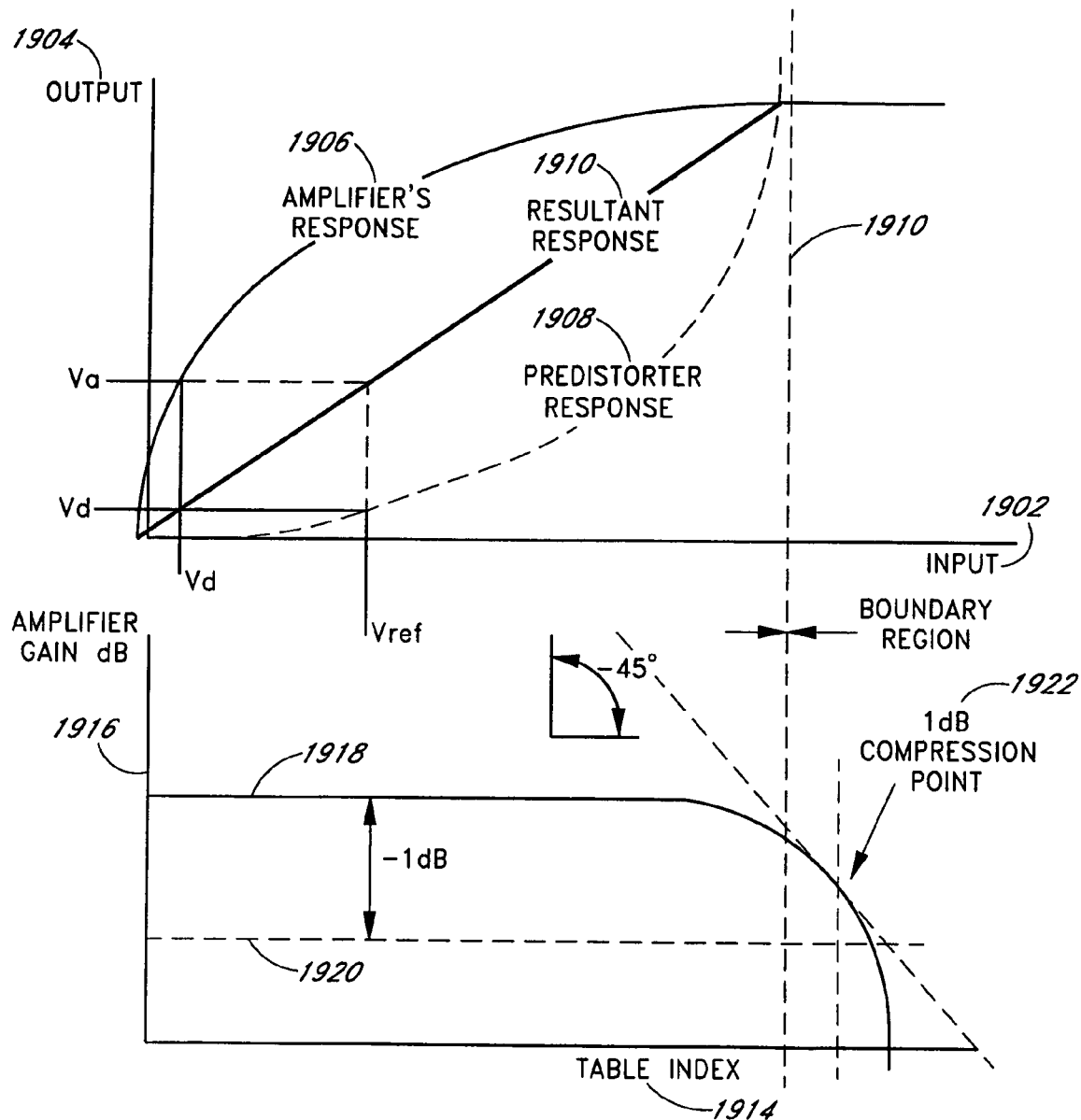
FIG. 19 illustrates an exemplary method of detecting the boundary between realizable system gain and unrealizable system gain.

Observing Compression and Detecting the Boundary Between the Region of Realizable and Unrealizable System Gain FIG. 19 graphically illustrates an exemplary method of detecting the boundary between realizable system gain and unrealizable system gain. An upper portion of FIG. 19 relates to input versus output response. An input level is indicated along a horizontal axis 1902. An output level is indicated along a vertical axis 1904. An upper curve 1906 corresponds to a sample power amplifier response (without predistortion). A lower curve 1908 corresponds to a sample predistorter response that is complementary to the sample power amplifier response. The resultant or combined response is illustrated as a line 1910. A dashed line indicates a boundary 1912 between a realizable system gain portion to the left and an unrealizable system gain portion to the right.

Detection of the boundary 1912, as represented by the dashed line, between the region of realizable system gain and the region of unrealizable system gain can be readily determined by examining the predistortion function or the data contained within the table or multidimensional data structure supplied by the adaptation component. A variety of methods can be used to detect the boundary 1912. One method is to detect the maximum power that can be delivered by the amplifier. For example, the maximum power can be readily determined by examining the predistortion signal that is provided as an input to the amplifier or by examining the amplifier's output signal as observed by the downconverter, such as the RF to baseband down conversion circuit 124.

In one embodiment, the boundary 1912 between the two system gains can be determined by examining the onset of maximum power delivered by the amplifier, i.e., searching through the amplifier's response as illustrated by the upper curve 1906 for a maximum value. The maximum power operating point detected can be further derated by a predetermined amount, such as 0.1 dB to 0.2 dB, which helps to ensure optimum linearity. The derating can advantageously compensate for a phenomena in which the input drive signal energy to the amplifier is transferred through the amplifier to the amplifier's output. This energy transfer typically manifests itself when an amplifier is overdriven and is often the source of confusion between true power-added efficiency of an amplifier and power efficiency measurements. Although the efficiency difference is typically significantly less than a percentage point, the energy transfer could lead to misinterpretation of the maximum power delivered by the amplifier and thus application of the derating criteria is preferred.

In another embodiment, the boundary 1912 between the two regions of system gain is advantageously detected by examining the resultant power amplifier's forward model that has already been computed by the predistortion system. A lower portion of FIG. 19 relates to the gain of the amplifier system (with predistortion) versus input signal level. The input signal level references or indexes values stored in a lookup table. It will be understood that the lookup table can be retrieved from or provided by an adaptation component. The lookup table index is indicated along a horizontal axis 1914. A vertical axis 1916 indicates the amount of amplifier gain. A curve 1918 corresponds to the gain of the amplifier versus the input signal level, which can be indexed in the lookup table. The resultant power amplifier's forward model is represented in the lower portion of FIG. 19 as the curve 1918. Advantageously, the resultant power amplifier's forward model, i.e., the mathematical model of the amplifier's input/output response, maintains data from which the boundary 1912 can be found.

For example, the boundary 1912 can be specified to correspond to a level that is a predetermined amount less than a reference point that can be found in the region of unrealizable system gain. For example, with reference to the lower portion of FIG. 19, the boundary 1912 can be specified at a point that is 1 dB less than a 1-dB compression point 1922. In the illustrated example, the 1-dB compression point 1922 corresponds to where the first derivative (slope) of the forward model's gain curve is equal to about −45 degrees. A dashed line 1920 indicates where the amplifier gain is about 1 dB less than the gain of the amplifier in a region of realizable system gain. It will be understood that the predetermined amount, illustrated in the example of FIG. 19 as 1 dB, as well as a reference point, such as the 1-dB compression point 1922, can vary in a relatively broad range.

Another method for detecting the onset of operation in the region of unrealizable system gain is to directly examine the anchored gain modified predistortion function. The anchored gain region can be set to exhibit a gain in a predetermined range, e.g., a range of −6 dB to −2 dB. It should be noted that the explicit gain level is not relatively important; rather the identification of gain expansion above the anchored gain value is the relatively important metric. Operation in the region of unrealizable system gain is readily determined and defined by finding those region(s) of the predistortion function, table or multi-dimensional data structure that exhibit a positive gain above the anchored gain region that indicates the region of unrealizable system gain has been transgressed, e.g., a gain greater than 0 dB for the current example, or alternatively, a gain expansion that exceeds 2 dB to 3 dB. It will be understood by one of ordinarily skill in the art that the level of permissible gain expansion can vary depending on the transistor technology utilized in the amplifier. For example, 2 dB to 3 dB of gain expansion can be expected when utilizing laterally diffused metal oxide semiconductor (LDMOS) transistor technology. A lower threshold may be appropriate when gallium arsenide (GaAs) transistor technology is used.

The various approaches to specify the location of the boundary 1912 are relatively direct and straightforward. A process, which may be embodied in hardware, in software or in a combination of both, is described in further detail later in connection with FIG. 21.

Figure 20:
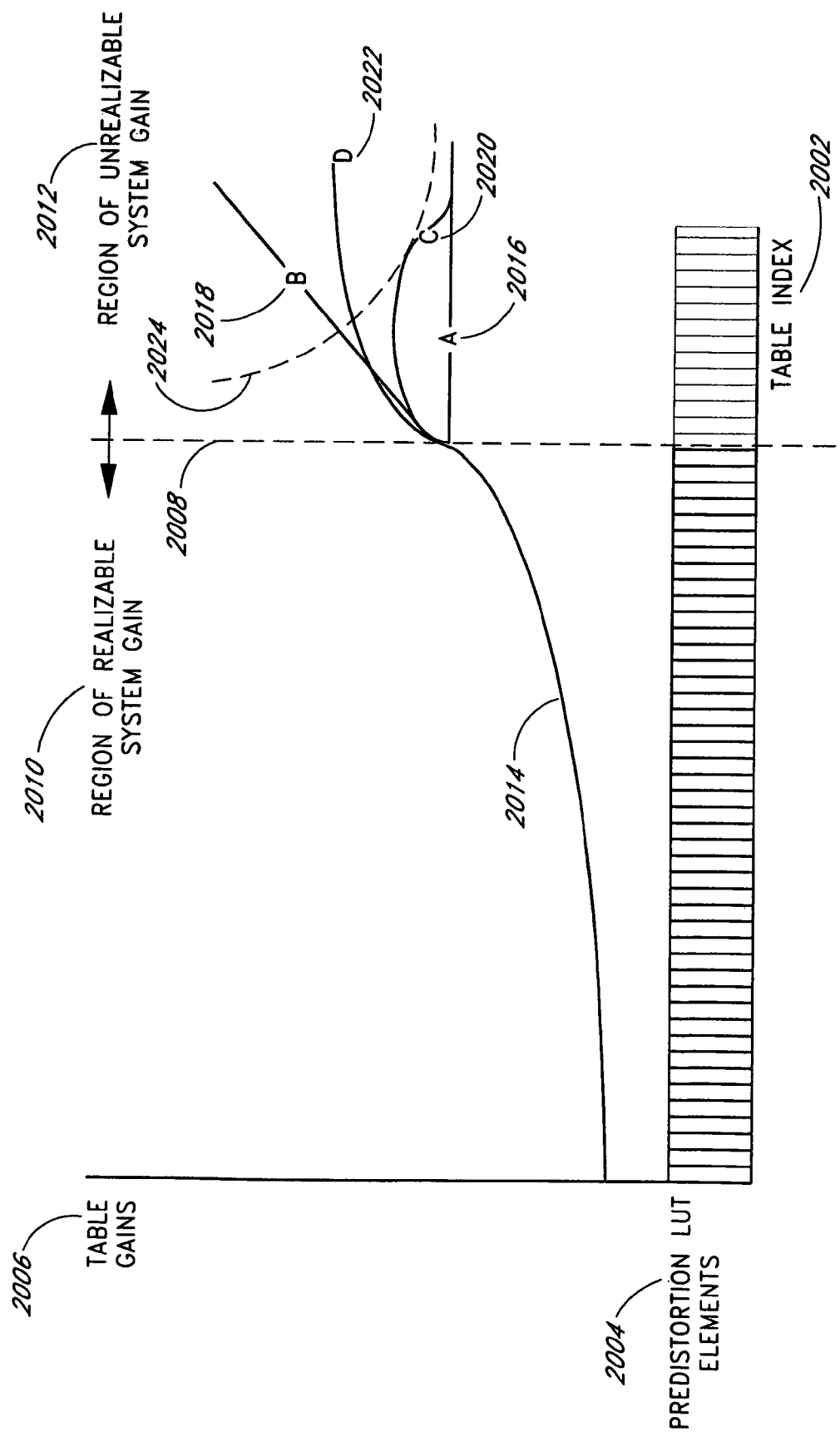
FIG. 20 illustrates an example of scaling of lookup table entries in a region of unrealizable system gain.

Processes to Modify the Predistortion Function for Operation in the Region of Unrealizable System Gain FIG. 20 illustrates an example of scaling of entries in a predistortion lookup table 2004 in a region of unrealizable system gain 2012. The gain response shown in FIG. 20 is illustrative of a desirable gain response. In FIG. 20, a horizontal axis 2002 indicates an input level, which can be used to reference or index the entries in the predistortion lookup table 2004. A vertical axis 2006 corresponds to the values for gain stored in the predistortion lookup table. A dashed line represents a boundary 2008 between a region of realizable system gain 2010 and the region of unrealizable system gain 2012.

The region of realizable system gain 2010 is illustrated to the left of the boundary 2008, i.e., at a lower input level than the boundary 2008. The region of unrealizable system gain 2012 is illustrated to the right of the boundary 2008, i.e., at a higher input level than the boundary 2008. After the boundary 2008 between the region of realizable system gain 2010 and the region of unrealizable system gain 2012 has been identified, the entries in the predistortion lookup table 2004 for the predistortion function in the region of unrealizable system gain 2012 can be modified to suppress the undesired growth of predistorter gain.

A curve 2014 corresponds to an example of a predistortion function that is stored in the predistortion lookup table 2004. Up to the boundary 2008 between the two regions, i.e., within the region of realizable system gain 2010, the predistorter adaptation component should be relatively free to compute virtually any response deemed necessary to compensate for the non-linear characteristics of the power amplifier. Beyond this region, i.e., where the predistortion function overlaps the region of unrealizable system gain 2012, artificial responses can advantageously be injected to ensure system stability. Examples of these artificial responses are also illustrated in FIG. 20 as a curve "A" 2016, a curve "B" 2018, a curve "C" 2020, and a curve "D" 2022. It will be understood by one of ordinary skill in the art that other appropriate responses can also be injected.

In a somewhat counter intuitive manner, the selection of the response in the region of unrealizable system gain 2012 does affect predistortion system performance. Although it is true that a power amplifier may distort an output signal when operating in the region of unrealizable system gain 2012, the response of the predistorter for the power amplifier for operation in the region of unrealizable gain should be carefully selected as described in further detail in connection with the four curves: curve "A" 2016, curve "B" 2018, curve "C" 2020, and curve "D" 2022.

In one embodiment, the selection of which curve to apply is determined by overall adjacent channel power distortion performance. For example, the overall impact upon the power spectral density of the transmitted signals can be used to select from among the curves. Each of the four illustrated overdrive response curves advantageously offers a specific characteristic that can be used to reduce overdrive in the region of unrealizable system gain 2012.

Level Response Gain (Curve "A" 2016)

Curve "A" 2016 corresponds to a relatively level response gain in the region of unrealizable system gain 2012 and is illustrated in FIG. 20 as a simple horizontal line. As a consequence of operation in the region of unrealizable system gain 2012, one might erroneously assume that since the power amplifier will inevitably distort signals while operating in this region, there is no need to attempt to linearize the transmitted waveform. Consequently, by fixing a relatively level response gain as shown by curve "A" 2016, no signal expansion is presumed to occur, and the power amplifier may simply be overdriven with a signal that would not exhibit time-domain ringing. However, this assumption does not always hold true because the rate of change of the gain rapidly changes as the boundary 2008 is transgressed, i.e., there is a step function in the derivative of the gain response of the predistorter. This rapid change in gain also causes bandwidth expansion to occur. To visualize the effect of this approach in the time domain, it can be imagined that the lower amplitude levels of the input waveform may have undergone non-linear expansion while the upper portions of the waveform have linear "caps."

The level-gain approach does, however, permit the relatively efficient utilization of the overall dynamic range in the digital domain because relatively little or no additional digital headroom is used to represent a binary word level that cannot be faithfully reproduced in the analog world. The level-gain approach also permits a relatively low level of wideband quantization noise floor to be obtained.

Advantageously, the adaptation engine for the level-gain approach can be relatively easy to implement. For example, a predistortion table can simply be scanned for the first upper table entry that would otherwise cause the power amplifier to be overdriven, i.e., the first entry in the predistortion lookup table 2004 that is to the right of the boundary 2008, i.e., higher input signal level than the input signal level at the boundary 2008. The adaptation engine can then replace that entry and the entries deeper in the region of unrealizable system gain 2012 with a value from the first gain entry in the predistortion lookup table 2004 that is prior to the boundary, i.e., an entry close to the boundary, such as the closest entry in the predistortion lookup table 2004 to the boundary. In other words, the adaptation engine can select an entry from the predistortion lookup table 2004 that is in the region of realizable system gain 2010, and the adaptation engine can copy the entry to the entries of the predistortion lookup table 2004 in the region of unrealizable system gain 2012. Preferably, the entry that is copied is the last entry in the region of realizable system gain 2010, i.e., the entry that is closest to the boundary, but still within the region of realizable system gain 2010. Copying of the value of the last entry advantageously avoids a discontinuity in the predistortion function.

Linear Response (Curve "B" 2018)

Curve "B" 2018 in FIG. 20 illustrates an alternative approach in which a linearly increasing gain response ("linear response") is substituted for predistortion lookup table entries in the region of unrealizable system gain 2012. The rate of change of gain in the predistortion component in the region of realizable system gain 2010 can be computed just before the boundary 2008 is transgressed. The rate of change of gain then extrapolated to a gain response for the predistortion engine into the region of unrealizable system gain 2012 as illustrated by curve "B" 2018.

One advantage of this linear response is that both the derivative of the gain response and the transition in the gain response are continuous. However, despite a linear rate of change of gain, the amplified signal can still exhibit significant bandwidth expansion, which can result in time-domain ringing. Disadvantageously, the linear-response approach also uses relatively more digital headroom than the level-response gain approach described in connection with curve "A" 2016. The increase in digital headroom can be supported by increasing the dynamic range for the predistortion function in the predistortion component, which can result in a relatively higher wideband quantization noise level. However, the disadvantages of higher quantization noise level are also traded off against lower adjacent channel power (ACP) levels, which are advantageously suppressed by the elimination of step functions in the gain function and its derivative, which would otherwise cause a rapid rise in adjacent channel energy.

The linear-response approach leads to an increase in the overall signal dynamic range because the entire waveform is subject to non-linear gain expansion. An additional disadvantage is that the amplifier will be driven deeper into saturation with the linear-response approach than with the level-response approach described in connection with curve "A" 2016. Although this should not result in an increase in adjacent channel distortion levels explicitly, the joint effect of time-domain ringing on the input signal to the amplifier and non-linear time-domain ringing as a function of the amplifier recovering from being driven into saturation can potentially cause the adaptation engines to become unstable, while attempting to adapt the predistorter's coefficients.

Composite Response (Curve "C" 2020)

Curve "C" 2020 of FIG. 20 illustrates a response that is a composite of the level-gain approach described in connection with curve "A" 2016 and the linear-response approach described in connection with curve "B" 2018. The composite response (curve "C" 2020) can be generated by weighting the values calculated by a linear-response approach (curve "C" 2018) with a 1/x gain curve. An example of a suitable 1/x gain curve is shown in FIG. 20 as a dashed curve 2024.

The composite response approach illustrated by curve "C" 2020 provides a gain response in the region of unrealizable system gain 2012 that advantageously has the joint benefits of exhibiting a continuous gain response and a continuous first derivative of the gain response. Further advantageously, relatively little additional digital headroom is needed to support the composite response approach. Moreover, the composite response approach also prevents the amplifier from being driven relatively deeply into saturation.

The reduction in the amount of digital headroom can provide decreased wideband quantization noise levels over the linear-response approach described in connection with curve "B" 2018. However, when driven by an input sequence that drives the predistortion system into operation in the region of unrealizable system gain 2012, the composite response approach will disadvantageously tend to provide a digital signal sequence in which the signal peaks are chopped off or significantly flattened. This chopping off of signal peaks can result in ringing in the analog reconstruction and upconversion filters, which at least partially negates the advantage of relatively less amplifier overdrive. However, the wideband quantization noise floor enhancement is advantageously retained.

Inverted Non-Linear Response (Curve "D" 2022)

Curve "D" 2022 in FIG. 20 corresponds to an inverted non-linear response. The inverted non-linear response achieves similar system advantages to that of the composite response approach discussed in connection with curve "C" 2020. However, the inverted non-linear response is achieved in a different manner.

The predistortion gain curve illustrated by curve "D" 2022 can advantageously be constructed by reflecting and inverting a portion of the predistortion function illustrated by the curve 2014 from just prior to where the boundary 2008 is encountered. This advantageously ensures that both the predistorter gain response and the derivative of the predistorter gain response are continuous at the boundary 2008 between the region of realizable system gain 2010 and the region of unrealizable system gain 2012.

The behavior of this inverted non-linear response technique is somewhat similar to that described in connection with the composite response approach illustrated by curve "C" 2020. However, it should be noted that the practitioner should pay additional attention to phase response for the inverted non-linear response technique. Such phase-compensation techniques are straightforward to those of ordinary skill in the art.

Summary of Predistortion Response Curves for the Region of Unrealizable System Gain The foregoing has described exemplary techniques to construct gain responses in the region of unrealizable system gain 2012. Preferably, these construction mechanisms are applied across the entire predistortion multi-variant surface that is supported by the applicable predistortion component. Certain aspects and concepts of a predistortion system according to an embodiment of the invention have been expressed in the context of a traditional IEEE-compliant predistortion model. However, when handling the phase response in the region of unrealizable system gain 2012, one difference is noteworthy.

Although the physical limitations of a power amplifier place restraints on the gain response of a predistorter operating in the region of unrealizable system gain 2012, there are no such constraints for compensation of the phase response selected by the adaptation engine in the region of unrealizable system gain 2012. However, it will be understood by the skilled practitioner that the deeper a power amplifier is driven into saturation, the more expansive the memory effects become in the time domain, i.e., the basic AM-PM assumption of the power amplifier's response becomes increasing invalid as the amplifier is driven into saturation. Consequently, at some point, the memory correction effects of the current component will also be overcome.

The following describes a process that advantageously constrains the gain of the predistortion function during operation in the region of unrealizable system gain.

Figure 21:
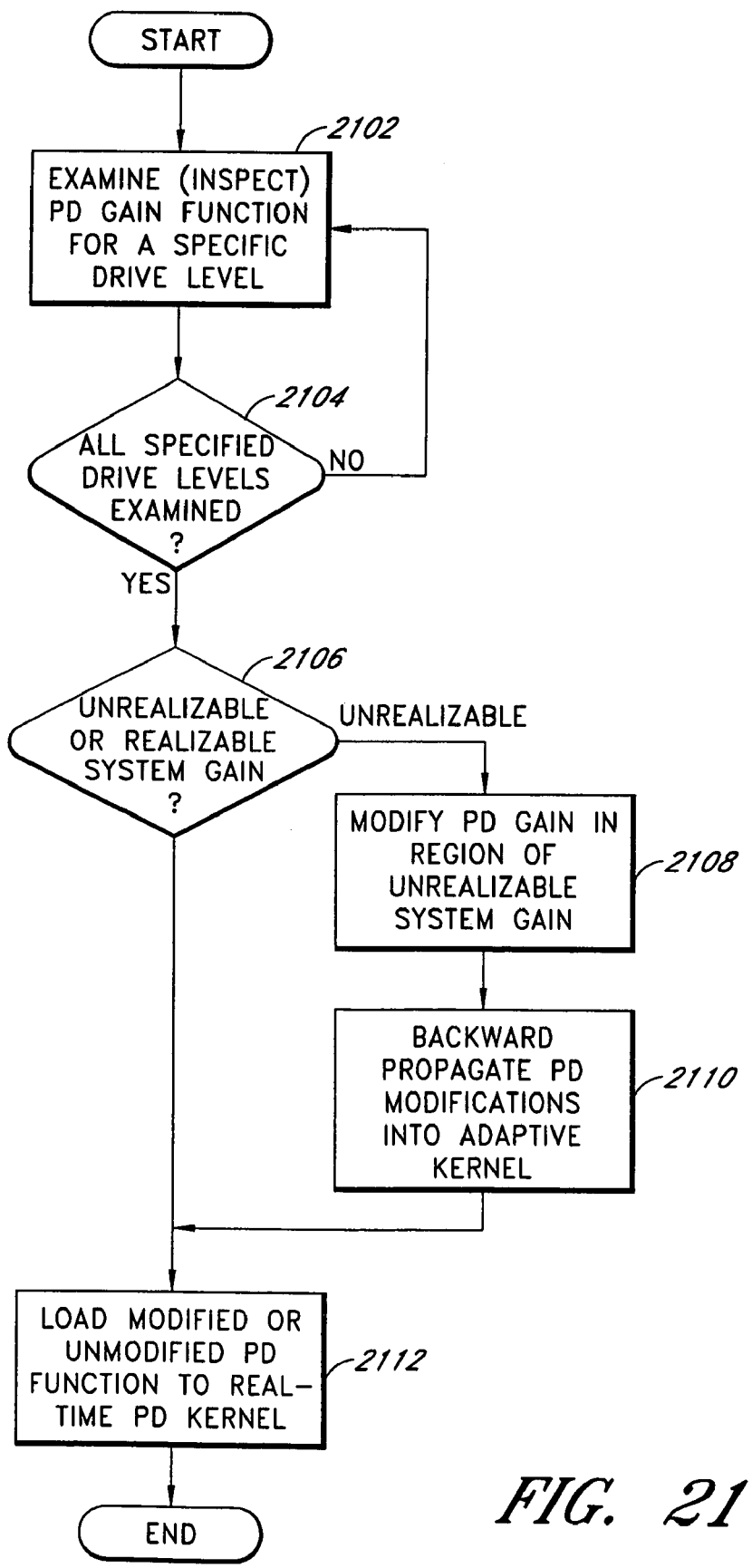
FIG. 21 is a flowchart that generally illustrates a process for constraining the gain of a predistortion function for operation in the region of unrealizable gain.

FIG. 21 is a flowchart that generally illustrates a process for qualifying the gain of a predistortion function and constraining the gain of a predistortion function for operation in the region of unrealizable gain. The process advantageously determines if the region of unrealizable system gain has been transgressed and determines appropriate actions to take to modify the entries or values stored in the predistortion function table or data structure.

The process can be invoked prior to uploading the predistortion function to the real-time predistortion component. In the illustrated process, the predistortion function that is provided by the adaptation component has been anchored and passed to the final qualification stage as described earlier in connection with FIGS. 15 and 16. The process starts at a first state 2102.

In the first state 2102, the process examines the gain exhibited by the predistortion function for a specific range of input drive signal levels. For example, the process can begin at the lowest input drive signal levels and end at the highest input drive signal levels. It will be understood that the range of input drive signal levels examined can correspond to all the input drive signal levels or to a selected range of input drive signal levels. The process compares the exhibited gain with the anchored gain for the system, and the gain expansion is computed and stored.

The process can loop from a first decision block 2104 back to the first state 2102 until the selected range of input drive signal levels is evaluated. The process proceeds from the first decision block 2104 to a second decision block 2106 when all of the specified drive signal levels have been examined.

In the second decision block 2106, the process determines whether the gain expansion has exceeded a preset gain expansion threshold, i.e., whether the predistortion function exhibits a gain expansion that is commensurate with operation in the region of unrealizable system gain. The process proceeds from the second decision block 2106 to a second state 2108 if there is gain expansion in the predistortion function that has breached the preset gain expansion threshold, i.e., if there is gain expansion commensurate with the region of unrealizable system gain. Otherwise, the process proceeds from the second decision block 2106 to a fourth state 2112.

In the second state 2108, the process finds the boundary between the region of realizable system gain and the region of unrealizable system gain. One technique to detect the boundary was described in greater detail earlier in connection with FIG. 19. Preferably, the process advantageously scans the response of the input predistortion function in the direction from high input signal levels to low input signal levels. The first drive level encountered for which the gain expansion does not violate the preset gain expansion threshold can be used to mark the boundary between the region of unrealizable system gain and the region of realizable system gain. The skilled practitioner will appreciate that in another embodiment, the process can instead scan from low to high. Scanning from low to high can deliver identical results. However, scanning from low to high can also be less reliable than scanning from high to low. False identifications can occur upon scanning in the direction from low to high because some transistor technologies exhibit relatively large gain expansions at relatively low drive levels.

Once the boundary has been identified, the portion of the predistortion function in the region of unrealizable gain can be modified. The portion of the predistortion function in the region of unrealizable gain can be modified in accordance with the modified responses described earlier in connection with FIG. 20. Preferably, the modifications to the predistortion function are applied to the entire portion of the predistortion function that lies in the identified region of unrealizable system gain. The process advances from the second state 2108 to an optional third state 2110. When the optional third state 2110 is not invoked, the process can instead proceed from the second state 2108 to the fourth state 2112.

In the optional third state 2110, the process backwards propagates the modified predistortion values to the adaptive predistortion engine. This permits the "modification" indication to be potentially exploited by the adaptation engine, which assists the adaptation engine to achieve stable convergence during the adaptation process. The process advances from the optional third state 2110 to the fourth state 2112.

In the fourth state 2112, the process loads the anchored gain predistortion function/table/data structure to the real-time predistortion logic. It will be understood that the predistortion function loaded can correspond to a modified predistortion function, i.e., modified by the second state 2108, or to an unmodified predistortion function via the second decision block 2106. The process then ends until invoked again. In one embodiment, the process is invoked each time the adaptation engine has made updates to the predistortion function.

Application to a Multi-Dimensional Data Structure Predistortion Engine

Multi-dimensional data structures and compensation circuits can be used to form the predistortion component. These predistortion components often utilize one or more characteristics of the input signal to correct or compensate for the non-linear process of the amplifier. Multi-dimensional predistortion components may advantageously be used to compensate for other dependencies, such as a non-linear dependency upon the rate of change of the reference signal $V_m(t)$ 104. FIG. 22 illustrates one embodiment of a predistortion component described in the following patent documents, the entireties of which are hereby incorporated by reference herein.

These patent documents are: U.S. patent application entitled A Wideband Digital Predistortion Linearizer for Non-linear Amplifiers, with application Ser. No. 09/596,142, filed on Jun. 16, 2000; U.S. patent application entitled Digital Predistortion Methods for Wideband Amplifiers, with application Ser. No. 09/595,988, filed on Jun. 16, 2000; U.S. patent application entitled Amplifier Measurement And Modeling Processes For Use In Generating Predistortion Parameters, with application Ser. No. 09/899,360, filed on Jul. 5, 2001; U.S. Pat. No. 6,342,810 entitled Predistortion Amplifier System with Separately Controllable Amplifiers; and U.S. patent application entitled Transmission Antenna Array System with Predistortion, with application Ser. No. 09/596,410, filed on Jun. 19, 2000.

Figure 22:
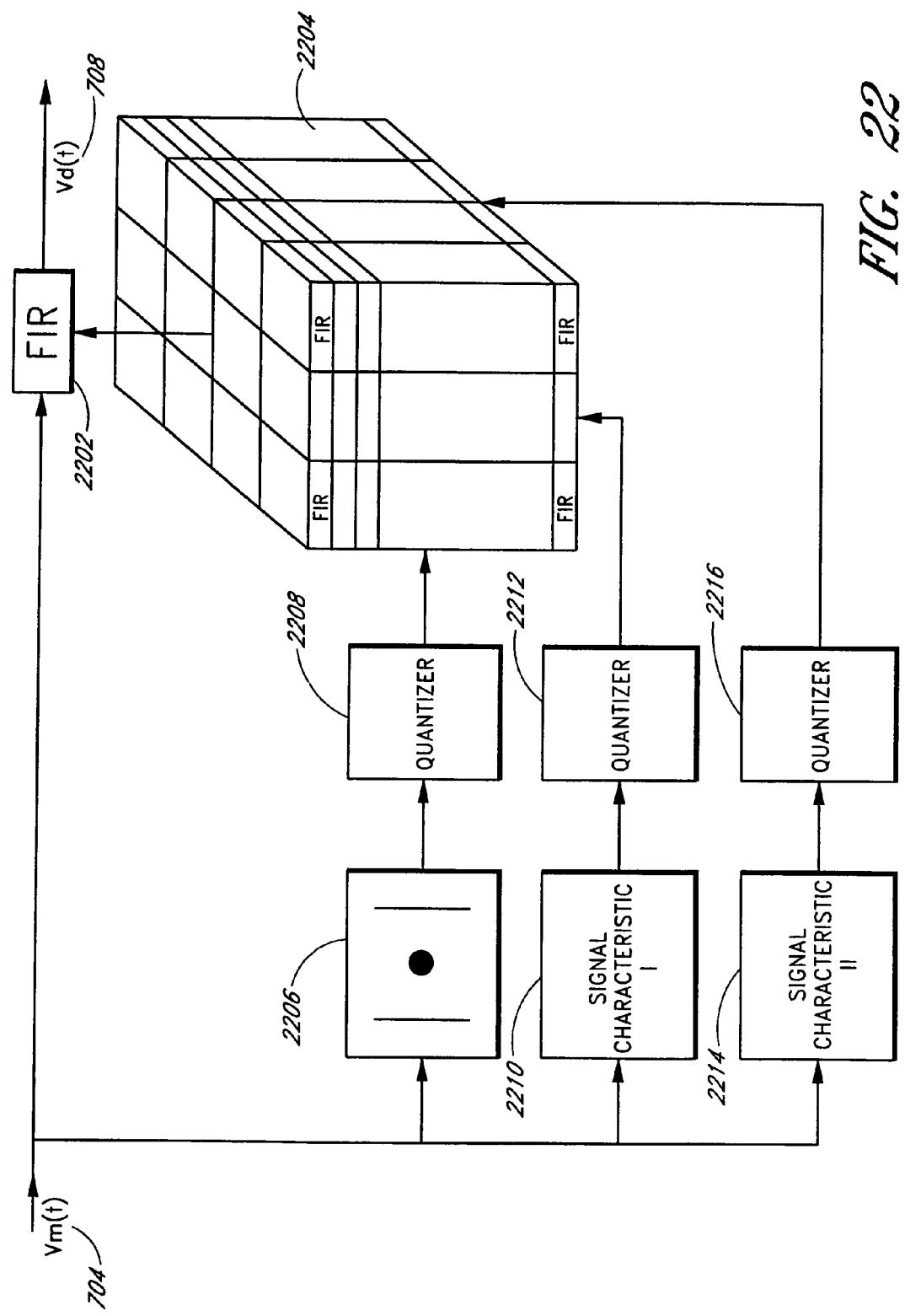
FIG. 22 illustrates an embodiment of a predistortion component with a multi-dimensional data structure.

The predistortion component illustrated in FIG. 22 advantageously provides updates to a finite impulse response (FIR) filter 2202, which can predistort the reference signal $V_m(t)$ 104 to the baseband complex modulation envelope $V_d(t)$ 108. The predistortion component stores the predistortion coefficients used in the FIR filter 2202 in a data structure 2204, which can advantageously index stored data in multiple dimensions. It will be understood that the FIR filter 2202 can correspond to a complex finite impulse response filter.

Application of the constant gain concept via gain anchoring and identification of the region of unrealizable system gain is compatible with the illustrated predistortion component. With a multi-variate data structure, the anchored region is a multivariate surface as opposed to a single variable line. Furthermore, identification of the region of unsupportable system gain similarly corresponds to determining the gain expansion boundaries of a multivariate surface. Once the surface boundaries have been identified, they can be readily replaced with a flat gain or predetermined constrained gain surface as described earlier in connection with FIG. 20. It will be understood by one of ordinary skill in the art that the concepts and processes described herein can be directly expanded to incorporate more complex predistortion functions.

The predistortion component of FIG. 22 uses three dimensions to illustrate predistortion in multiple dimensions. The corrective predistortion non-linearity illustrated in FIG. 22 is defined as a function of three generalized input signal characteristics: x, y, and z. The gain of an anchored region is expressed in Equation 18.

$$\gamma_{pd} = \frac{1}{(UL_x - LL_x)(UL_y - LL)(UL_z - LL)} \cdot \int_{LL_z}^{UL_z} \int_{LL_y}^{UL_y} \int_{LL_x}^{UL_x} pd(x, y, z)\partial x \partial y \partial z$$ (Eq. 18)

In Equation 18, pd(x, y, z) represents the gain of the predistortion function, which is dependent upon the input stimulus signal's specified characteristics, x, y, and z. $\gamma_{pd}$ represents the overall average gain. In practice, the initial resulting gain will generally be found to be outside the target for the anchored region. This can be corrected by computing a linear scale factor for the entire predistortion function that causes the average gain for the anchored region to meet the target anchored gain $\gamma_{target}$. This can be computed by utilizing the result from Equation 18 in Equation 19.

$$\alpha = \frac{\gamma_{target}}{\gamma_{pd}} = \frac{\gamma_{target}(UL_x - LL_x)(UL_y - LL_y)(UL_z - LL_x)}{\int_{LL_z}^{UL_z}\int_{LL_y}^{UL_y}\int_{LL_x}^{UL_x} pd \partial x \partial y \partial z}$$ (Eq. 19)

In Equation 19, α corresponds to the anchored gain scaling factor. Once this parameter, α, has been computed, the predistortion function, predistortion table or predistortion multi-dimensional data structure can be scaled by this factor, α, to generate a new or modified predistortion function, pd'(x, y, z), as expressed in Equation 20. Preferably, the new or modified predistortion function, pd'(x, y, z) is the modified function that is downloaded to the real-time predistorter.

$$pd'(x,y,z) = \alpha pd(x,y,z)$$ (Eq. 20)

In the illustrated multi-dimensional predistorter, the reference signal $V_m(t)$ 104 is provided as an input to a magnitude computation block 2206, a first additional signal characteristic block 2210, and a second additional signal characteristic block 2214.

The magnitude computation block 2206 computes the magnitude of the input signal and provides the magnitude as an input to a first quantizer 2208. The first additional signal characteristic block 2210 and the second additional signal characteristic block 2214 can compute a variety of signal characteristics. Examples of these other signal characteristics include a rate of change, such as a first derivative or a second derivative, or an integration operation. The outputs of the first additional signal characteristic block 2210 and the second additional signal characteristic block 2214 are provided as inputs to a second quantizer 2212 and a third quantizer 2216, respectively.

The outputs of the first quantizer 2208, the second quantizer 2212, and the third quantizer 2216 are advantageously applied to the data structure 2204 to index the data structure 2204 in the three dimensions, x, y, and z.

An Exemplary Embodiment of a Wideband Predistorter

Figure 23:
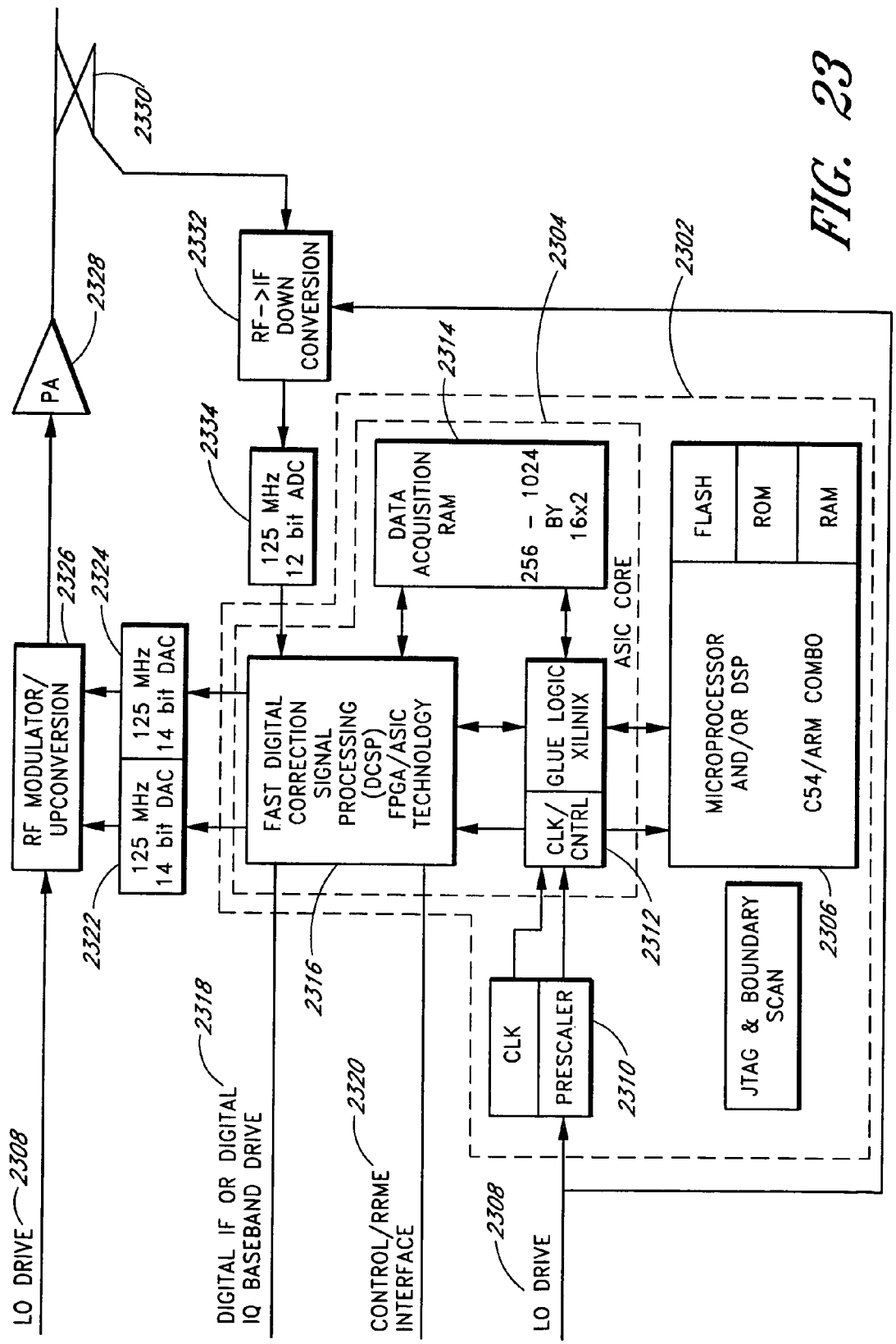
FIG. 23 illustrates an embodiment of a wideband predistorter.

FIG. 23 illustrates an embodiment according to the invention of a wideband predistortion amplifier system. An ASIC core 2304 includes a real-time predistortion core (DCSP) 2316. Due to the relatively fast signal processing requirements of the DCSP core 2316, this processing is preferably undertaken by dedicated hardware, such as a field programmable gate array (FPGA) or dedicated silicon in an application specific integrated circuit (ASIC). Suitable FPGAs are available from a variety of vendors, such as Xilinx, Inc. The DCSP core 2316 should also have relatively fast access to the compensation parameters, which are preferably stored in an internal RAM. This internal RAM should be accessible by adaptive predistortion logic, illustrated in FIG. 23 as the ACPCE, such that the ACPCE can provide updated/adapted parameters on a regular basis. The ACPCE can be implemented in software or firmware that is executed by a microprocessor or general purpose digital signal processor (DSP) 2306.

The ASIC core 2304 can also provide a glue logic interface 2312 to a data storage RAM 2314 where sets of observed amplifier input signal sequences may be stored prior to utilization by the ACPCE. This RAM 2314 can also reside on the ASIC core 2304. As digital signal processors evolve in speed, this process may be computed by a processor, such as a TMS320C60 from Texas Instruments or a SHARC processor from Analog Devices. However, such processing rates are currently beyond the capabilities of presently available DSPs.

The DCSP core 2316 can include a modest amount of 'glue logic' to interface the DCSP core 2316 to a processor 2306, such as a microprocessor or a DSP, which can implement the adaptive predistortion logic, ACPCE, which computes and delivers updated predistortion coefficientsor DCSP coefficients. The ACPCE includes the pre-compensation signal normalization and post predistortion gain anchoring processing. In one embodiment, the ACPCE operates in non-real time, which can advantageously permit a general purpose DSP or microprocessor, such as a TMS320C54/TMS320C60/TMS320C40 from Texas Instruments, Incorporated, a licensable DSP core, such as the ARM 7 from Advanced RISC Machines, Ltd., or a microcontroller/microprocessor device, such as a Motorola 68000 device, to be utilized. A prescaler 2310 preferably provides the processor 2306, as well as the DCSP core 2316, with a clock signal that is derived from a local oscillator signal 2308.

In one embodiment, this processor is augmented with non-volatile ROM for both program storage and factory-installed default predistortion parameters. Both ROM and Flash ROM are suitable for this purpose. As with most DSP or microprocessor designs, an appropriate amount of RAM can be included for general purpose program execution. Integration onto a single ASIC chip is also possible. DSP cores, such as the ARM7 from Advanced RISC Machines, Ltd., the Teak from DSP Group Inc., the Oak from DSP Group Inc., the ARC from ARC Cores and microprocessor cores are particularly suited to this approach and can yield a one-chip solution indicated by a dashed box 2302 when on board RAM, ROM and Flash ROM are provided as indicated.

In addition, the illustrated embodiment includes a direct conversion upconversion of a baseband to RF conversion 2326 combined with an RF to intermediate frequency (IF) down conversion 2332, which is appropriately sampled to capture IF data and followed by a digital quadrature conversion to complex baseband. To those skilled in the art, it is readily apparent that an alternate embodiment can readily utilize direct conversion for both RF upconversion and downconversion, or utilize digital to IF conversion followed by IF to RF and vice-versa for the frequency translation process. Such variations may occur to those skilled in the art and are considered within the scope of the invention.

Other components illustrated in the illustrated wideband predistortion amplifier system include a first digital-to-analog converter (DAC) 2322, a second DAC 2324, an RF power amplifier 2328, a coupler 2330, and an analog-to-digital converter 2334.

The ASIC core 2304 with the DCSP provides the first DAC 2322 and the second DAC 2324 with predistorted I and Q signals that are based on inputs provided from a digital IF or digital I-Q baseband drive 2318. In the illustrated embodiment, the first DAC 2322 and the second DAC 2324 are 14-bit DACs that convert digital I and Q signals to analog I and Q signals at the rate of 125 MHz. The baseband to RF conversion 2326 receives the local oscillator signal 2308 and directly modulates the analog I and Q signals to the carrier frequency. The RF power amplifier 2328 amplifies a modulated output of the baseband to RF conversion 2326. The RF to IF down conversion 2332 receives a sample of the output of the RF power amplifier 2328 from the coupler 2330. In one embodiment, the RF to IF down conversion 2332 mixes the sample with the same local oscillator signal 2308 used by the baseband to RF conversion 2326. The ASIC core 2304 can further include a control/Radio Resource Management Entity (RRME) interface 2320 to initiate predistortion, configure the frequencies of conversion, configure the number of bits of ADC and DAC conversion, and the like.

Figure 24:
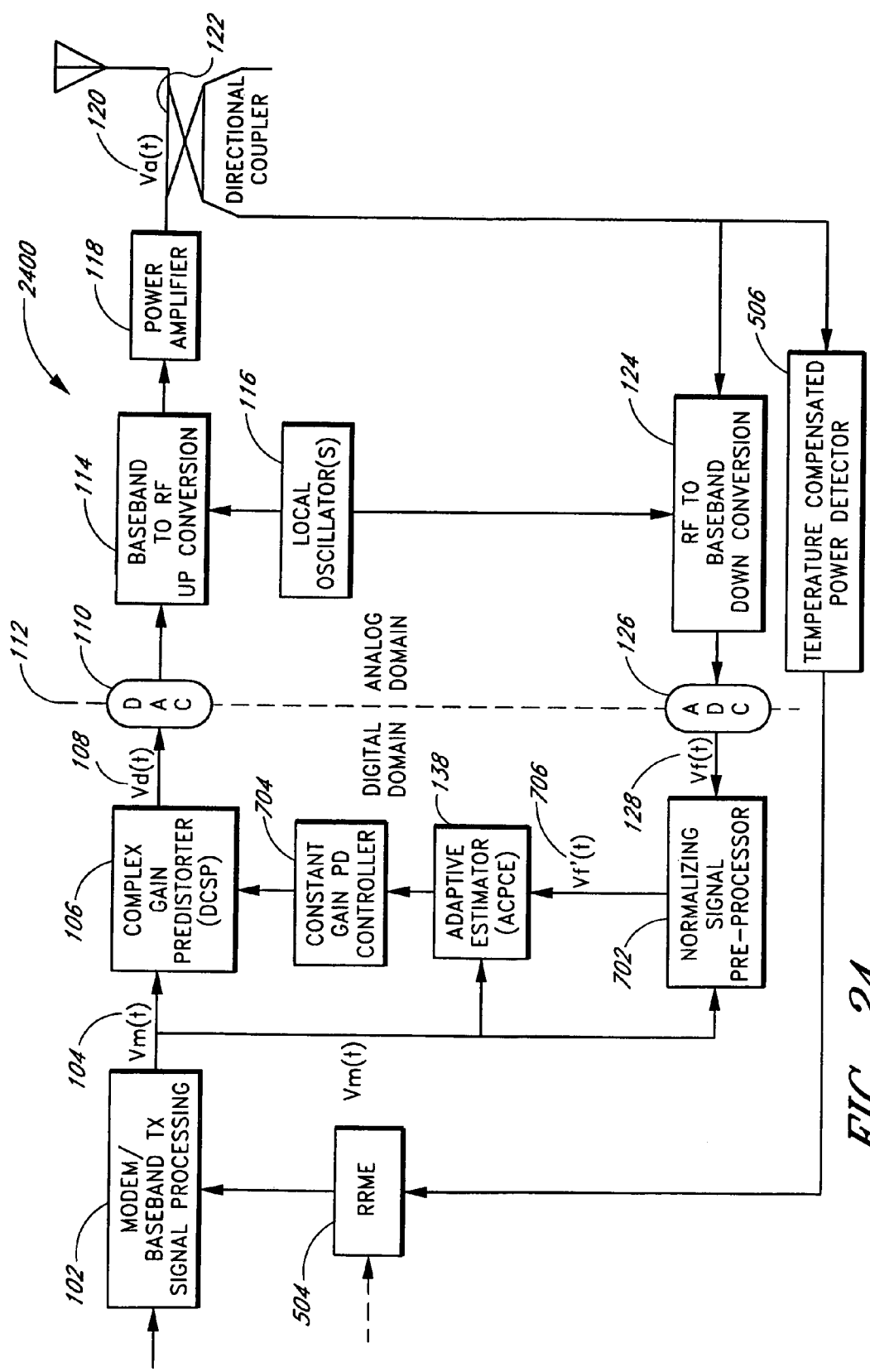
FIG. 24 illustrates an embodiment of a power amplifier system with constant gain predistortion.

FIG. 24 illustrates an embodiment of a power amplifier system 2400 with constant gain predistortion. The power amplifier system 2400 can be part of telecommunication equipment installed at a cellular base station.

Figure 25:
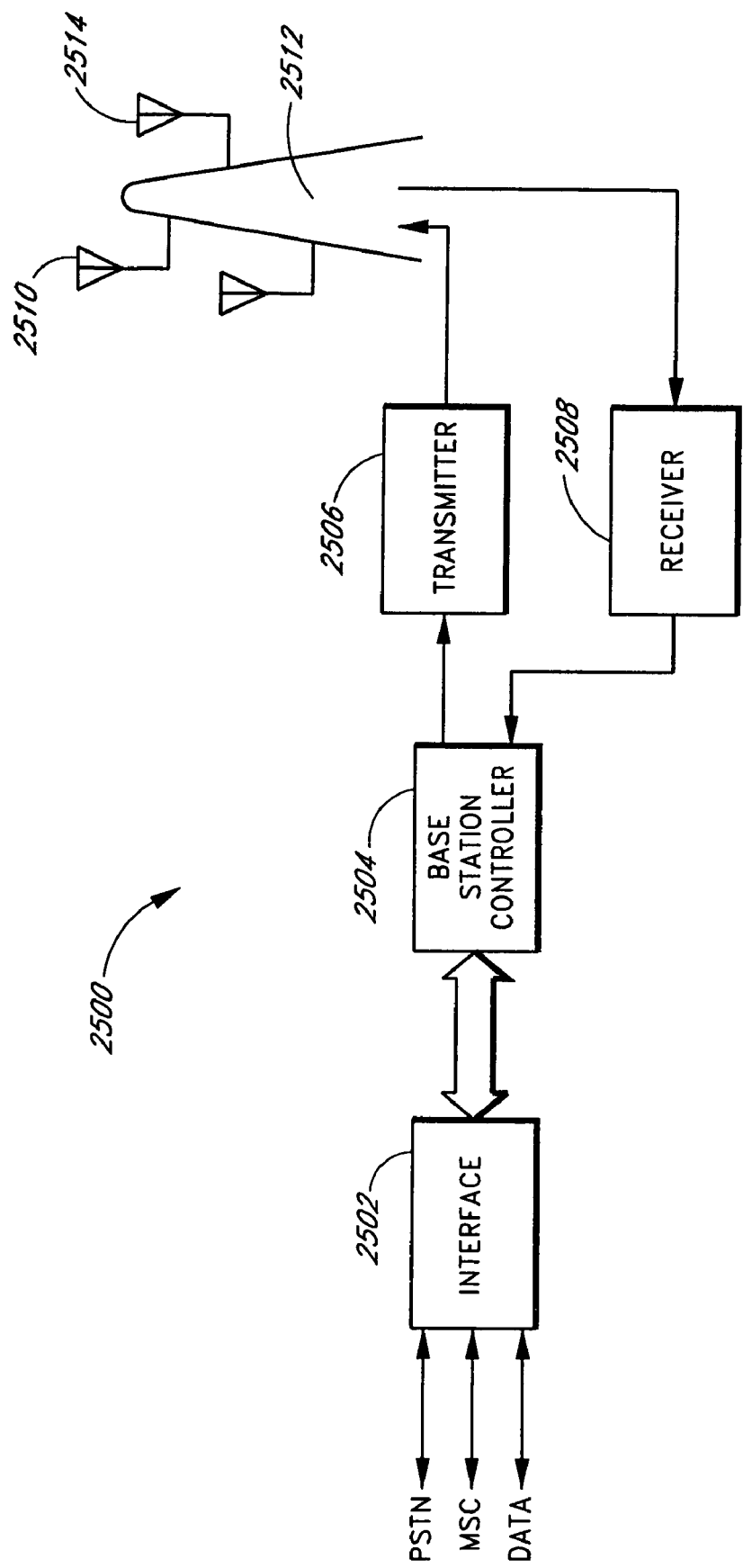
FIG. 25 illustrates an embodiment of a cellular base station.

FIG. 25 illustrates an embodiment of a cellular base station 2500. Cellular base stations are also known as cell sites or as PCS base stations. The cellular base station 2500 includes an interface 2502, a base station controller 2504, a transmitter with constant-gain predistortion 2506, a receiver 2508, and an antenna 2510. The interface 2502 permits the cellular base station 2500 to communicate with systems outside the cellular base station 2500. For example, the cellular base station 2500 can communicate with a public switch telephone network (PSTN), a mobile-service switching center (MSC), and data sources, such as paging, text messaging, and wireless Web services.

The interface 2502 is coupled to the base station controller 2504. The base station controller 2504 can control one or more transmitters. In one embodiment, the base station controller 2504 also controls one or more receivers. In addition, it should be noted that a single base station controller can control one or more cellular base stations. The transmitter with constant-gain predistortion 2506 combines, predistorts, and amplifies RF signals. The output of the transmitter with constant-gain predistortion 2506 is coupled to the antenna 2510 to transmit the RF signals. Typically, the antenna 2510 is mounted on an elevated structure, such as an antenna tower 2512. The antenna tower 2512 can carry one or more such antennas. Preferably, another antenna 2514 is used to receive RF signals than the antenna 2510 used to transmit the data, and the other antenna 2514 is coupled to the receiver 2508. The receiver 2508 provides received data to the base station controller 2504, which then relays the data, as applicable to the interface 2502. It will be understood a single cellular base station can include multiple transmitters and multiple receivers, and that these multiple transmitters and receivers can be operated by one or more service providers.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A method of identifying a boundary between a region of realizable system gain and a region of unrealizable system gain for an RF power amplifier system with predistortion compensation, the method comprising:
    retrieving a plurality of output signal levels stored in a predistortion lookup table;
    computing an overall system gain based on the plurality of output signal levels and associated input signal levels;
    calculating a slope of the overall system gain;
    determining a point at which the slope of the overall system gain corresponds to a first predetermined amount; and
    subtracting a second predetermined amount from the point to identify the boundary.

2. The method as defined in claim 1, wherein the associated input signal levels correspond to an index to the predistortion lookup table.

3. The method as defined in claim 1, wherein the first predetermined amount is about −45 degrees and the second predetermined amount is about 1 dB.

4. The method as defined in claim 1, wherein determining the point at which the slope of the overall system gain corresponds to the first predetermined amount is performed in a direction from high input signal levels to low input signal levels.

5. An RF power amplifier system that embodies the method of claim 1.

6. A cellular base station that embodies the method of claim 1.

7. An apparatus for identifying a boundary between a region of realizable system gain and a region of unrealizable system gain for an RF power amplifier system with predistortion compensation, the apparatus comprising:
    means for retrieving a plurality of output signal levels stored in a predistortion lookup table;
    means for computing an overall system gain based on the plurality of output signal levels and associated input signal levels;
    means for calculating a slope of the overall system gain;
    means for determining a point at which the slope of the overall system gain corresponds to a first predetermined amount; and
    means for subtracting a second predetermined amount from the point to identify the boundary.

8. The apparatus as defined in claim 7, wherein the associated input signal levels correspond to an index to the predistortion lookup table.

9. The apparatus as defined in claim 7, wherein the first predetermined amount is about −45 degrees and the second predetermined amount is about 1 dB.

10. The apparatus as defined in claim 7, wherein the determining means is configured to operate in a direction from high input signal levels to low input signal levels.

11. The apparatus as defined in claim 7, further comprising the RF power amplifier system.

12. The apparatus as defined in claim 7, further comprising a cellular base station.

13. An apparatus for identifying a boundary between a region of realizable system gain and a region of unrealizable system gain for an RF power amplifier system with predistortion compensation, the apparatus comprising:
   a circuit configured to retrieve a plurality of output signal levels stored in a predistortion lookup table;
   a circuit configured to compute an overall system gain based on the plurality of output signal levels and associated input signal levels;
   a circuit configured to calculate a slope of the overall system gain;
   a circuit configured to determine a point at which the slope of the overall system gain corresponds to a first predetermined amount; and
   a circuit configured to subtract a second predetermined amount from the point to identify the boundary.

14. The apparatus as defined in claim 13, wherein the associated input signal levels correspond to an index to the predistortion lookup table.

15. The apparatus as defined in claim 13, wherein the first predetermined amount is about −45 degrees and the second predetermined amount is about 1 dB.

16. The apparatus as defined in claim 13, wherein determining the point at which the slope of the overall system gain corresponds to the first predetermined amount is performed in a direction from high input signal levels to low input signal levels.

17. The apparatus as defined in claim 13, the RF power amplifier system.

18. The apparatus as defined in claim 13, further comprising a cellular base station.

* * * * *